US011670930B2

(12) United States Patent
Gundel et al.

(10) Patent No.: US 11,670,930 B2
(45) Date of Patent: Jun. 6, 2023

(54) SUPPORT STRUCTURE FOR CABLE AND CABLE ACCESSORY CONDITION MONITORING DEVICES

(71) Applicants: 3M Innovative Properties Company, St. Paul, MN (US); Connected Intelligence Systems, Ltd., Netanya (IL)

(72) Inventors: Douglas B. Gundel, Cedar Park, TX (US); Laszlo Markos, Austin, TX (US); Lior Embon, Binyamina (IL); Eyal Doron, Caesarea (IL); Udi Blich, Ichud (IL)

(73) Assignees: 3M Innovative Properties Company, St. Paul, MN (US); Connected Intelligence Systems Ltd., Netanya (IL)

( * ) Notice: Subject to any disclaimer, the term of this patent is extended or adjusted under 35 U.S.C. 154(b) by 0 days.

(21) Appl. No.: 17/274,032

(22) PCT Filed: Sep. 5, 2019

(86) PCT No.: PCT/US2019/049757
§ 371 (c)(1),
(2) Date: Mar. 5, 2021

(87) PCT Pub. No.: WO2020/055662
PCT Pub. Date: Mar. 19, 2020

(65) Prior Publication Data
US 2021/0344184 A1 Nov. 4, 2021

Related U.S. Application Data

(60) Provisional application No. 62/729,320, filed on Sep. 10, 2018.

(51) Int. Cl.
*G01R 31/58* (2020.01)
*H02G 15/113* (2006.01)
(Continued)

(52) U.S. Cl.
CPC ........... *H02G 15/113* (2013.01); *G01R 15/16* (2013.01); *G01R 15/18* (2013.01); *G01R 31/58* (2020.01)

(58) Field of Classification Search
CPC ............ G01R 15/186; G01R 31/50–58; H02G 15/113
See application file for complete search history.

(56) References Cited

U.S. PATENT DOCUMENTS 4,301,399 A * 11/1981 Miller .................... G01R 31/58
324/541
4,321,643 A * 3/1982 Vernier .................. H02H 5/105
361/48

(Continued)

FOREIGN PATENT DOCUMENTS

CH 641278 A5 * 2/1984
CN 1161763 A 10/1997
(Continued)

OTHER PUBLICATIONS

International Search Report and the Written Opinion from counterpart PCT Application No. PCT/US2019/049757 dated Oct. 22, 2019, 17 pgs.

(Continued)

*Primary Examiner* — Patrick Assouad
*Assistant Examiner* — Demetrius R Pretlow
(74) *Attorney, Agent, or Firm* — Shumaker & Sieffert, P.A.

(57) ABSTRACT

Devices are described that support, house, and protect an electrical cable monitoring system that is electrically (Continued)

coupled to an electrical cable. An example support structure includes an elongate body including an interior surface extending along and concentric to an axis of the electrical cable. The body is configured to engage a cable accessory disposed on the electrical cable. The support structure includes a first electrode attached to the interior surface and configured to operatively couple to the cable accessory. The support structure includes a second electrode attached to the body and configured to operatively couple to the shielding layer. The support structure includes a monitoring device attached to the interior surface and operatively coupled to the first and second electrodes. The monitoring device is configured to monitor one or more conditions of the electrical cable or the cable accessory.

20 Claims, 46 Drawing Sheets

(51) Int. Cl.
  G01R 15/16 (2006.01)
  G01R 15/18 (2006.01)

(56) References Cited

U.S. PATENT DOCUMENTS

| | | | | |
|---|---|---|---|---|
| 5,323,117 A | * | 6/1994 | Endoh | G01R 31/1272 324/544 |
| 5,502,374 A | * | 3/1996 | Cota | G01R 15/186 324/129 |
| 5,756,972 A | | 5/1998 | Vranicar et al. | |
| 5,892,430 A | | 4/1999 | Wiesman et al. | |
| 6,617,859 B1 | | 9/2003 | Orton | |
| 6,734,662 B1 | * | 5/2004 | Fenske | G01R 15/148 324/133 |
| 7,166,804 B2 | | 1/2007 | Yumura et al. | |
| 8,643,380 B1 | | 2/2014 | Herbert | |
| 9,917,434 B2 | | 3/2018 | George et al. | |
| 10,338,103 B2 | | 7/2019 | Gravermann et al. | |
| 2010/0308797 A1 | * | 12/2010 | Zimmermann | B29C 45/1671 324/127 |
| 2012/0199392 A1 | | 8/2012 | Samuelson et al. | |
| 2012/0203493 A1 | | 8/2012 | Dobson et al. | |
| 2012/0268106 A1 | * | 10/2012 | Blake, Jr. | G01R 15/186 324/127 |
| 2012/0306510 A1 | * | 12/2012 | White | G01R 31/58 324/551 |
| 2014/0368215 A1 | | 12/2014 | Hoffman et al. | |
| 2015/0120218 A1 | | 4/2015 | Garnacho Vecino et al. | |
| 2016/0091533 A1 | * | 3/2016 | Soleillant | H02G 7/00 324/127 |
| 2016/0139181 A1 | * | 5/2016 | Gravermann | G01R 31/58 324/686 |
| 2017/0222420 A1 | | 8/2017 | Dhlamini | |
| 2018/0017611 A1 | | 1/2018 | Radun et al. | |
| 2018/0062370 A1 | | 3/2018 | Heidmann et al. | |
| 2018/0238955 A1 | * | 8/2018 | Bango | G08B 21/02 |
| 2018/0252760 A1 | | 9/2018 | Andle et al. | |
| 2019/0128927 A1 | * | 5/2019 | Shaw | G01R 15/186 |
| 2019/0293706 A1 | * | 9/2019 | Sohn | G01R 31/08 |
| 2019/0369152 A1 | * | 12/2019 | Fallet | G01R 15/142 |

FOREIGN PATENT DOCUMENTS

| | | | |
|---|---|---|---|
| CN | 1601659 | A | 3/2005 |
| CN | 101666849 | A | 3/2010 |
| CN | 102116824 | A | 7/2011 |
| CN | 102313861 | A | 1/2012 |
| CN | 202978201 | U | 6/2013 |
| CN | 103339813 | A | 10/2013 |
| CN | 104407270 | A | 3/2015 |
| CN | 204256093 | U | 4/2015 |
| CN | 104849628 | A | 8/2015 |
| CN | 105043457 | A | 11/2015 |
| CN | 204988364 | U | 1/2016 |
| CN | 205175574 | U | * 4/2016 |
| CN | 205263241 | U | 5/2016 |
| CN | 105629136 | A | 6/2016 |
| CN | 105699860 | A | 6/2016 |
| CN | 205509462 | U | 8/2016 |
| CN | 106124948 | A | 11/2016 |
| CN | 205719288 | U | 11/2016 |
| CN | 106353648 | A | 1/2017 |
| CN | 206038828 | U | 3/2017 |
| CN | 106646156 | A | 5/2017 |
| CN | 106771933 | A | 5/2017 |
| CN | 206147041 | U | 5/2017 |
| CN | 106855443 | A | * 6/2017 |
| CN | 106950477 | A | 7/2017 |
| CN | 106980075 | A | 7/2017 |
| CN | 108376884 | A | * 8/2018 |
| DE | 2928727 | A1 | 2/1981 |
| DE | 3025819 | A1 | 2/1982 |
| DE | 3702735 | A1 | 8/1988 |
| DE | 102011079935 | A1 | 1/2013 |
| EP | 2472688 | A2 | 7/2012 |
| EP | 2579055 | A1 | 4/2013 |
| EP | 2806277 | A1 | 11/2014 |
| EP | 2818881 | A1 | 12/2014 |
| EP | 3002594 | A1 | 4/2016 |
| EP | 3109958 | A1 | 12/2016 |
| EP | 3182428 | A1 | 6/2017 |
| GB | 2288696 | A | 10/1995 |
| JP | S60256068 | A | 12/1985 |
| JP | H03273809 | A | 12/1991 |
| JP | H10201070 | A | 7/1998 |
| KR | 101317476 | B1 | 10/2013 |
| KR | 101847456 | B1 | * 4/2018 |
| WO | 9840756 | | 9/1998 |
| WO | 0042444 | | 7/2000 |
| WO | WO-0042444 | A1 * | 7/2000 ........... G01R 31/021 |
| WO | 2012130816 | A1 | 10/2012 |
| WO | WO-2014129817 | A1 * | 8/2014 ........... G01R 15/183 |
| WO | 2015179102 | A1 | 11/2015 |
| WO | 2016058721 | A1 | 4/2016 |
| WO | 2016088175 | A1 | 6/2016 |
| WO | WO-2016088174 | A1 * | 6/2016 |
| WO | 2016137424 | A1 | 9/2016 |
| WO | 2016187090 | A1 | 11/2016 |

OTHER PUBLICATIONS

International Preliminary Report on Patentability from counterpart PCT Application No. PCT/US2019/049757 dated Mar. 25, 2021, 9 pgs.
U.S. Appl. No. 17/273,936, filed Mar. 5, 2021 by Douglas B. Gundel et al.
U.S. Appl. No. 17/273,922, filed Mar. 5, 2021 by Douglas B. Gundel et al.
First Office Action and Search Report, and translation thereof, from counterpart Chinese Application No. 201980059173.1, dated Jan. 28, 2022, 19 pp.
Office Action, and translation thereof, from counterpart Chinese Application No. 201980059173.1 dated Aug. 3, 2022, 15 pp.
Notice of Intent to Grant from counterpart Chinese Application No. 201980059173.1 dated Jan. 5, 2023, 4 pp.
Communication pursuant to Article 94(3) EPC from counterpart European Application No. 19772927.0 dated Mar. 20, 2023, 9 pp.

* cited by examiner

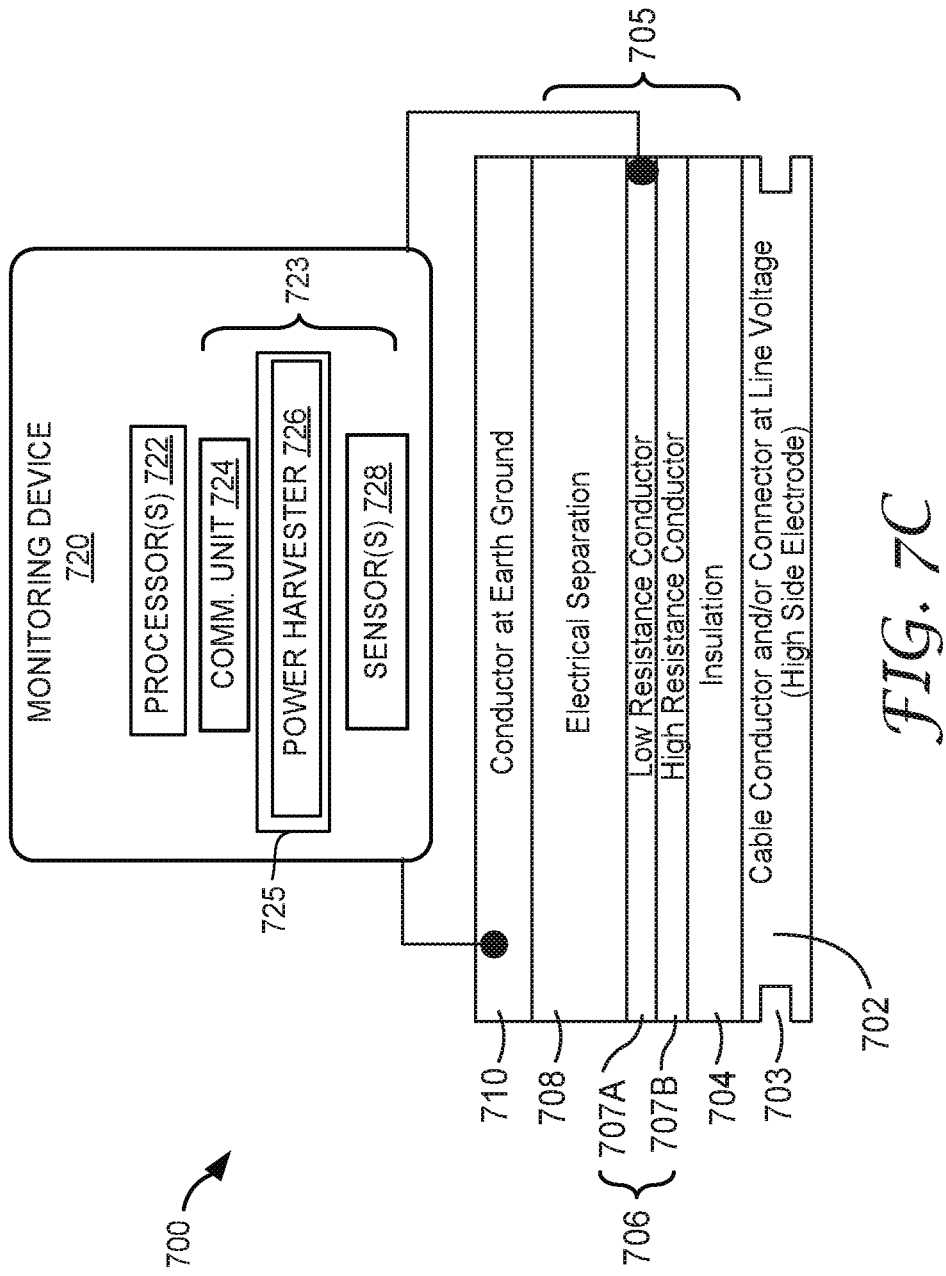

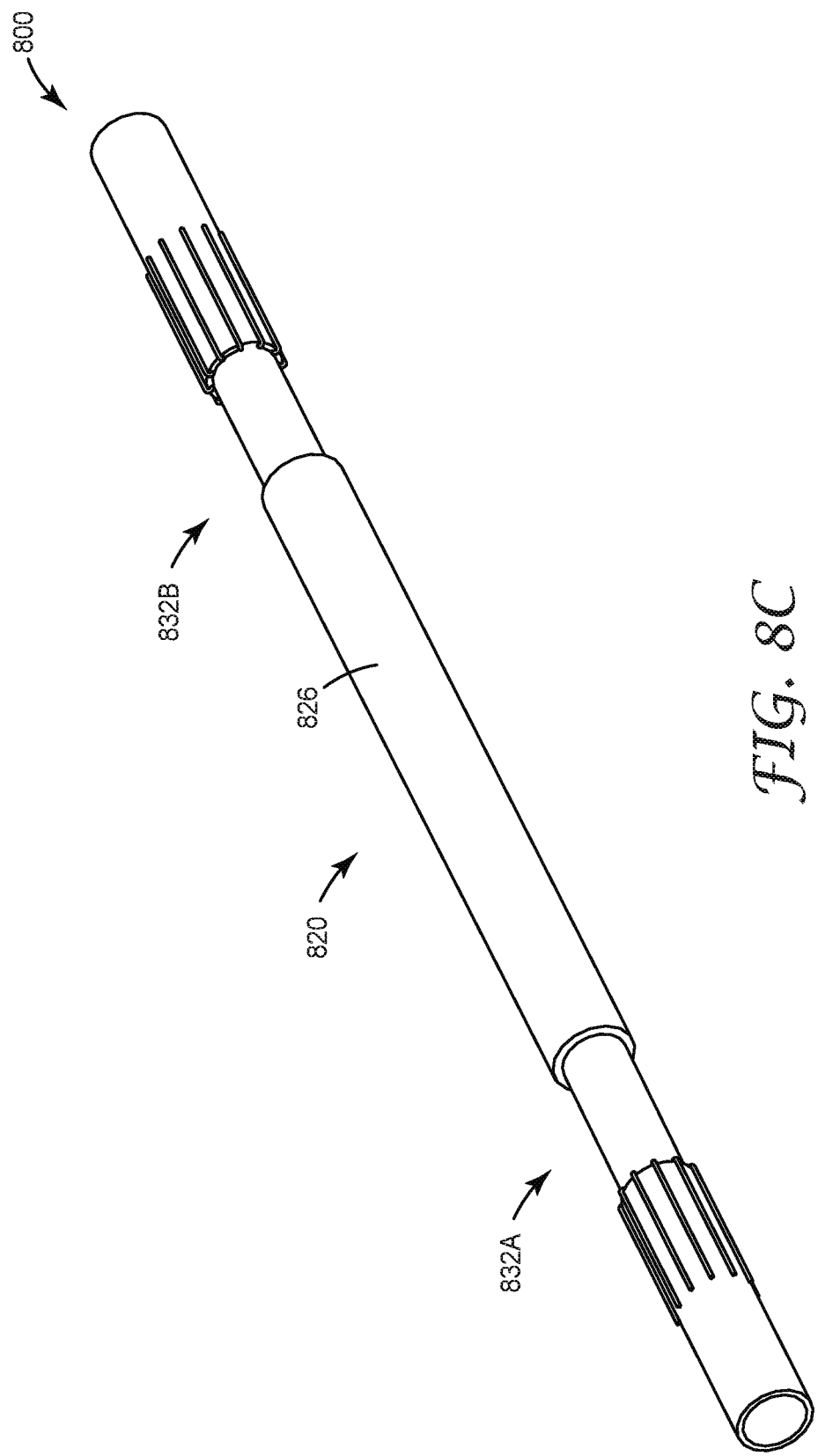

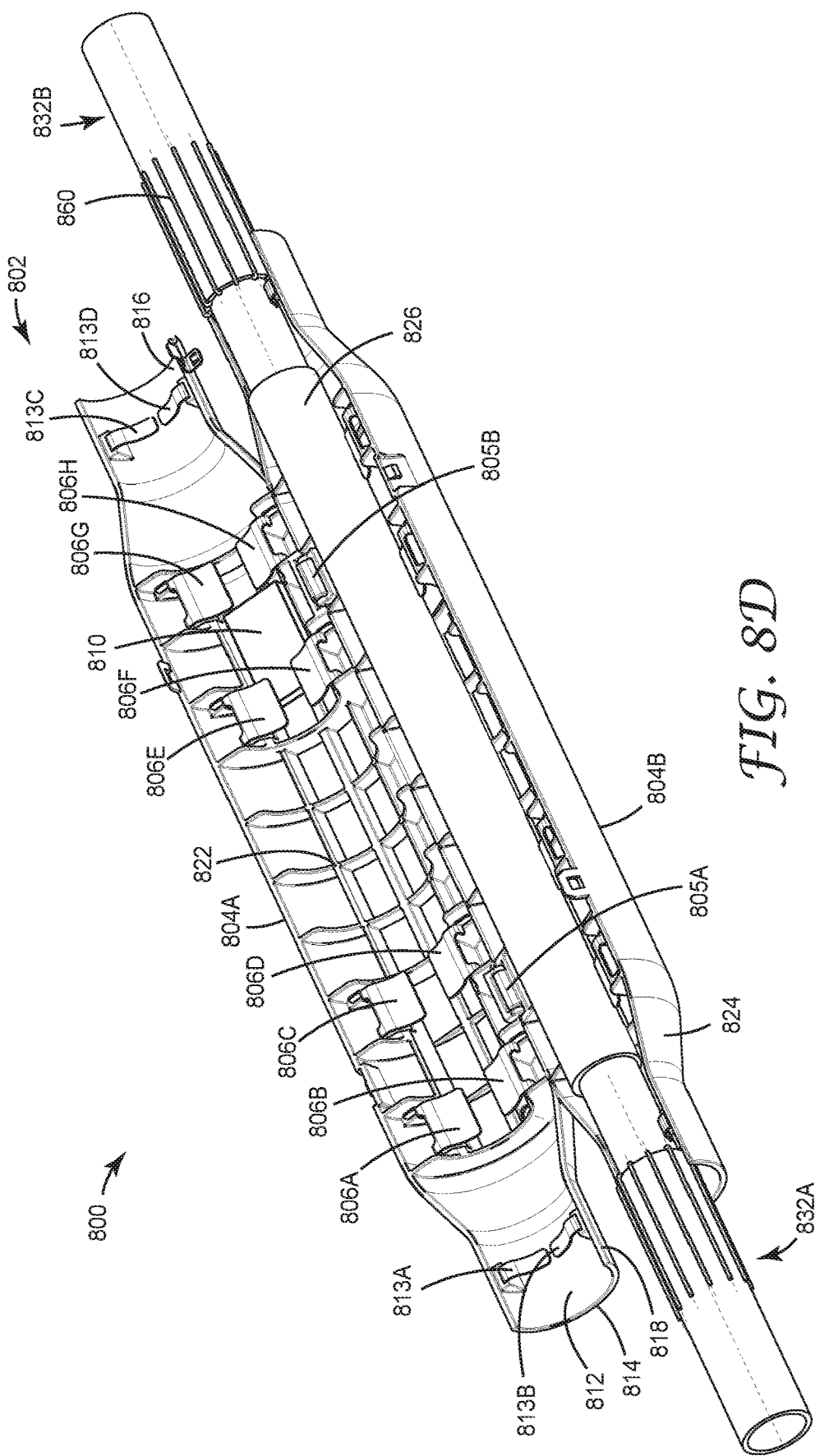

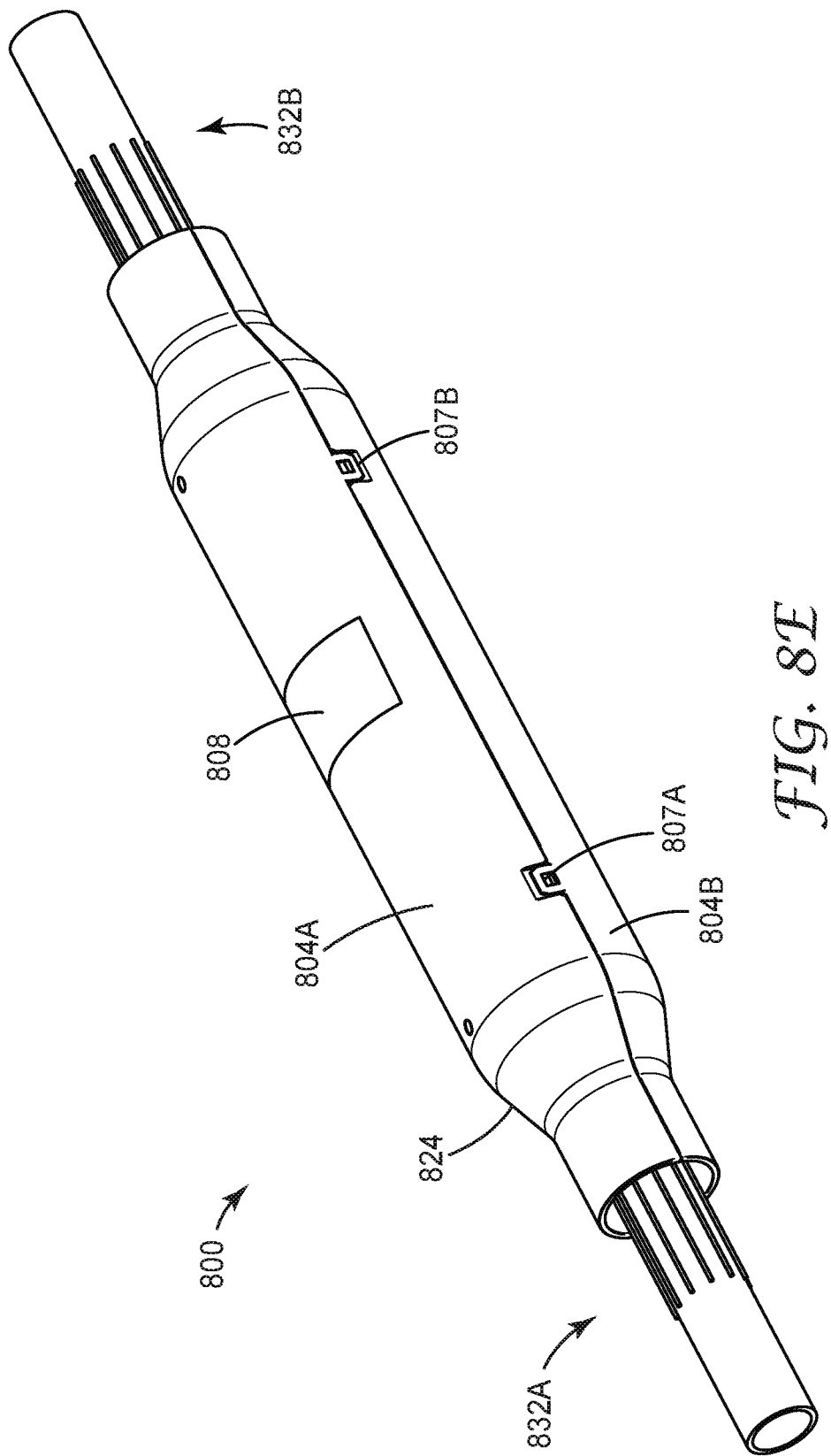

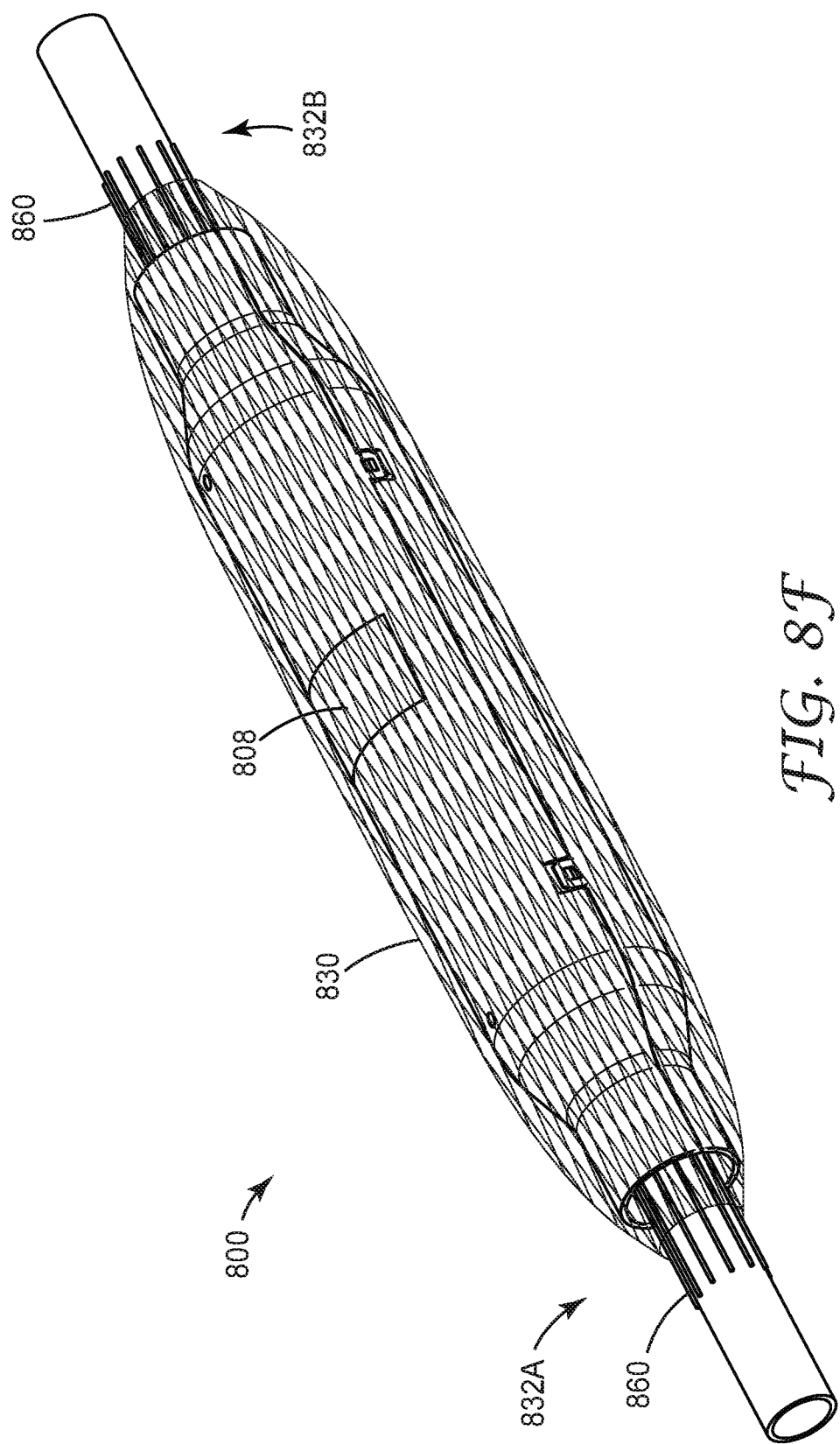

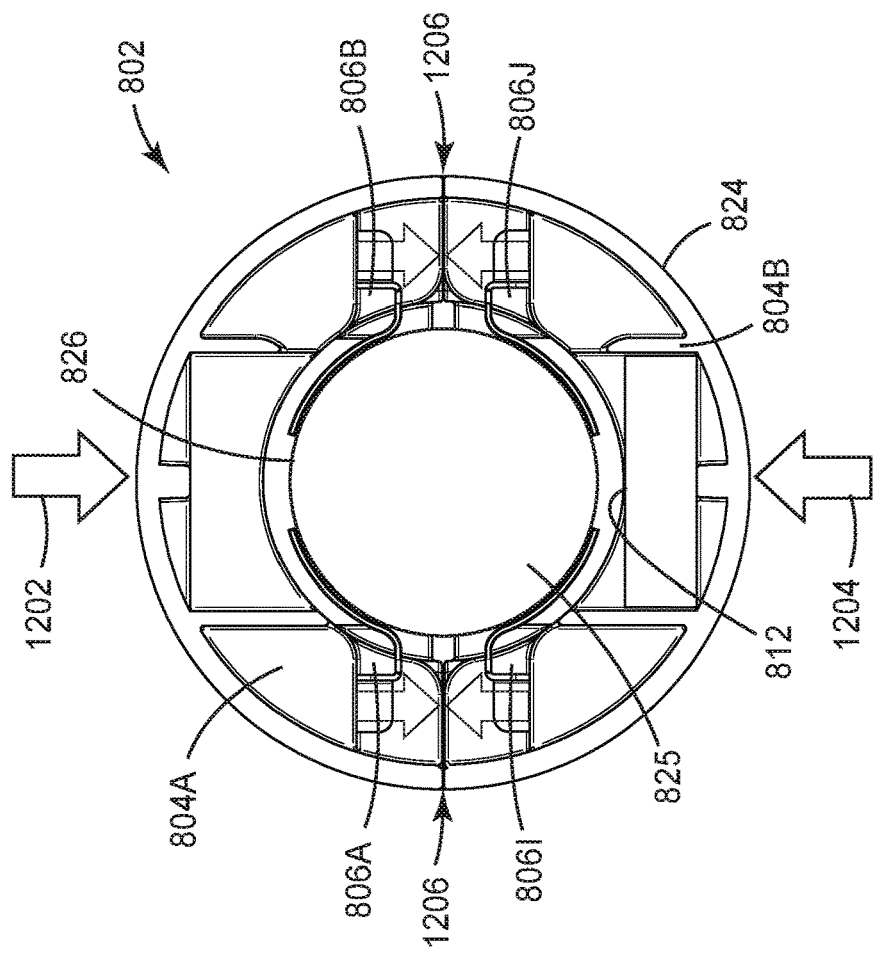
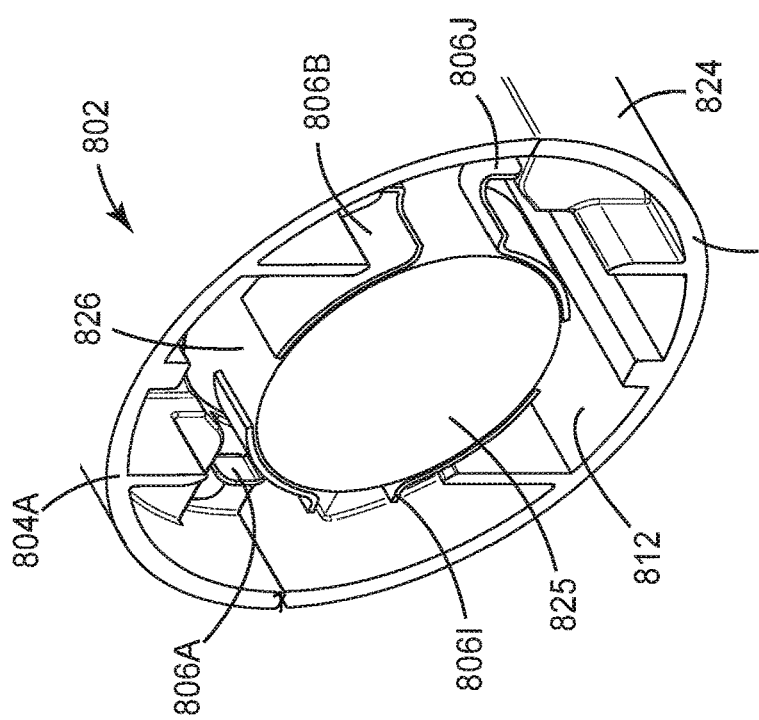

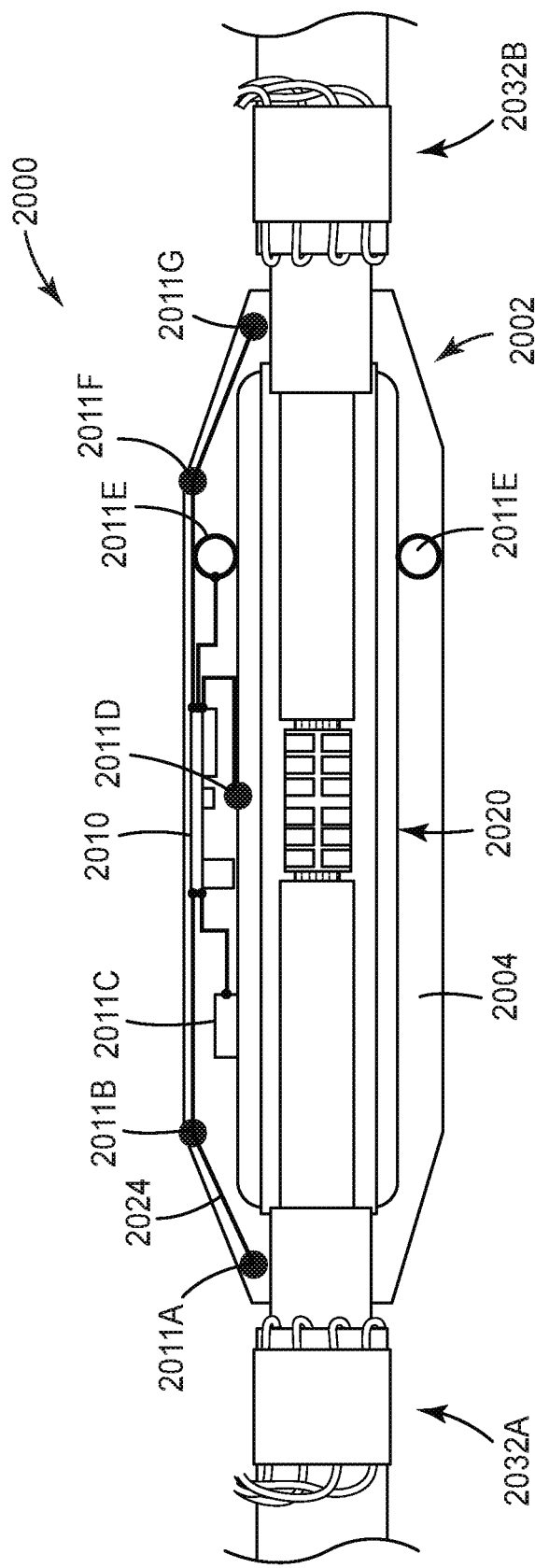

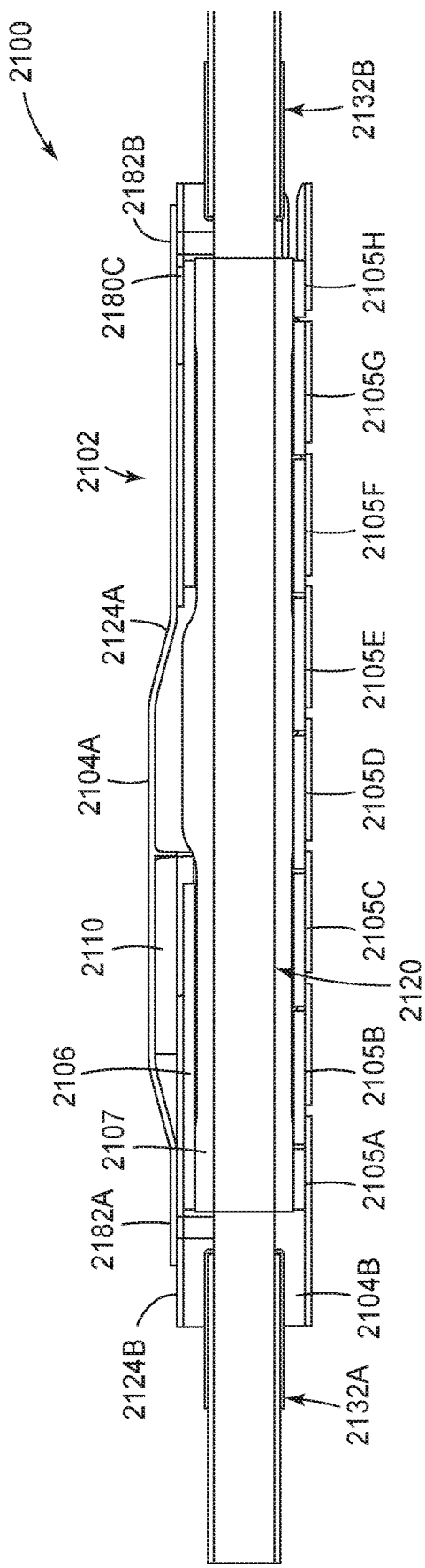
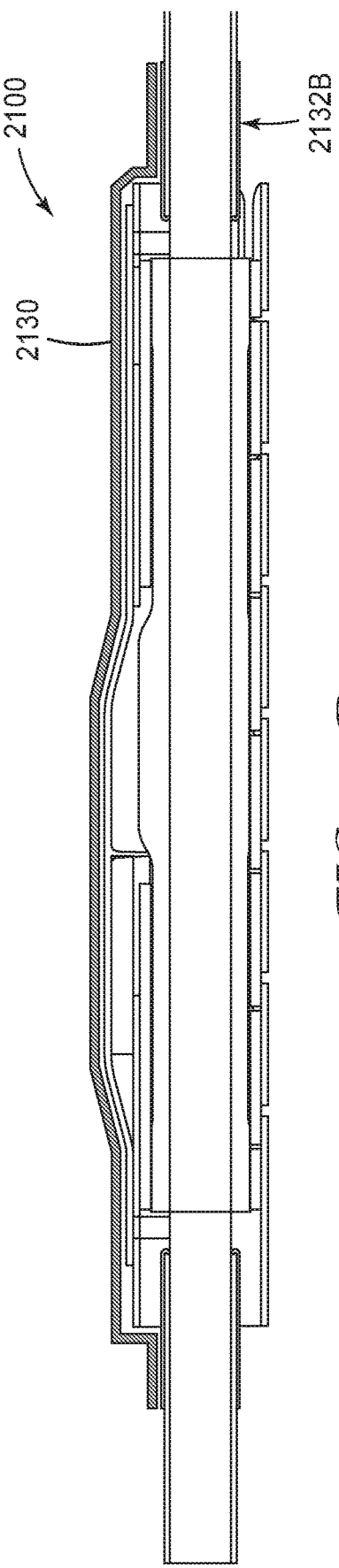
FIG. 21C
FIG. 21D

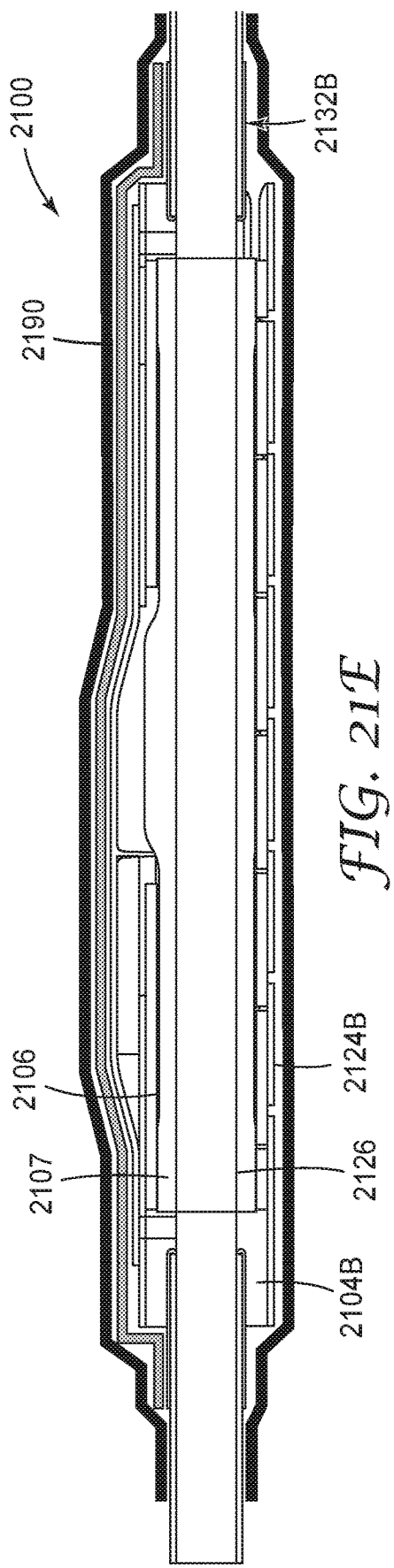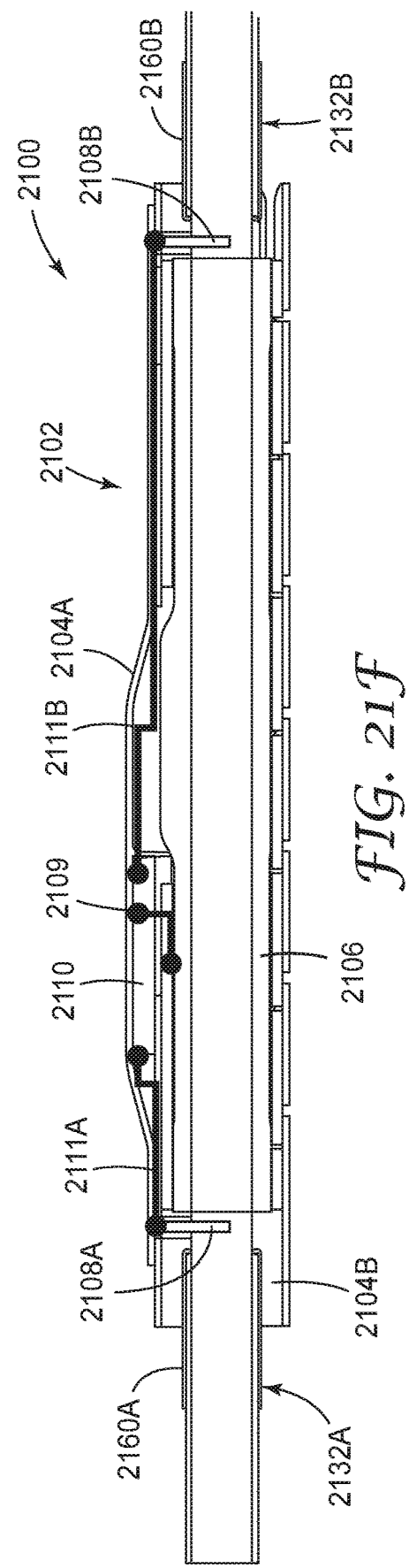
FIG. 21E
FIG. 21F

SUPPORT STRUCTURE FOR CABLE AND CABLE ACCESSORY CONDITION MONITORING DEVICES

This application claims the benefit of U.S. Provisional Application No. 62/729,320, filed Sep. 10, 2018, which is incorporated herein by reference in its entirety.

TECHNICAL FIELD

The present disclosure relates to the field of electrical equipment, including power cables and accessories, for power utilities.

BACKGROUND

Electrical power grids include numerous components that operate in diverse locations and conditions, such as above ground, underground, cold weather climates, hot weather climates, etc. When a power grid suffers a failure, it can be difficult to determine the cause of the failure. For example, a power grid may include hundreds or thousands of discrete components, such as transformers, cables, cable splices, etc., and a failure in the power grid may be caused by a failure in any single component or a collection of the components. The root cause of such failures may include human error in installation, manufacturing defects, or wear and tear on the component, among other causes. While replacement of the electrical components can be costly, simply finding the fault can be time consuming and expensive. If a component fails in service, the total cost can include downtime for customer operations, liability, safety, or regulatory scrutiny, in addition to the actual costs incurred to locate and replace faulty components. Further, faulty components may pose a safety risk to utility workers, civilians, homes, buildings, or other infrastructure.

SUMMARY

This disclosure describes systems and techniques to support, house, and protect an electrical cable monitoring system that is electrically coupled to a portion of an electrical cable, such as a cable accessory, and facilitate electrical cable monitoring system installation by maintaining proper orientation of electrical cable monitoring system components. In some examples, an electrical cable monitoring system may include one or more sensors that output sensor data to a computing system. A computing system may apply a model to the sensor data to predict a failure event of an article of electrical equipment or determine a health of the article of electrical equipment, such as predicting a remaining life-span of the article of electrical equipment. Examples of such sensors include temperature sensors, partial discharge sensors, smoke sensors, gas sensors, acoustic sensors, among others.

An example electrical cable monitoring system includes an elongate body extending along an axis defined by an electrical cable. The body includes an interior surface, concentric to the axis, that is configured to engage a cable accessory disposed on the electrical cable. The electrical cable monitoring system also includes a first electrode attached to the interior surface of the body and configured to operatively couple to the cable accessory; and a second electrode attached to the body and configured to operatively couple to the shielding layer. The electrical cable monitoring system includes a monitoring device configured to monitor a health of the electrical cable or the cable accessory. By housing each of the first electrode, second electrode, and monitoring device, the support structure may protect the electrical cable monitoring system and support each component in a desired orientation for proper physical and electrical coupling of components and to facilitate proper installation of the electrical cable monitoring system.

In some examples, the disclosure describes a support structure of an electrical cable monitoring system, the support structure including an elongate body configured to extend along an axis defined by an electrical cable that includes a central conductor, an insulating layer concentric to the central conductor, and a shielding layer concentric to the insulating layer. The body includes an interior surface concentric to the axis and configured to engage a cable accessory disposed on the electrical cable. The support structure also includes a first electrode attached to the interior surface of the body and configured to operatively couple to the cable accessory. The support structure also includes a second electrode attached to the body and configured to operatively couple to the shielding layer. The support structure also includes a monitoring device attached to the interior surface and operatively coupled to the first electrode and the second electrode. The monitoring device is configured to monitor one or more conditions of the electrical cable or the cable accessory.

In some examples, the disclosure describes a method of installing a support structure of an electrical cable monitoring system. The method includes aligning an interior surface of an elongate body of the support structure concentric to an electrical cable defining an axis, where the electrical cable includes a central conductor, an insulating layer concentric to the central conductor, and a shielding layer concentric to the insulating layer. The method also includes engaging a cable accessory with a first electrode attached to the interior surface. The method also includes engaging the shielding layer with a second electrode attached to the body. The method also includes operatively coupling a monitoring device to the first electrode and the second electrode, where the monitoring device is configured to monitor one or more conditions of the electrical cable or the cable accessory.

In some examples, the disclosure describes a system including one or more sensors coupled to an electrical cable that includes a central conductor, an insulating layer concentric to the central conductor, and a shielding layer concentric to the insulating layer or a cable accessory disposed on the electrical cable, the one or more sensors configured to generate sensor data that is indicative of one or more conditions of the electrical cable or the cable accessory; at least one processor; a storage device including instructions that, when executed by the at least one processor, cause the at least one processor to receive the sensor data; determine, based at least in part on the sensor data, a health of the electrical cable or the cable accessory; and responsive to determining the health of the electrical cable or the cable accessory, perform an operation; and a support structure the support structure including an elongate body configured to extend along an axis defined by the electrical cable, where the body includes an interior surface concentric to the axis and configured to engage the cable accessory; a first electrode attached to the interior surface of the body and configured to operatively couple to the cable accessory; and a second electrode attached to the body and configured to operatively couple to the shielding layer, where the monitoring device includes the at least one processor and the storage device.

In some examples, the disclosure describes a system including an electrical cable that includes a central conductor, an insulating layer concentric to the central conductor, and a shielding layer concentric to the insulating layer; a cable accessory disposed on the electrical cable; a support structure of an electrical cable monitoring system, the support structure including an elongate body configured to extend along an axis defined by the electrical cable, where the body includes an interior surface concentric to the axis and configured to engage the cable accessory; a first electrode attached to the interior surface of the body and configured to operatively couple to the cable accessory; and a second electrode attached to the body and configured to operatively couple to the shielding layer; and a monitoring device attached to the interior surface and operatively coupled to the first electrode and the second electrode, where the monitoring device is configured to monitor one or more conditions of the electrical cable or the cable accessory.

The details of one or more examples of the disclosure are set forth in the accompanying drawings and the description below. Other features, objects, and advantages of the disclosure will be apparent from the description and drawings, and from the claims.

BRIEF DESCRIPTION OF THE DRAWINGS

FIGS. 7A-7D are conceptual diagrams illustrating example cable accessories, in accordance with one or more aspects of this disclosure.

FIGS. 8A-8G illustrate the assembly of an example electrical cable monitoring system including a support structure having at least one elongate body, first electrodes, second electrodes, and a monitoring device.

FIGS. 12A and 12B illustrate cross-sectional views of the support structure illustrated in FIGS. 8E and 8F.

FIG. 20 illustrates an example electrical cable monitoring system including a support structure configured to support, house, and protect a plurality of sensors.

FIGS. 21A-21I illustrate an example electrical cable monitoring system 2100 including a support structure 2102 having a low profile.

It is to be understood that the embodiments may be utilized, and structural changes may be made without departing from the scope of the invention. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure describes systems and techniques to support, house, and protect an electrical cable monitoring system that is electrically coupled to a portion of an electrical cable, such as a cable accessory, and facilitate electrical cable monitoring system installation by maintaining proper orientation of electrical cable monitoring system components. Failure of electrical cables and cable accessories, such as splices and terminations, may occur as an arc or discharge across the electrical cable or cable accessory due to thermal runaway of the connector, dielectric breakdown in a cable accessory, dielectric breakdown in electrical cable insulation, or interface breakdown (also known as internal tracking). Each mode of failure may have different rates and failure signatures from initiation to final failure. The root causes of the failures may include design flaws, or defects introduced in the electrical cable or cable accessory manufacturing process, during installation of the electrical cable or cable accessory, or during service of the electrical cable or cable accessory. Electrical cable monitoring systems on an electrical cable or a cable accessory may monitor the physical condition (referred to herein as, health) of a portion of the electrical cable monitoring system and sending data about the health of the electrical cable or the cable accessory. For example, an electrical cable monitoring system may include sensors to detect dielectric breakdown, such as via detection of partial discharge events, thermal runaway, such as via detection of temperatures of components of the electrical cable or cable accessory, or current or voltage measurements. The electrical cable monitoring system includes processing circuitry to receive and process the sensor information; a power source; and a communications unit to communicate data indicative of the health to a central system that can interpret and react to the data indicative of the health.

Figure 1:
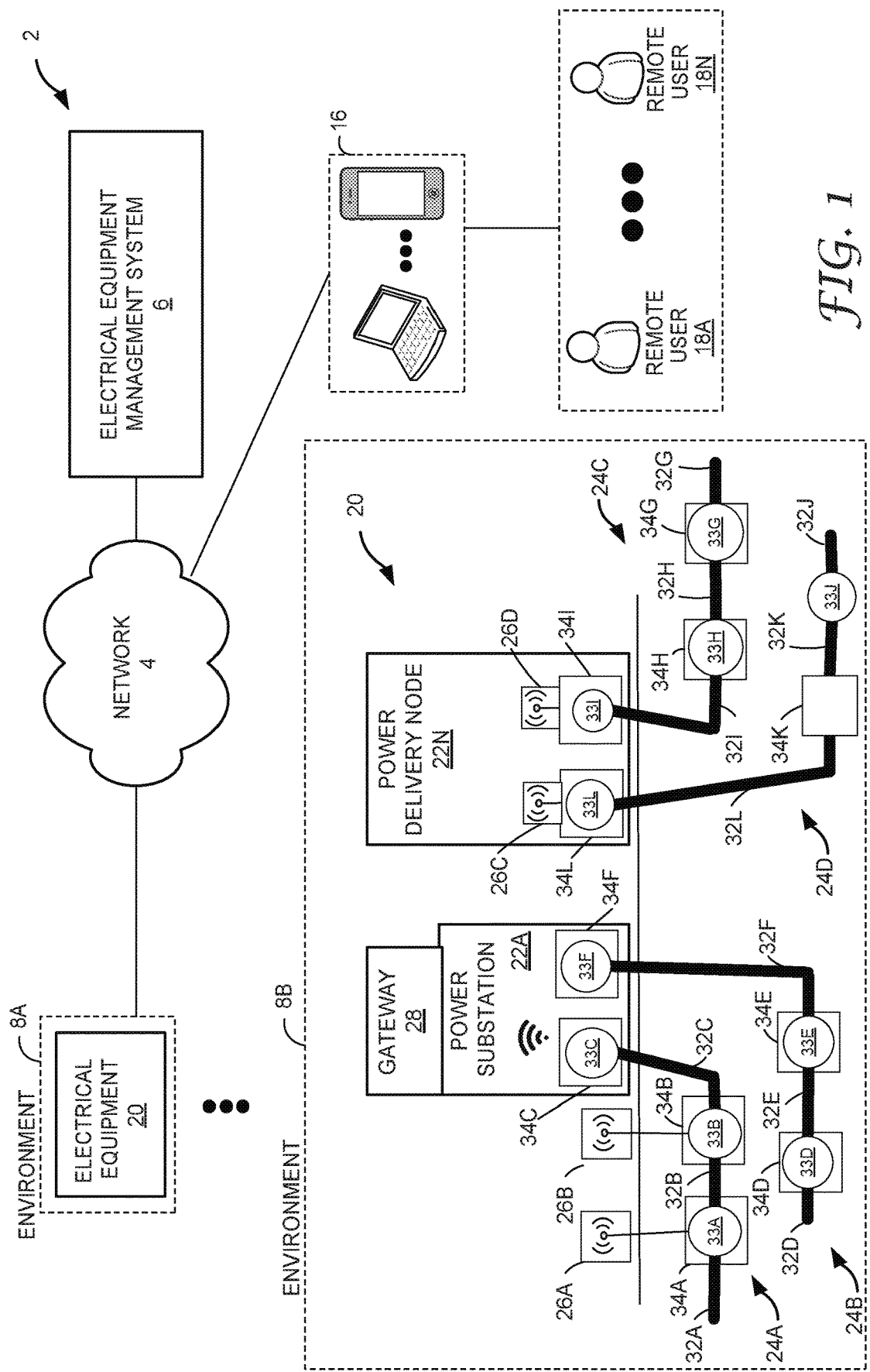
FIG. 1 is a block diagram illustrating an example system in which electrical utility equipment, such as electrical power lines, having embedded sensors and communication capabilities are utilized within a number of work environments and are managed by an electrical equipment management system (EEMS), in accordance with various techniques of this disclosure.

FIG. 1 is a block diagram illustrating an example computing system 2 that includes an electrical equipment management system (EEMS) 6 for monitoring electrical power cables of an electrical power grid. As described herein, EEMS 6 may allow authorized users to manage inspections, maintenance, and replacement of electrical equipment for a power grid and to adjust operation of the power grid.

In general, EEMS 6 provides data acquisition, monitoring, activity logging, data storage, reporting, predictive analytics, and alert generation. For example, EEMS 6 may include an underlying analytics engine for predicting failure events of articles of electrical equipment and an alerting system, in accordance with various examples described herein. In general, a failure event may refer to interruption of electrical power delivery between an electrical power source and an electrical power consumer, for example, caused by deterioration or breakage of an article of electrical equipment (e.g., a cable splice).

As further described below, EEMS 6 provides an integrated suite of electrical equipment management tools and implements various techniques of this disclosure. That is, EEMS 6 provides a system for managing electrical equipment (e.g., electrical cables, splices, transformers, etc.) within one or more physical environments 8, which may be cities, neighborhoods, buildings, construction sites, or any physical environment. The techniques of this disclosure may be realized within various parts of system 2.

As shown in the example of FIG. 1, system 2 represents a computing environment in which a computing device within of a plurality of physical environments 8A, 8B (collectively, environments 8) electronically communicate with EEMS 6 via one or more computer networks 4. Each of physical environment 8 represents a physical environment in which one or more electrical power lines 24A-24D (collectively, power lines 24) provide power from a power source (e.g., power plant) to one or more consumers (e.g., businesses, homes, government facilities, etc.).

In this example, environment 8A is shown as generally as having electrical equipment 20, while environment 8B is shown in expanded form to provide a more detailed example. In the example of FIG. 1, includes a plurality of articles of electrical equipment 20, such as one or more power power delivery nodes 22A-22N (collectively, power delivery nodes 22), one or more power lines 24, one or more communication hubs 26A-26D (collectively, communication hubs 26), and one or more gateways 28.

In the example of FIG. 1, environment 8B includes wireless communication hubs 26 and/or one or more gateways 28. In general, communication hubs 26 and gateways 28 operate as communication devices for relaying communications between EEMS 6 and monitoring devices 33 monitoring respective articles of electrical equipment 20 (e.g., cable accessories 34). Communication hubs 26 and gateways 28 may each be communicatively coupled to EEMS 6 via wired and/or wireless communication. For example, wireless communication hubs 26 and/or gateway 28 may include a cellular radio (e.g., GSM, CDMA, LTE, etc.), Bluetooth® radio, WiFi® radio, low power wide area network (LPWAN), etc. As another example, wireless communication hubs 26 and/or gateway 28 may include a wired connection, such as a network interface card (e.g. such as an Ethernet card), an optical transceiver, or any other type of device that can send and/or receive data. According to some examples, communication hubs 26 and/or gateways 28 may communicate with other devices using power line communication techniques. In other words, in some examples, gateways 28 may communicate with monitoring devices 33 over power lines 24. In some examples, wireless communication hubs 26 and gateways 28 may be capable of buffering data in case communication is lost with EEMS 6. Moreover, communication hubs 26 and gateway 28 may be programmable via EEMS 6 so that local alert rules may be installed and executed without requiring a connection to the cloud. As such, communication hubs 26 and gateways 28 may provide a relay of streams of event data from monitoring devices 33, and provides a local computing environment for localized alerting based on streams of events.

Power delivery nodes 22 may include one or more input lines to receive power (e.g., directly from a power source or indirectly via another power delivery node 22) and one or more output lines to directly or indirectly (e.g., via another power delivery node 22) distribute power to consumers (e.g., homes, businesses, etc.). Power delivery nodes 22 may include a transformer to step voltages up or down. In some examples, power delivery node 22A may be a relatively small node to distribute power to homes in a neighborhood, such as an electrical cabinet, pole-mount transformer, or pad-mount transformer. As another example, power delivery node 22N may be a relatively large node (e.g., a transmission substation) that distributes power to other power delivery nodes (e.g., distribution substations), such that the other power delivery nodes further distribute power to consumers (e.g., homes, businesses, etc.).

Power lines 24 may transmit electrical power from a power source (e.g., a power plant) to a power consumer, such as a business or home. Power lines 24 may be underground, underwater, or suspended overhead (e.g., from wooden poles, metal structures, etc.). Power lines 24 may be used for electrical power transmission at relatively high voltages (e.g., compared to electrical cables utilized within a home, which may transmit electrical power between approximately 12 volts and approximately 240 volts depending on application and geographic region). For example, power lines 24 may transmit electrical power above approximately 600 volts (e.g., between approximately 600 volts and approximately 1,000 volts). However, it should be understood that power lines 24 may transmit electrical power over any voltage and/or frequency range. For example, lines 24 may transmit electrical power within different voltage ranges. In some examples, a first type of lines 24 may transmit voltages of more than approximately 1,000 volts, such as for distributing power between a residential or small commercial customer and a power source (e.g., power utility). As another example, a second type of lines 24 may transmit voltages between approximately 1 kV and approximately 69 kV, such as for distributing power to urban and rural communities. A third type of lines 24 may transmit voltages greater than approximately 69 kV, such as for sub-transmission and transmission of bulk quantities of electric power and connection to very large consumers.

Power lines 24 include electrical cables 32 and one or more electrical cable accessories 34A-34J. Each cable 32 includes a conductor which may be radially surrounded by one or more layers of insulation. In some examples, cables 32 include a plurality of stranded conductors (e.g., a three-phase or multi-conductor cable). Example cable accessories 34 may include splices, separable connectors, terminations, and connectors, among others. In some examples, cable accessories 34 may include cable splices configured to couple (e.g., electrically and physically) two or more cables 32. For example, as shown FIG. 1, cable accessory 34A electrically and physically couples cable 32A to cable 32B, cable accessory 34B electrically and physically couples cable 32B to cable 32C, and so forth. In some examples, terminations may be configured to couple (e.g., electrically and physically) a cable 32 to additional electrical equipment, such as a transformer, switch gear, power substation, business, home, or other structure. For example, as shown FIG. 1, cable accessory 34C electrically and physically couples cable 32C to power delivery node 22A (e.g., to a transformer of the power delivery node 22A).

System 2 includes one or more electrical cable monitoring devices 33A-33L (collectively, monitoring devices 33) configured to monitor one or more conditions of an article of electrical equipment 20. For example, monitoring devices 33 may be configured to monitor conditions of power delivery nodes 22, electrical cables 32, cable accessories 34, or other type of electrical equipment 20. Monitoring devices 33 may be configured to attach or otherwise couple to electrical cables 32 and/or cable accessories 34. In some examples, monitoring devices 33 may be integrated within another device, such as cable accessories 34, or may be a separate (e.g., stand-alone) device. In the example of FIG. 1, cable accessories 34A, 34B, 34C, 34D, 34E, 34F, 34G, 34H, and 34I include monitoring devices 33A, 33B, 33C, 33D, 33E, 33F, 33G, 33H, and 33I, respectively, while monitoring device 33J is a stand-alone monitoring device monitoring power line 24D. Further, in the example of FIG. 1, cable accessory 34K does not include a monitoring device.

Monitoring devices 33 include sensors that generate sensor data indicative of the operating characteristics of one or more electrical cables 32 and/or cable accessories 34 or the condition of electrical equipment. Sensors of monitoring devices 33 may include temperature sensors (e.g., internal and/or external to the cable accessory), partial discharge sensors, voltage and/or current sensors, among others. In some examples, monitoring device 33A includes one or more temperature sensors. For example, monitoring device 33A may include an internal temperature sensor to monitor temperatures inside an electrical cable 32 or cable accessory 34 and/or an external temperature monitor to monitor the temperature outside or on the surface of an electrical cable 32 or cable accessory 34. Example details of monitoring devices are described in U.S. Patent Application 62/729,325, entitled "ELECTRICAL POWER CABLE MONITORING DEVICE USING LOW SIDE ELECTRODE AND EARTH GROUND SEPARATION," filed Sep. 10, 2018, which is hereby incorporated by reference in its entirety. Additional example details of monitoring devices and electrical equipment management systems are described in U.S. Patent Application 62/729,367, entitled "ELECTRICAL POWER CABLE MANAGEMENT SYSTEM HAVING ANALYTICS ENGINE WITH INTEGRATED MONITORING, ALERTING, AND PRE-FAULT EVENT PREDICTION," filed Sep. 10, 2018, which is hereby incorporated by reference in its entirety.

Monitoring device 33 may include a partial discharge sensor to detect partial discharge events (e.g., within cable accessory 34A). As used herein, a partial discharge event refers to a current discharge that only partially bridges the gap between electrodes of an electrical cable (e.g., which may be caused by a gas discharge in a void of the electrical cable). Further example details of monitoring devices for sensing partial discharge events are described in U.S. Patent Application 62/729,363, entitled "ELECTRICAL POWER CABLE MONITORING DEVICE INCLUDING PARTIAL DISCHARGE SENSOR," filed Sep. 10, 2018, which is hereby incorporated by reference in its entirety. Monitoring device 33 may include a voltage and/or current sensor configured to measure the phase and/or magnitude of the voltage or current in an electrical cable 32 or cable accessory 34.

Monitoring devices 33 each include a power source or receives power from a power source. For example, monitoring device 33A may include a battery. As another example, monitoring device 33A may be coupled to a solar cell, wind turbine, or other renewable or non-renewable power source.

In some examples, monitoring devices 33A may include a power harvesting device configured to harvest power from power line 24A. For example, the power harvesting device of monitoring device 33A may receive power via the electrical power carried by power line 24A, via a magnetic field produced by power line 24A, or via heat within power line 24A, cable accessory 34A, or other device that generates heat when coupled to power line 24A.

In general, monitoring devices 33 may be communicatively coupled to EEMS 6. In some examples, monitoring devices 33 may include a transceiver to communicate (e.g. via network 4) with EEMS 6. In some examples, monitoring devices 33 communicate with EEMS 6 via communication hubs 26 and/or gateways 28. For example, monitoring devices 33 may output data to gateways 28 and/or communication hubs 26 via power line communication. As another example, monitoring devices 33 may include wireless communication devices, such as WiFi®, Bluetooth®, or RFID devices, which may be read by a mobile device reader (e.g., a vehicle that includes a reader to communicate with monitoring device 33 as a vehicle drives around environment 8B). Monitoring devices 33 may communicate event data indicative of the health or status of electrical cables 32, cable accessories 34. Event data may include data indicative of the sensor data generated by sensors of the electrical equipment 20, device data for electrical equipment 20, analysis data, or a combination therein. For instance, data indicative of the sensor data may include at least a portion of the sensor data generated by one or more sensors of monitoring device 33A, a summary of the sensor data, conclusions or results of analyses performed on the sensor data, or a combination therein. Device data (also referred to as equipment data) may include identification data (e.g., a unique identifier corresponding to a particular article of electrical equipment 20), device type (e.g., transformer, joint, termination joint, etc.), an event timestamp, location data (e.g., GPS coordinates of the particular article of electrical equipment 20), manufacturing data (e.g., manufacturer, lot number, serial number, date of manufacture, etc.), installation data (e.g., date of installation, identity of an installer or installation team), consumer data (e.g., data identifying a quantity and/or type of consumers serviced by the line, addresses served by the line, and the like), power distribution data (e.g., a type of line, such as ultra-high voltage, high voltage, medium voltage, etc.), or a combination therein. In some examples, the event data includes analysis data, such as data indicating whether the electrical equipment is predicted to fail (e.g., whether a failure event is predicted to occur), a predicted or estimated remaining lifespan of the electrical equipment, confidence interval for the prediction, etc. In some examples, monitoring devices 33 may receive data from EEMS 6, communication hubs 26, gateways 28, and/or cable accessories 34. For example, EEMS 6 may transmit requests for sensor data, firmware updates, or other data to monitoring devices 33.

In some examples, monitoring devices 33 include a wireless transceiver configured to transmit data over a wireless network (e.g., WiFi®, Bluetooth®, Zigbee®, etc.). For example, as illustrated in FIG. 1, monitoring devices 33A and 33B may be communicatively coupled to wireless communication hubs 26A and 26B, respectively. In this way, monitoring devices 33A and 33B may communicate with EEMS 6 via wireless communication hubs 26A, 26B. In some examples, monitoring devices 33A-33C may communicate with EEMS 6 via gateway 28. For example, monitoring device 33A may transmit data to monitoring device 33B, and monitoring device 33B may transmit data to monitoring device 33C. Monitoring device 33C may transmit data from monitoring devices 33A-33C to gateway 28, which may forward the data from monitoring devices 33A-33C to EEMS 6.

Monitoring devices 33 may include a wired transceiver. For example, monitoring devices 33 may be configured to communicate with one another, with cable accessories 34, communication hubs 26, gateways 28, and/or EEMS 6 via powerline communication, or over copper or fiber communication lines. In other words, in some examples, monitoring devices 33 may include a transceiver configured to communicate over power lines 24. In this way, power lines 24 may transmit electrical power from a power source to power consumers, as well as transmit data between EEMS 6 and monitoring devices 33. Additional details of monitoring devices 33 are describes with reference to FIG. 3.

One or more articles of electrical equipment 20 may be configured to perform analytics locally. In some examples, monitoring device 33A may analyze sensor data generated by the sensors of monitoring device 33A to determine a health of cable accessory 34A. Monitoring device 33A may determine a health of cable accessory 34A by determining whether cable accessory 34A is predicted to fail (e.g., experience a failure event) within a threshold amount of time, determine an estimated remaining lifespan, etc. Monitoring device 33A may output analysis data based on the results of the analysis. For example, monitoring device 33A may output event data that includes the analysis data to EEMS 6 (e.g., via communication hub 26A, via monitoring device 33B and communication hub 26B, and/or via communication hubs 26B, 26C and gateway 28).

System 2 includes computing devices 16 by which users 18A-18N (collectively, users 18) may interact with EEMS 6 via network 4. For purposes of example, the end-user computing devices 16 may be laptops, desktop computers, mobile devices such as tablets, smart phones and the like.

Users 18 interact with EEMS 6 to control and actively manage many aspects of electrical equipment 20, such as accessing and viewing event records, analytics and reporting. For example, users 18 may review event data acquired and stored by EEMS 6. In addition, users 18 may interact with EEMS 6 to perform asset tracking and to schedule maintenance or replacement for individual pieces of electrical equipment 20, e.g., monitoring devices 33, cables 32 and/or cable accessories 34. EEMS 6 may allow users 18 to create and complete digital checklists with respect to the maintenance and/or replacement procedures and to synchronize any results of the procedures from computing devices 16 to EEMS 6.

Further, as described herein, EEMS 6 integrates an event processing platform configured to process hundreds, thousands, or even millions of concurrent streams of events from monitoring devices 33 that monitor respective articles of electrical equipment 20 (e.g., cable accessories 34). An underlying analytics engine of EEMS 6 applies historical data and models to the inbound streams to compute assertions, such as identified anomalies or predicted occurrences of failure events based on data from sensors of electrical equipment 20. Further, EEMS 6 provides real-time alerting and reporting to notify users 18 of any predicted events, anomalies, trends, and the like.

The analytics engine of EEMS 6 may, in some examples, apply analytics to identify relationships or correlations between sensor data, environmental conditions, geographic regions, or other factors and analyze the impact on failure events. In some examples, EEMS 6 may determine a health of one or more cables accessories 34 or other electrical equipment. For example, EEMS 6 may determine, based on the data acquired across populations of electrical equipment 20, circumstances that lead to, or are predicted to lead to, failure events.

In some examples, EEMS 6 may determine whether an article of electrical equipment 20 should be repaired or replaced, prioritize maintenance (e.g., repair or replacement) procedures, create work orders, assign individuals or crews to perform the maintenance procedures, etc. EEMS 6 may, according to some examples, recommend re-routing electrical power or automatically re-route electrical power based on the analysis results.

EEMS 6 may process data for one or more entities, such as power utilities. For example, EEMS 6 may receive event data from electrical equipment of a single power utility and may provide analytics and reporting for the single power utility. As another example, EEMS 6 may receive event data from multiple power utilities and provide analytics and reporting for each of the power utilities. By receiving data from multiple power utilities, EEMS 6 may provide more robust prediction capabilities, for example, by training machine learning models with a larger data set than individual power utilities each utilizing a separate EEMS 6.

In this way, EEMS 6 integrates comprehensive tools for managing electrical equipment 20 with an underlying analytics engine and communication system to provide data acquisition, monitoring, activity logging, reporting, and alert generation. Moreover, EEMS 6 provides a communication system for operation and utilization by and between the various elements of system 2. Users 18 may access EEMS 6 to view results on any analytics performed by EEMS 6 on data acquired from monitoring devices 33. In some examples, EEMS 6 may present a web-based interface via a web server (e.g., an HTTP server) or client-side applications may be deployed for computing devices 16 used by users 18.

In some examples, EEMS 6 may provide a database query engine for directly querying EEMS 6 to view acquired event (e.g., sensor) data and any results of the analytic engine, e.g., by the way of dashboards, alert notifications, reports and the like. That is, users 18, or software executing on computing devices 16, may submit queries to EEMS 6 and receive data corresponding to the queries for presentation in the form of one or more reports or dashboards. Such dashboards may provide various insights regarding system 2, such as baseline ("normal") operation across environments 8, identifications of any anomalous environments and/or electrical equipment 20, identifications of any geographic regions within environments 2 for which unusual activity (e.g., failure events) has occurred or is predicted to occur, and the like.

As illustrated in detail below, EEMS 6 may simplify workflows for individuals charged with monitoring electrical equipment 20 for an entity or environment. That is, the techniques of this disclosure may enable active electrical equipment management and allow an organization to take preventative or correction actions with respect to particular pieces of electrical equipment.

As one example, the underlying analytical engine of EEMS 6 may be configured to compute and present metrics for electrical equipment within a given environment 8 or across multiple environments for an organization. For example, EEMS 6 may be configured to acquire data and provide aggregated failure metrics and predicted failure analytics across one or more environments 8. Furthermore, users 18 may set benchmarks for occurrence of any failure events, and EEMS 6 may track actual failure events relative to the benchmarks.

As another example, EEMS 6 may further trigger an alert if certain combinations of conditions are present, e.g., to accelerate examination or service of one or more articles of electrical equipment 20, such as one of cable accessories 34. In this manner, EEMS 6 may identify an individual article of electrical equipment 20 predicted to fail and prompt users 18 to inspect and/or replace the article of electrical equipment prior to failure of the article.

While EEMS 6 is described as including the analytics engine, in some examples, communication units 26, gateways 28, and/or monitoring devices 33 may perform some or all of the functionality of EEMS 6. For example, monitoring device 33A may analyze sensor data generated by sensors of one or more monitoring devices 33 (e.g., from monitoring device 33A itself, other monitoring devices, or a combination therein). Monitoring devices 33 may output (e.g., via communication units 26) conclusions, assertions, or results of the analysis to EEMS 6. Similarly, gateways 28 may receive data from a plurality of monitoring devices 33, analyze the data, and send messages to EEMS 6 and/or one or more monitoring devices 33.

In this way, an EEMS may monitor event data from monitoring devices to determine the health of the articles of electrical equipment and/or predicting whether an article of electrical equipment will fail. By determining the health or predicting whether an article of electrical equipment will fail, the EEMS may enable power utilities to more effectively determine where failures have occurred or are likely to occur and manage or prioritize repair or replacement of electrical equipment, which may prevent or reduce failure events in the power grid.

Figure 2:
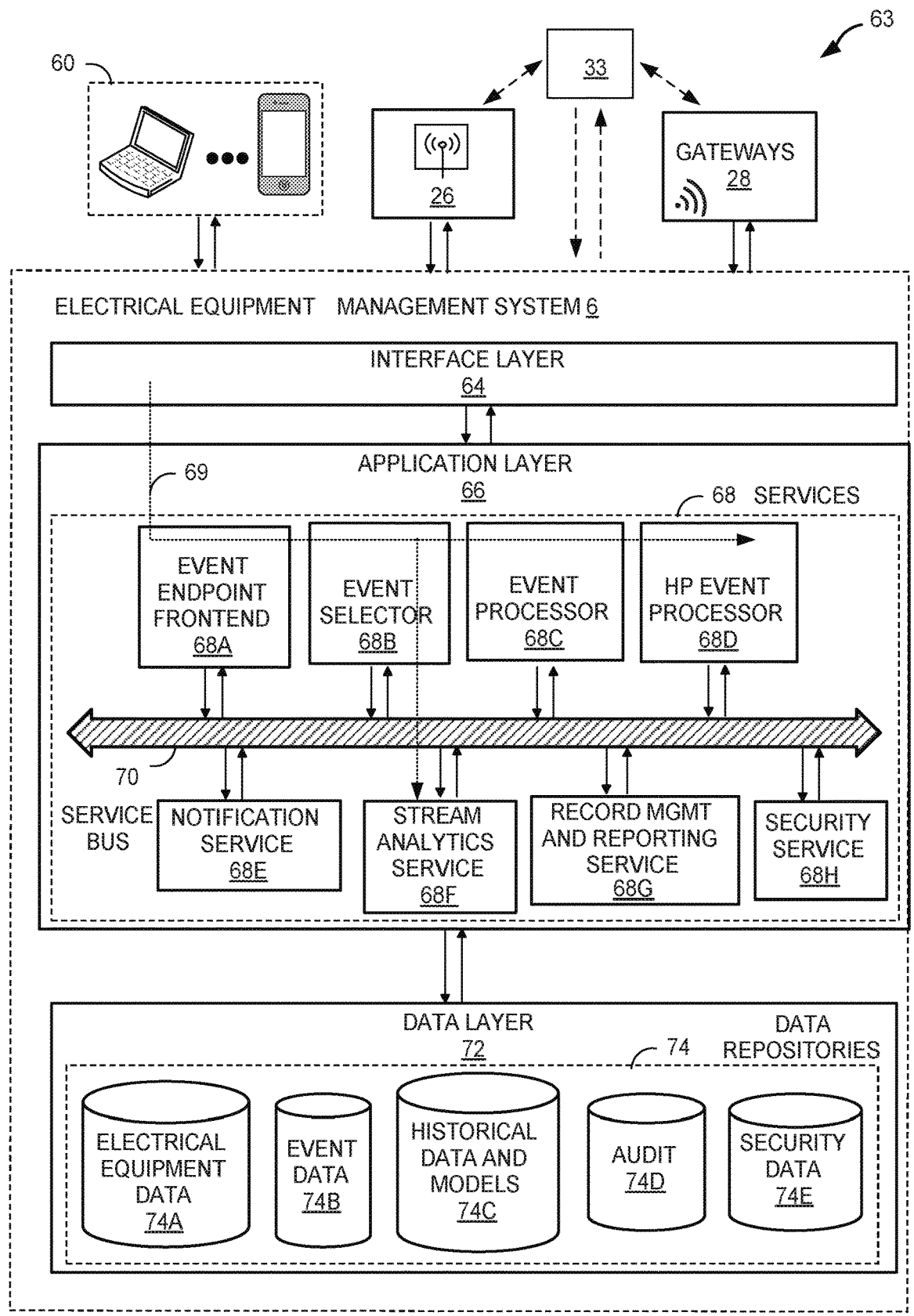
FIG. 2 is a block diagram illustrating an operating perspective of the electrical equipment management system shown in FIG. 1, in accordance with various techniques of this disclosure.

FIG. 2 is a block diagram providing an operating perspective of EEMS 6 when hosted as cloud-based platform capable of supporting multiple, distinct environments 8 each having a plurality of articles of electrical equipment 20. In the example of FIG. 2, the components of EEMS 6 are arranged according to multiple logical layers that implement the techniques of the disclosure. Each layer may be implemented by one or more modules comprised of hardware, software, or a combination of hardware and software.

In FIG. 2, monitoring devices 33, either directly or by way of communication hubs 26 and/or gateways 28, as well as computing devices 60, operate as clients 63 that communicate with EEMS 6 via interface layer 64. Computing devices 60 typically execute client software applications, such as desktop applications, mobile applications, and web applications. Computing devices 60 may represent any of computing devices 16 of FIG. 1. Examples of computing devices 60 may include, but are not limited to, a portable or mobile computing device (e.g., smartphone, wearable computing device, tablet), laptop computers, desktop computers, smart television platforms, and servers, to name only a few examples.

As further described in this disclosure, monitoring devices 33 communicate with EEMS 6 (directly or via communication hubs 26 and/or gateways 28) to provide streams of data acquired from embedded sensors and other monitoring circuitry and receive from EEMS 6 alerts, configuration data, and other communications. Client applications executing on computing devices 60 may communicate with EEMS 6 to send and receive data that is retrieved, stored, generated, and/or otherwise processed by services 68A-68H (collectively, services 68). For instance, the client applications may request and edit event data including analytical data stored at and/or managed by EEMS 6. In some examples, the client applications may request and display aggregate event data that summarizes or otherwise aggregates numerous individual instances of failure events and corresponding data acquired from monitoring devices 33 and/or generated by EEMS 6. The client applications may interact with EEMS 6 to query for analytics data about past and predicted failure events. In some examples, the client applications may output (e.g., for display) data received from EEMS 6 to visualize such data for users of clients 63. As further illustrated and described in below, EEMS 6 may provide data to the client applications, which the client applications output for display in user interfaces.

Clients applications executing on computing devices 60 may be implemented for different platforms but include similar or the same functionality. For instance, a client application may be a desktop application compiled to run on a desktop operating system, or may be a mobile application compiled to run on a mobile operating system. As another example, a client application may be a web application such as a web browser that displays web pages received from EEMS 6. In the example of a web application, EEMS 6 may receive requests from the web application (e.g., the web browser), process the requests, and send one or more responses back to the web application. In this way, the collection of web pages, the client-side processing web application, and the server-side processing performed by EEMS 6 collectively provides the functionality to perform techniques of this disclosure. In this way, client applications use various services of EEMS 6 in accordance with techniques of this disclosure, and the applications may operate within various different computing environment (e.g., embedded circuitry or processor of a desktop operating system, mobile operating system, or web browser, to name only a few examples).

As shown in FIG. 2, EEMS 6 includes an interface layer 64 that represents a set of application programming interfaces (API) or protocol interface presented and supported by EEMS 6. Interface layer 64 initially receives messages from any of clients 63 for further processing at EEMS 6. Interface layer 64 may therefore provide one or more interfaces that are available to client applications executing on clients 63. In some examples, the interfaces may be application programming interfaces (APIs) that are accessible over a network. Interface layer 64 may be implemented with one or more web servers. The one or more web servers may receive incoming requests, process and/or forward data from the requests to services 68, and provide one or more responses, based on data received from services 68, to the client application that initially sent the request. In some examples, the one or more web servers that implement interface layer 64 may include a runtime environment to deploy program logic that provides the one or more interfaces. As further described below, each service may provide a group of one or more interfaces that are accessible via interface layer 64.

In some examples, interface layer 64 may provide Representational State Transfer (RESTful) interfaces that use HTTP methods to interact with services and manipulate resources of EEMS 6. In such examples, services 68 may generate JavaScript Object Notation (JSON) messages that interface layer 64 sends back to the client application that submitted the initial request. In some examples, interface layer 64 provides web services using Simple Object Access Protocol (SOAP) to process requests from client applications. In still other examples, interface layer 64 may use Remote Procedure Calls (RPC) to process requests from clients 63. Upon receiving a request from a client application to use one or more services 68, interface layer 64 sends the data to application layer 66, which includes services 68.

Data layer 72 of EEMS 6 represents a data repository that provides persistence for data in EEMS 6 using one or more data repositories 74. A data repository, generally, may be any data structure or software that stores and/or manages data. Examples of data repositories include but are not limited to relational databases, multi-dimensional databases, maps, and hash tables, to name only a few examples. Data layer 72 may be implemented using Relational Database Management System (RDBMS) software to manage data in data repositories 74. The RDBMS software may manage one or more data repositories 74, which may be accessed using Structured Query Language (SQL). Data in the one or more databases may be stored, retrieved, and modified using the RDBMS software. In some examples, data layer 72 may be implemented using an Object Database Management System (ODBMS), Online Analytical Processing (OLAP) database or other suitable data management system.

Electrical equipment data 74A of data repositories 74 may include data corresponding to a plurality of articles of electrical equipment, such as cable accessories 34. In some examples, electrical equipment data 74A may include device or equipment data, manufacturing data, installation data, consumer data, power distribution data, among others. For example, electrical equipment data 74A may include, for each cable accessory of cable accessories 34, data identifying a date of manufacture, a date of installation, a location (e.g., GPS coordinates, street address, etc.), entity that installed the cable accessory, a unique identifier (e.g., serial number), a type of cable accessory, etc. For example, prior to joining electrical cables 32A and 32B of FIG. 1 with cable accessory 34A, an installer may scan (e.g., with one of computing devices 16, such as a mobile phone) a barcode on cable accessory 34A that includes device data representing a unique identifier, date of manufacture, and so forth, and may upload the device data to EEMS 6. In some instances, the mobile device may append data such as the current date as the date of installation and GPS coordinates to the device data, and may send the device data to EEMS 6, such that EEMS 6 may store the device data for cable accessory 34A in electrical equipment data 74A.

As shown in FIG. 2, EEMS 6 also includes an application layer 66 that represents a collection of services 68 for implementing much of the underlying operations of EEMS 6. Application layer 66 receives data included in requests received from client devices 63 and further processes the data according to one or more of services 68 invoked by the requests. Application layer 66 may be implemented as one or more discrete software services executing on one or more application servers, e.g., physical or virtual machines. That is, the application servers provide runtime environments for execution of services 68. In some examples, the functionality interface layer 64 as described above and the functionality of application layer 66 may be implemented at the same server.

Application layer 66 may include one or more separate software services 68 (e.g., processes) that communicate with one another (e.g., via a logical service bus 70), as one example. Service bus 70 generally represents a logical interconnections or set of interfaces that allows different services to send messages to other services, such as by a publish/subscription communication model. For instance, each of services 68 may subscribe to specific types of messages based on criteria set for the respective service. When a service publishes a message of a particular type on service bus 70, other services that subscribe to messages of that type will receive the message. In this way, each of services 68 may communicate data to one another. As another example, services 68 may communicate in point-to-point fashion using sockets or other communication mechanism.

As shown in FIG. 2, each of services 68 is implemented in a modular form within EEMS 6. Although shown as separate modules for each service, in some examples the functionality of two or more services may be combined into a single module or component. Each of services 68 may be implemented in software, hardware, or a combination of hardware and software. Moreover, services 68 may be implemented as standalone devices, separate virtual machines or containers, processes, threads or software instructions generally for execution on one or more physical processors. In some examples, one or more of services 68 may each provide one or more interfaces that are exposed through interface layer 64. Accordingly, client applications of computing devices 60 may call one or more interfaces of one or more of services 68 to perform techniques of this disclosure.

In accordance with techniques of the disclosure, services 68 may include an event processing platform including an event endpoint frontend 68A, event selector 68B, and event processor 68C. Event endpoint frontend 68A operates as a front-end interface for receiving and sending communications to monitoring devices 33 (e.g., directly or via communication hub 26, and/or gateways 28). In other words, event endpoint frontend 68A operates to as a front line interface to monitoring devices 33 deployed within environments 8 of FIG. 1. In some instances, event endpoint frontend 68A may be implemented as a plurality of tasks or jobs spawned to receive individual inbound communications of event streams 69 from the monitoring devices 33 (e.g. integrated within cable accessories 34) carrying data sensed and captured by sensors of the monitoring devices 33. When receiving event streams 69, for example, event endpoint frontend 68A may spawn tasks to quickly enqueue an inbound communication, referred to as an event, and close the communication session, thereby providing high-speed processing and scalability. Each incoming communication may, for example, carry recently captured data representing sensed conditions, motions, temperatures, actions or other data, generally referred to as events. Communications exchanged between the event endpoint frontend 68A and the cable accessories 34 may be real-time or pseudo real-time depending on communication delays and continuity.

Event selector 68B operates on the stream of events 69 received from monitoring devices 33, communication hubs 26, and/or gateways 28 via frontend 68A and determines, based on rules or classifications, priorities associated with the incoming events. Based on the priorities, event selector 68B enqueues the events for subsequent processing by event processor 68C or high priority (HP) event processor 68D. Additional computational resources and objects may be dedicated to HP event processor 68D so as to ensure responsiveness to critical events, such as actual failure or predicted imminent failure of a cable accessory 34. Responsive to processing high priority events, HP event processor 68D may immediately invoke notification service 68E to generate alerts, instructions, warnings or other similar messages to be output to monitoring devices 33 or users 18 of computing devices 60. Events not classified as high priority are consumed and processed by event processor 68C.

In general, event processor 68C or high priority (HP) event processor 68D operate on the incoming streams of events to update event data 74B within data repositories 74. In general, event data 74B includes data indicative of sensor data obtained from monitoring devices 33 (e.g., integrated with cable accessories 34), device data for electrical equipment 20 of FIG. 1, analysis data, or a combination therein. For example, in some instances, event data 74B may include entire streams of samples of data obtained from sensors of monitoring devices 33. In other instances, event data 74B may include a subset of such data, e.g., associated with a particular time period. As another example, event data 74B may include analysis data indicating results of analysis of sensor data performed by one or more of monitoring devices 33, communication hub 26, and/or gateway 28.

Event processors 68C, 68D may create, read, update, and delete event data stored in event data 74B. Event data may be stored in a respective database record as a structure that includes name/value pairs of data, such as data tables specified in row/column format. For instance, a name of a column may be "Accessory ID" and a value may be a unique identification number (e.g., unique identifier) corresponding to a particular article of electrical equipment 20 of FIG. 1. An event record may include data such as, but not limited to: equipment identification, data acquisition timestamp(s), and data indicative of one or more sensed parameters.

Event selector 68B may direct the incoming stream of events to stream analytics service 68F, which is configured to perform in depth processing of the incoming stream of events to perform real-time analytics. Stream analytics service 68F may, for example, be configured to process and compare multiple streams of event data 74B with historical data and models 74C in real-time as event data 74B is received. In this way, stream analytics service 68F may be configured to detect anomalies, transform incoming event data values, or trigger alerts upon predicting a possible failure event (e.g., failure of an article of electrical equipment 20). Historical data and models 74C may include, for example, one or more trained models configured to predict whether a failure vent will occur, an expected remaining lifespan for one or more articles of electrical equipment 20, and/or prioritize maintenance (e.g., repair or replacement) of articles of electrical equipment. In addition, stream analytics service 68F may generate output for communicating to cable accessories 34 (e.g., via notification service 68E) or computing devices 60 (e.g., via notification service 68G or record management and reporting service 68G).

In this way, analytics service 68F processes inbound streams of events, potentially hundreds or thousands of streams of events, from monitoring devices 33 within environments 8 to apply historical data and models 74C to compute assertions, such as identified anomalies or predicted occurrences of imminent failure events based on conditions sensed by the sensors of the monitoring devices 33. Stream analytics service 68F may publish the assertions to notification service 68F and/or record management by service bus 70 for output to any of clients 63.

In this way, analytics service 68F may be configured as an active electrical equipment management system that predicts failure events (e.g., potentially imminent failures or failures likely to occur within a threshold amount of time) and provides real-time alerting and reporting. In addition, analytics service 68F may be a decision support system that provides techniques for processing inbound streams of event data to generate assertions in the form of statistics, conclusions, and/or recommendations on electrical equipment 20 for utilities, workers, and other remote users. For instance, analytics service 68F may apply historical data and models 74C to determine a probability of failure of one or more articles of electrical equipment 20 (e.g., cable accessories 34), prioritize repair and/or replacement of the article of electrical equipment, etc. Hence, analytics service 68F may maintain or otherwise use one or more models that provide risk metrics to predict failure events.

In some examples, analytics service 68F may generate user interfaces based on processing data stored by EEMS 6 to provide actionable data to any of clients 63. For example, analytics service 68F may generate dashboards, alert notifications, reports and the like for output at any of clients 63. Such data may provide various insights regarding baseline ("normal") operation across environments 8 or electrical equipment 20 (e.g., cable accessories 34), identifications of any anomalous characteristics of electrical equipment 20 that may potentially cause a failure of at least a portion of the power grid within an environment 8, and the like.

According to aspects of this disclosure, as noted above, EEMS 6 may apply analytics to predict the likelihood of a failure event. Although other technologies can be used, in one example implementation, analytics service 68F utilizes machine learning when operating on event streams so as to perform real-time analytics. That is, analytics service 68F may include executable code generated by application of machine learning to training data of event streams and known failure events to detect patterns. The executable code may take the form of software instructions or rule sets and is generally referred to as a model that can subsequently be applied to event streams 69 for detecting similar patterns and predicting upcoming events. For example, analytics service 68F may determine a status or health (e.g., predicted remaining lifespan) of the respective article of equipment 20 (e.g., cable accessory 34A) or predict whether/when the respective article of electrical equipment 20 will experience a failure event. That is, EEMS 6 may determine the likelihood or probability of a failure event based on application historical data and models 74C to event data received from electrical equipment 20. For example, EEMS 6 may apply historical data and models 74C to event data from monitoring devices 33 in order to compute assertions, such as anomalies or predicted occurrences of imminent failure events based on sensor data, environmental conditions, and/or other event data corresponding to electrical equipment 20 monitored by monitoring devices 33.

EEMS 6 may apply analytics to identify relationships or correlations between sensed data from sensors of monitoring devices 33 monitoring electrical equipment 20, environmental conditions of environments in which electrical equipment 20 is located, a geographic region in which electrical equipment 20 is located, a type of electrical equipment 20, a manufacturer and/or installer of electrical equipment, among other factors. EEMS 6 may determine, based on the data acquired across populations of electrical equipment 20, conditions, possibly within a certain environment or geographic region, lead to, or are predicted to lead to, unusually high occurrences of failure events. EEMS 6 may generate alert data based on the analysis of the event data and transmit the alert data to computing devices 16 and/or monitoring device 33. Hence, according to aspects of this disclosure, EEMS 6 may determine event data of monitoring devices 33, generate status indications, determine performance analytics, and/or perform prospective/preemptive actions based on a likelihood of a failure event (e.g., scheduling maintenance or replacement).

Analytics service 68F may, in some example, generate separate models for different environments, geographic areas, types of electrical equipment, or combinations thereof. Analytics service 68F may update the models based on event data received from monitoring devices 33. For example, analytics service 68F may update the models for a particular geographic area, a particular type of electrical equipment, a particular environment, or combinations thereof based on event data received from monitoring devices 33. Alternatively, or in addition, analytics service 68F may communicate all or portions of the generated code and/or the machine learning models to monitoring devices 33, communication hubs 26, and/or gateways 28 for execution thereon so as to provide local alerting in near-real time.

Example machine learning techniques that may be employed to generate models 74C can include various learning styles, such as supervised learning, unsupervised learning, and semi-supervised learning. Example types of algorithms include Bayesian algorithms, Clustering algorithms, decision-tree algorithms, regularization algorithms, regression algorithms, instance-based algorithms, artificial neural network algorithms, deep learning algorithms, dimensionality reduction algorithms and the like. Various examples of specific algorithms include Bayesian Linear Regression, Boosted Decision Tree Regression, and Neural Network Regression, Back Propagation Neural Networks, the Apriori algorithm, K-Means Clustering, k-Nearest Neighbour (kNN), Learning Vector Quantization (LUQ), Self-Organizing Map (SOM), Locally Weighted Learning (LWL), Ridge Regression, Least Absolute Shrinkage and Selection Operator (LASSO), Elastic Net, and Least-Angle Regression (LARS), Principal Component Analysis (PCA) and Principal Component Regression (PCR).

EEMS 6 may initially train models 74C based on a training set of event data and, in some examples, on data for corresponding failure events. As further example description, EEMS 6 may select a training set comprising a set of training instances, each training instance comprising an association between event data and a failure event. EEMS 6 may, for each training instance in the training set, modify, based on particular event data and a particular failure event of the training instance, one or more of models 74C to change a likelihood predicted by the models for the particular failure event in response to subsequent event data applied to the models 74C. In some examples, the training instances may be based on real-time or periodic data generated while EEMS 6 managing data for one or more articles of electrical equipment and/or work environments. As such, one or more training instances of the set of training instances may be generated from use of one or more articles of electrical equipment 20 after EEMS 6 performs operations relating to the detection or prediction of a failure event for an article of electrical equipment 20.

By training a model based on the training set, analytics service 68F may apply the model to the event data and generate higher probabilities or scores for failure events that correspond to training feature sets that are more similar to the particular feature set. In the same way, analytics service 68F may apply the model the event data and generate lower probabilities or scores for failure events that correspond to training feature sets that are less similar to the particular feature set. Accordingly, analytics service 68F may train one or more models 74C, receive event data from one or more monitoring devices 33 monitoring respective articles of electrical equipment 20, and output one or more probabilities or scores that indicate likelihoods of failure events based on the received event data vector.

In some examples, analytics service 68F may train one or models 74C based on sensor data generated by sensors of monitoring devices 33. For example, analytics service 68F may determine that temperature is predictive of impending failure based on training data. For instance, arcing, partial discharge, connector resistance increase, tracking, and other processes may cause an increase in temperature the leads to a failure event. As another example, analytics service 68F may determine based on the training data that acoustic emissions (e.g., arcing, partial discharge, and gas release) are related to failure events. As another example, analytics service 68F may determine that electromagnetic emissions (e.g., produced by partial discharge and arcing) and/or the current and/or voltage on the line can also provide an indication of failure events. As another example, analytics service 68F may determine, based on the training data, that temperature alone is not indicative of failure except when the damage progresses to near-complete failure (e.g., since high temperature can be due to high current). Rather, analytics service 68F determines based on the training data that the life-expectancy and failure of electrical equipment 20 is based at least in part line current of cables 32 and temperature of cable accessories 34. In some examples, analytics service 68F may determine a relationship between the line current of cables 32 and the temperature of cable accessories 34 based on direct current measurements (e.g., through a power harvesting coil, the inductive communication coil, or a separate inductive coil of cable accessories 34). As another example, analytics service 68F may, based on the training data, that a difference between the temperature of a cable (e.g., cable 32A) and temperature of a corresponding cable accessory to which the cable is directly coupled (e.g., accessory 34A) is indicative of damage to cable accessory 34A, the life-span of cable accessory 34A, and/or whether or when cable accessory 34A is predicted to experience a failure event.

In some examples, analytics service 68F trains the one or more models 74C based on failure events for articles of electrical equipment 20 and/or work environment having similar characteristics (e.g., of a same type). In some examples the "same type" may refer to identical but separate instances of articles of electrical equipment. In other examples the "same type" may not refer to identical instances of electrical equipment. For instance, although not identical, a same type may refer to articles of electrical equipment in a same class or category of electrical equipment, same model of electrical equipment, or same set of one or more shared functional or physical characteristics, to name only a few examples. Similarly, a same type of environment may refer to identical but separate instances of work environment types. In other examples, although not identical, a same type may refer to an environment in a same class or category of environments, such as "below ground electrical cables", "underwater electrical cables", a particular US state, climate, among others.

In some examples, analytics service 68F may predict a failure event based at least in part on application of models 74C to event data 69, such as sensor data generated by monitoring devices 33 monitoring articles of electrical equipment 20. For example, analytics service 68F may apply one or more models 74C to sensor data indicative of temperature, acoustic emissions, electromagnetic emissions, current, voltage, or any combination therein to determine a health status (e.g., predicted remaining lifespan) of electrical equipment 20 and/or predict failure events of electrical equipment 20. In some examples, analytics service 68F may train models 74C based on data from multiple sensors and may apply one or models 74C to sensor data from multiple different sensors to more accurately predict the health status of a given article of electrical equipment and whether or when the article of electrical equipment 20 will fail.

Analytics service 68F may apply one or more models 74C to sensor data and other event data to determine a health status of an article of electrical equipment 20 and/or whether or when the article of electrical equipment will fail. In some examples, analytics service 68F may apply one or more models 74C to sensor data and device data to predict health status and/or failure events. For example, analytics service 68F may predict whether cable accessory 34A will fail based on sensor data and a type of cable accessory 34A. For instance, analytics service 68F may determine that cable accessories of a first type (e.g., joints performed via a "heat shrink") have different failure patterns than cable accessories of a second type (e.g., joint performed via a "cold shrink"). As another example, analytics service 68F may determine that cable accessories 34 installed by one installer or installed in one geographic location have different failure patterns that cable accessories 34 installed by a different installer or geographic location.

According to aspects of this disclosure, EEMS 6 may schedule maintenance (e.g., repair or replacement) operations of electrical equipment 20 based on event data. For example, analytics service 68F may predict a remaining lifespan for cable accessory 34A, determine the predicted remaining lifespan for cable accessory 34A is less than a threshold lifespan, and schedule a replacement operation for cable accessory 34A based on such data. As another example, analytics service 68F may rank maintenance operations for a plurality of articles of electrical equipment, for example, based on the predicted remaining lifespan, confidence of the prediction, importance of the various articles of electrical equipment (e.g., quantity of customers served by each article), among others. In some examples, analytics service 68F may automatically order replacement electrical equipment 20 based on one or more models 74C.

Additionally, or alternatively, according to aspects of this disclosure, event data from monitoring devices 33 may be used to determine alerts and/or actively control operation of electrical equipment 20. For example, EEMS 6 may reconfigure or re-route electrical power to transmit power over another electrical line (e.g., 24B of FIG. 1) in response to predicting imminent failure of electrical equipment along a particular line (e.g., 24A of FIG. 1). As another example, analytics service 68F may output a notification (e.g., to computing devices 16) in response to determining a health status of electrical equipment 20 or predicting a failure event. For example, analytics service 68F may output a notification to one or more computing devices 16 via notification service 68E.

Again, EEMS 6 may determine the above-described performance characteristics and/or generate the alert data based on application of the event data to one or more models 74C. However, while the determinations are described with respect to EEMS 6, as described in greater detail herein, one or more other computing devices, such as cable accessories 34, communication hubs 26, and/or gateways 28 may be configured to perform all or a subset of such functionality.

Record management and reporting service 68G processes and responds to messages and queries received from computing devices 60 via interface layer 64. For example, record management and reporting service 68G may receive requests from client computing devices for event data related to individual articles electrical equipment 20, groups of articles of electrical equipment (e.g., types of articles), geographic regions of environments 8 or environments 8 as a whole. In response, record management and reporting service 68G accesses event data based on the request. Upon retrieving the event data, record management and reporting service 68G constructs an output response to the client application that initially requested the data. In some examples, the data may be included in a document, such as an HTML document, or the data may be encoded in a JSON format or presented by a dashboard application executing on the requesting client computing device. For instance, as further described in this disclosure, example user interfaces that include the event data are depicted in the figures.

As additional examples, record management and reporting service 68G may receive requests to find, analyze, and correlate event data (e.g., event data for one or more monitoring devices 33 monitoring respective articles of electrical equipment 20). For instance, record management and reporting service 68G may receive a query request from a client application for event data 74B over a historical time frame, such as a user can view event data over a period of time and/or a computing device can analyze the event data over the period of time.

In example implementations, services 68 may also include security service 68H that authenticate and authorize users and requests with EEMS 6. Specifically, security service 68H may receive authentication requests from client applications and/or other services 68 to access data in data layer 72 and/or perform processing in application layer 66. An authentication request may include credentials, such as a username and password. Security service 68H may query security data 74E to determine whether the username and password combination is valid. Security data 74E may include security data in the form of authorization credentials, policies, and any other data for controlling access to EEMS 6. As described above, security data 74E may include authorization credentials, such as combinations of valid usernames and passwords for authorized users of EEMS 6. Other credentials may include device identifiers or device profiles that are allowed to access EEMS 6.

Security service 68H may provide audit and logging functionality for operations performed at EEMS 6. For instance, security service 68H may log operations performed by services 68 and/or data accessed by services 68 in data layer 72. Security service 68H may store audit data such as logged operations, accessed data, and rule processing results in audit data 74D. In some examples, security service 68H may generate events in response to one or more rules being satisfied. Security service 68H may store data indicating the events in audit data 74D.

In general, while certain techniques or functions are described herein as being performed by certain components, e.g., EEMS 6 or monitoring devices 33, it should be understood that the techniques of this disclosure are not limited in this way. That is, certain techniques described herein may be performed by one or more of the components of the described systems. For example, in some instances, monitoring devices 33 may have a relatively limited sensor set and/or processing power. In such instances, gateway 28 and/or EEMS 6 may be responsible for most or all of the processing of event data, determining the likelihood of a failure event, and the like. In other examples, monitoring devices 33, communication hubs 26, and/or gateways 28 may have additional sensors, additional processing power, and/or additional memory, allowing such devices to perform additional techniques. Determinations regarding which components are responsible for performing techniques may be based, for example, on processing costs, financial costs, power consumption, or the like.

Figure 3:
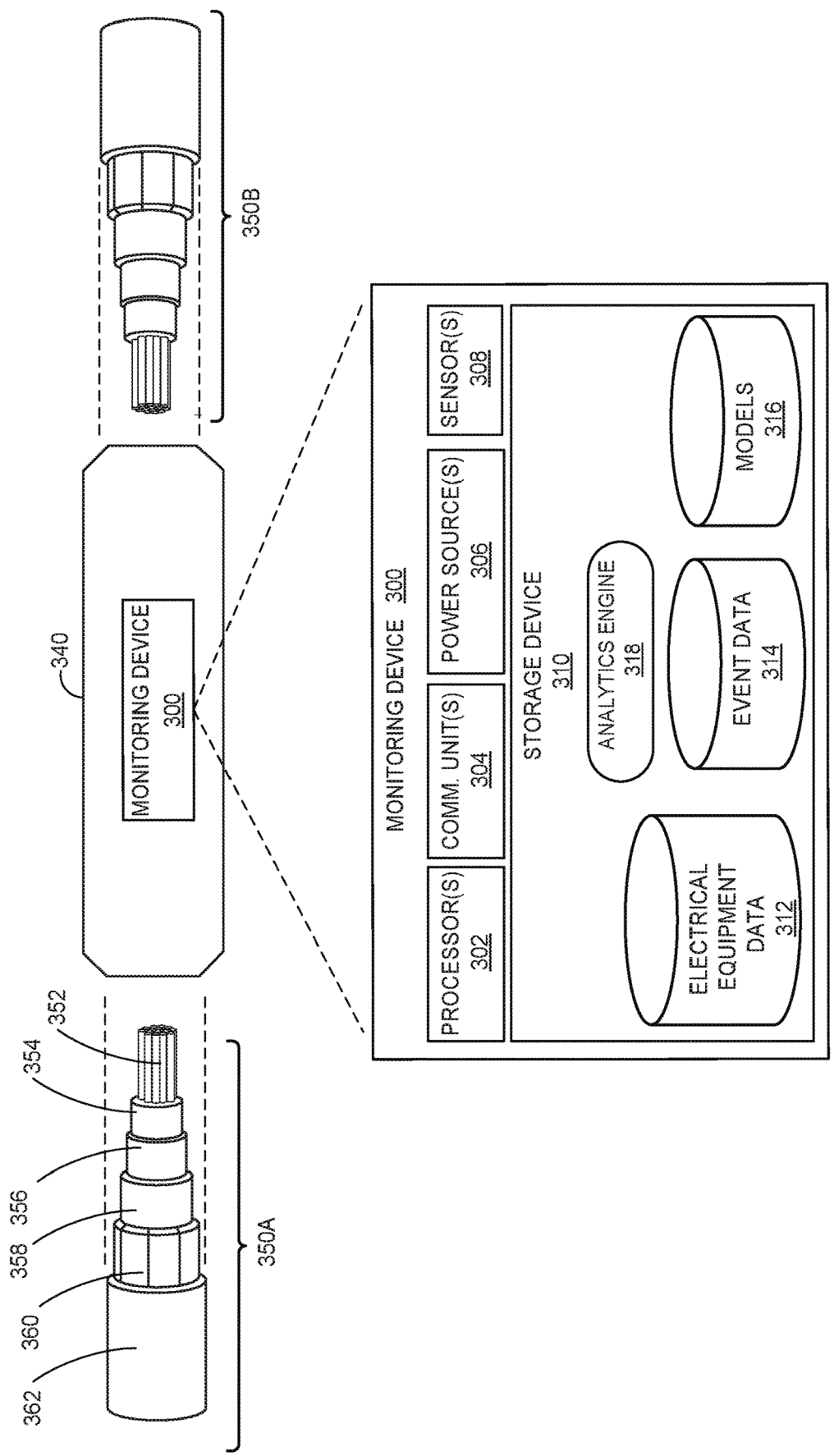
FIG. 3 is a conceptual diagram of an example cable accessory configured to electrically and physically couple two electrical cables, in accordance with various techniques of this disclosure.

FIG. 3 is a conceptual diagram of an electrical cable accessory 340 configured to electrically and physically couple two electrical cables 350 A and 350B (collectively, electrical cables 350), in accordance with various techniques of this disclosure. Cable accessory 340 may electrically and physically couple electrical cable 350A and electrical cable 350B. Cable accessory 340 may be an example of cable accessories 34 of FIG. 1 and electrical cables 350A, 350B may be examples of electrical cables 32 of FIG. 1.

In the example of FIG. 3, electrical cable 350A includes a plurality of concentric (e.g., cylindrical) layers, such as central conductor 352, conductor screen 354, insulation 356, insulation screen 358, shield 360 (also referred to as sheath 360), and jacket 362. However, in some examples, electrical cables may include more or fewer layers. Electrical cable 350B may include a similar plurality of layers. It should be understood that the layers of cables 32 are not necessarily drawn to scale. Electrical cables 350 may be configured for AC and/or DC power transmission.

Electrical cables 350 may transmit voltages of 11 kV, 33 kV, 66 kV, 360 kV, as a few example voltages. In some instances, electrical cables 350 transmit electrical power between a power source and substation may transmit voltages of 360 kV or more, which may be considered a "transmission level voltage". In some examples, electrical cables 350 transmit voltages between 33 kV and 360 kV, such as 66 kV or 33 kV, which may be considered "sub-transmission-level voltages," and may provide electrical power from a power source to an end-user or customer (e.g., customers utilizing a relatively large amount of power). As another example, electrical cables 350 that transmit electrical power between a distribution substation and a distribution transformer may transmit voltages less than 33 kV, which may be considered "distribution-level voltages." Electrical cables 350 may also transmit electrical power between a distribution substation or distribution transformer (e.g., a pad-mount transformer or pole-mount transformer) and end-users or consumers (e.g., homes and businesses) and may transmit voltages between 360 volts and 240 volts, at such voltages electrical cables 350 may be called "secondary distribution lines."

Central conductor 352 includes a conductive material, such as copper or aluminum. In some examples, central conductor 352 includes a single solid conductor or a plurality of stranded conductors. A diameter or thickness of the central conductor 352 is based on the current that electrical cables 350 is designed to transmit or conduct. In other words, the cross-sectional area of central conductor 352 is based on the current that electrical cables 350 are designed to transmit. For example, central conductor 352 may be configured to transmit currents of 1,000 amperes or more.

Conductor screen 354 may include a semi-conductive polymer, such as carbon black loaded polymer. The semi-conductive polymer may have a bulk resistivity in a range from approximately 5 to approximately 100 ohm-cm. Conductor screen 354 may be physically and electrically coupled to central conductor 352. In the example of FIG. 3, conductor screen 354 is disposed between central conductor 352 and insulation 356. Conductor screen 354 may provide a continuous conductive surface around the exterior of central conductor 352, which may reduce or eliminate sparking that might otherwise be created by central conductor 352.

In some examples, insulation 356 includes polyethylene, such as a cross-linked polyethylene (which may be abbreviated as PEX, XPE, or XLPE) or an ethylene propylene rubber (which may be abbreviated as EPR). A diameter or thickness of the insulation 356 is based on the voltage that electrical cables 350 is designed to transmit or conduct.

Insulation screen 358 may include a semi-conductive polymer similar to conductor screen 354. In the example of FIG. 3, insulation screen 358 is disposed between insulation 356 and shield 360. Insulation screen 358 may be coupled to insulation 356. In some examples, insulation screen 358 is electrically coupled to shield 360.

Shield 360 may include a conductive material, such as a metal foil or film or wires. In some examples, shield 360 may be referred to as a "earth ground conductor."

As illustrated in FIG. 3, jacket 362, also referred to as an "oversheath," is an outer layer of electrical cables 350. Jacket 362 may be a plastic or rubber polymer, such as polyvinyl chloride (PVC), polyethylene (PE), or ethylene propylene diene monomer (EPDM).

Electrical cables 350 may include additional layers, such as a swellable or water blocking material placed within the conductor strands (e.g., a strand fill) or between various layers within electrical cables 350.

According to aspects of this disclosure, cable accessory 340 includes a monitoring device 300 configured to monitor the health of cable accessory 340, electrical cables 350, and/or electrical equipment (e.g., equipment near accessory 340). Monitoring device 300 may be an example of monitoring devices 33 of FIG. 1. In some examples, monitoring device 300 includes at least one processor 302, a communication unit 304, a power source 306, one or more sensors 308, and a storage device 310. FIG. 3 illustrates one example of a cable accessory 340. Many other examples of cable accessory 340 may be used in other instances and may include a subset of the components included in example cable accessory 340 or may include additional components not shown example cable accessory 340 in FIG. 3.

Cable accessory 340 includes one or more power sources 306 to provide power to components shown in cable accessory 340. In some examples, power sources 306 include a primary power source to provide electrical power and a secondary, backup power source to provide electrical power if the primary power source is unavailable (e.g., fails or is otherwise not providing power). In some examples, power source 306 includes a battery, such as a Lithium Ion battery. As another example, power source 306 may include a power harvesting device or circuit configured to derive power from an external source. Power source 306 may include a power harvesting circuit configured to harvest power from electrical cables 350. For example, electrical cables 302 generate a magnetic field when current flows through electrical cables 302. Power source 306 may include a circuit that generates a current based on the magnetic field, such that the current generated by power source 306 may provide electrical power to monitoring device 300. In some examples, power source 306 may include a piezoelectric power harvesting device, thermoelectric power harvesting device, photovoltaic harvesting device, or any other power harvesting device.

One or more processors 302 may implement functionality and/or execute instructions within cable accessory 340. For example, processors 302 may receive and execute instructions stored by storage device 310. These instructions executed by processors 302 may cause cable accessory 340 to store and/or modify information, within storage devices 310 during program execution. Processors 302 may execute instructions of components, analytics engine 318, to perform one or more operations in accordance with techniques of this disclosure. That is, analytics engine 318 may be operable by processor 302 to perform various functions described herein.

One or more communication units 304 of cable accessory 340 may communicate with external devices by transmitting and/or receiving data. For example, cable accessory 340 may use communication units 304 to transmit and/or receive radio signals on a radio network such as a cellular radio network. Examples of communication units 304 include a network interface card (e.g. such as an Ethernet card), an optical transceiver, a radio frequency transceiver, a GPS receiver, or any other type of device that can send and/or receive information. Other examples of communication units 304 may include Bluetooth®, GPS, cellular (e.g., 3G, 4G), LPWAN, and Wi-Fi® radios. As another example, communications unit 304 may communicate with external devices by transmitting and/or receiving data via wired communication.

Communication units 304 may be configured to send and receive data via electrical cables 350 using power line communication (PLC) techniques. Communications unit 304 may enable power line communications over narrowband frequencies (e.g., approximately 500 kHz or lower) or broadband frequencies (e.g., approximately 1 MHz or higher). In contrast to utilizing inductive coupling (which may be costly, heavy, and challenging to install), communication unit 304 may include a capacitive coupling circuit to inject data into, and extract data from, electrical cables 350.

Monitoring device 300 includes one or more sensors 308 configured to generate sensor data that is indicative of one or more conditions of cable accessory 340. Examples of sensors 308 include temperature sensors (e.g., internal and/or external to the cable accessory), partial discharge sensors, voltage and/or current sensors, among others. Sensors 308 may be attached on, inside, or near the cable accessory 340. In some examples, sensors 308 include one or more temperature sensors, such as an internal temperature sensor to monitor the temperature inside cable accessory 340 and/or an external temperature monitor to monitor the temperature outside or on the surface of cable accessory 34. Sensors 308 may include a partial discharge sensor to detect partial discharges within cable accessory 340. As another examples, sensors 308 may include a voltage and/or current sensor configured to measure the phase and/or magnitude of the voltage or current in cable accessory 340.

One or more storage devices 310 may store information for processing by processors 302. In some examples, storage device 310 is a temporary memory, meaning that a primary purpose of storage device 310 is not long-term storage. Storage device 310 may be configured for short-term storage of information as volatile memory and therefore not retain stored contents if deactivated. Examples of volatile memories include random access memories (RAM), dynamic random access memories (DRAM), static random access memories (SRAM), and other forms of volatile memories known in the art.

Storage device 310 may, in some examples, also include one or more computer-readable storage media. Storage device 310 may be configured to store larger amounts of information than volatile memory. Storage device 310 may further be configured for long-term storage of information as non-volatile memory space and retain information after activate/off cycles. Examples of non-volatile memories include, flash memories, or forms of electrically programmable memories (EPROM) or electrically erasable and programmable (EEPROM) memories. Storage device 830 may store program instructions and/or data associated with components such as analytics engine 318.

In the example of FIG. 3, storage devices 310 include electrical equipment data repository 312, event data repository 314, models repository 316, and analytics engine 318. Data repositories 312, 314, and 316 may include relational databases, multi-dimensional databases, maps, and hash tables, or any data structure that stores data. In some examples, electrical equipment data repository 312 may be similar to, and may include data similar to, electrical equipment data repository 74A of FIG. 2. Likewise, event data repository 314 may be similar to, and may include data similar to, event data 74B as described in FIG. 2.

According to aspects of this disclosure, analytics engine 318 may be operable by one or more processors 302 to perform one or more actions based on the sensor data generated by sensors 308. Analytics engine 318 may be similar to and may include all or a subset of the functionality of, stream analytics engine 68F of FIG. 2.

In some examples, analytics engine 318 may determine a health of cable accessory 340 based at least in part on the sensor data generated by one or more of sensors 308. For example, analytics engine 318 may apply one or more rules (e.g., stored within models repository 316) to the sensor data generated by one or more of sensors 308 to determine the health of cable accessory 340. The rules may be preprogrammed or learned, for example, via machine learning. According to some examples, models data store 316 includes rules trained based at least in part on event data collected from a plurality of cable accessories 34 and known failure events. In such examples, analytics engine 318 may train the one or more models in models repository 316 based on event data within event data repository 314. As another example, monitoring device 300 may receive data representing one or more models from EESR 6 of FIGS. 1 and 2 and may store the models in models repository 316.

Analytics engine 318 may determine the health of cable accessory 340 by predicting, based at least in part on the rules and the sensor data, whether cable accessory 340 will experience a failure event within a predetermined amount of time. For instance, analytics engine 318 may predict whether cable accessory 340 will fail within a predetermined amount of time by applying one or more models of models repository 316 to the sensor data. As one example, analytics engine 318 may apply models of models repository 316 to sensor data stored in event data repository 314. For example, analytics engine 318 may receive temperature data from a temperature sensor indicating a temperature within cable accessory 340 and apply models of models repository 316 to the temperature data. Analytics engine 318 may determine, based on the temperature data and models of models repository 316, that the temperature is within a normal temperature range, such that analytics engine 318 may determine that the health of cable accessory 340 is nominal, or normal. As another example, analytics engine 318 may apply models of models repository 316 to temperature data from a temperature sensor 308 and current data from a current sensor 308. For example, temperature alone may not be indicative of failure of cable accessories 34 because the temperature may increase as current increases. However, temperature and current may be indicative of potential cable accessory failures, for example, if the measured temperature is relatively high even when electrical cables 350 are carrying relatively little current. Thus, in some examples, analytics engine 308 may apply models of models repository 316 to temperature data and current data to determine the health of cable accessory 340.

In some examples, analytics engine 318 applies models of models repository 316 to event data repository 314 and other data, such as data within electrical equipment data repository 312. For example, analytics engine 318 may apply one or more models of models repository 316 to temperature data for cable accessory 340 that is stored within event data repository 314 and data stored within electrical equipment data repository 312 that indicates a type of cable accessory 340 to predict whether cable accessory 340 will experience a failure event (e.g., fail to conduct electrical power) within a predetermined amount of time.

Analytics engine 318 may perform various actions based on the health of cable accessory 340. For example, analytics engine 318 may output a notification (e.g., to EEMS 6) that includes data representing the health of cable accessory 340. For instance, the notification may indicate cable accessory 340 is operating normally. As another example, analytics engine 318 may output a notification indicating that cable accessory 340 is predicted to fail within a predetermined amount of time or indicating a time by which the cable accessory 340 is predicted to fail.

Figure 4:
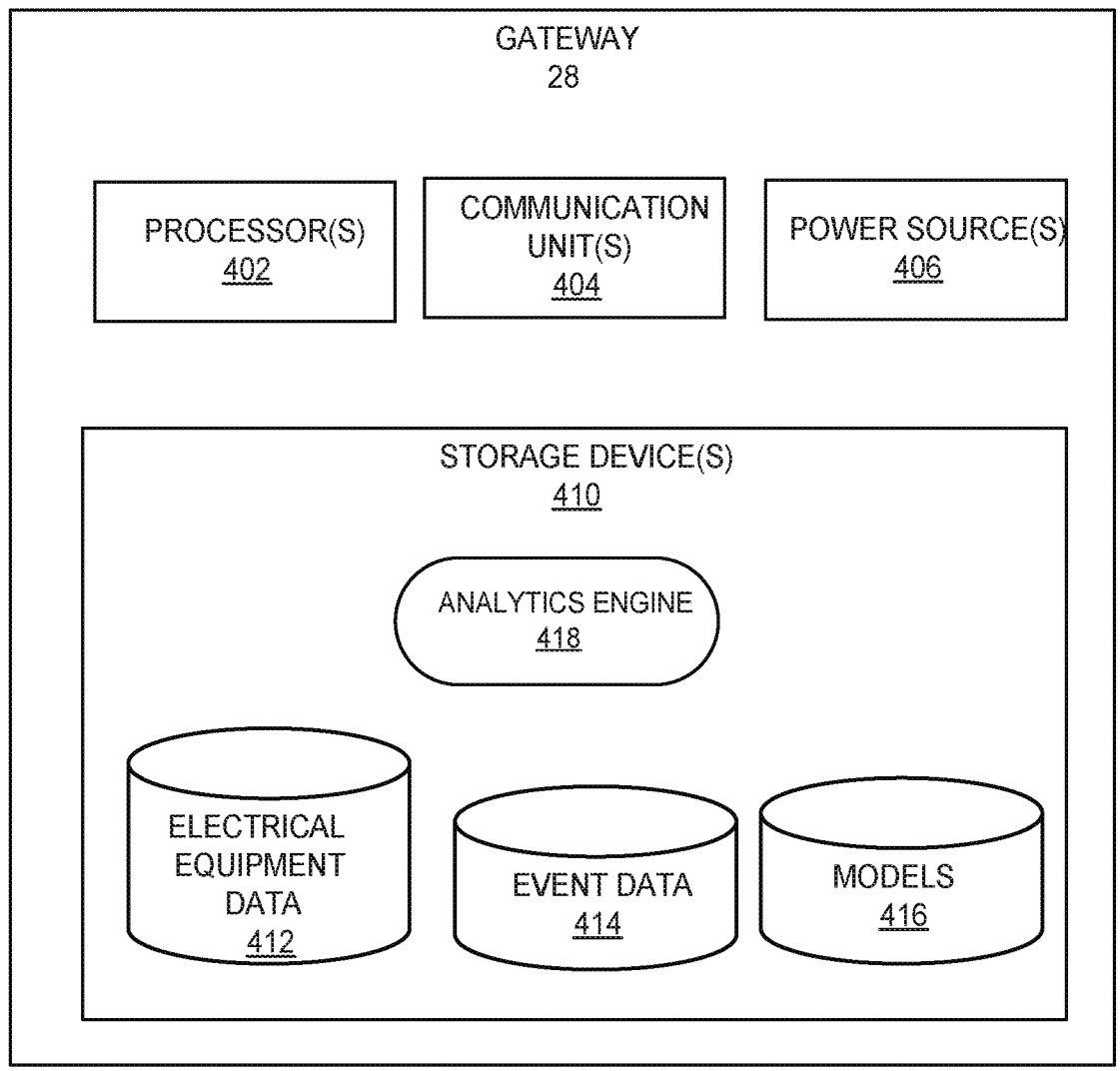
FIG. 4 is a block diagram illustrating an example gateway that is configured to communicate with a cable accessory and EEMS, in accordance with various techniques of this disclosure.

FIG. 4 is a block diagram illustrating an example gateway 28 that is configured to communicate with a cable accessory 34A and EEMS 6, in accordance with various techniques of this disclosure. FIG. 4 illustrates only one particular example of gateway 28. Many other examples of gateway 28 may be used in other instances and may include a subset of the components illustrated in FIG. 4 and/or may include additional components not shown in FIG. 4.

As shown in FIG. 4, gateway 28 includes one or more processors 402, one or more communication units 404, one or more power sources 406, and one or more storage devices 410. Processors 402, communication units 404, power sources 406, and storage components 410 may be similar to and include functionality similar to processors 302, communication units 304, power sources 306, and storage components 310 of FIG. 3. Thus, a description of processors 402, communication units 404, power sources 406, and storage components 410 is omitted for brevity.

Gateway 28 may receive event data from a plurality of cable accessories 34 of one or more lines 24. The event data received by gateway 28 may include data indicative of sensor data generated by sensors of the respective monitoring devices (e.g., monitoring cable accessories), such as all or part of the sensor data, a summary of the sensor data, and/or analysis results based on the sensor data. Gateway 28 may store all or a subset of the event data in event data repository 414. In some examples, gateway 28 may receive notification from one or more cable accessories indicating a health status of the respective cable accessories 34.

Gateway 28 may act as an intermediary between monitoring devices 33 and EEMS 6. For example, gateway 28 may receive notifications from monitoring devices 33 and may send the notification to EEMS 6. As another example, gateway 28 may receive data from EEMS 6. For instance, gateway 28 may receive firmware updates from EEMS 6, and may send the firmware updates from EEMS 6 to monitoring devices 33. In some instances, gateway 28 may receive (e.g., from EEMS 6, monitoring devices 33, or both) equipment data for a plurality of cable accessories 34, installation data, manufacturing data, etc., and may store the equipment data in electrical equipment data repository 412.

In some examples, analytics engine 418 determines a health of respective one or more articles of electrical equipment 20 (e.g., cable accessories 34) based at least in part on the event data within event data repository 414. Analytics engine 418 may apply one or more rules to the event data to determine the health of respective cable accessories of cable accessories 34. The rules may be preprogrammed or learned. The rules may be stored within models repository 416. In some examples, analytics engine 418 may train one or more machine learning models based on event data within event data repository 414 and known failure events and may store the trained models with models repository 416. As another example, gateway 28 may receive the rules from monitoring devices 33 or EEMS 6.

Analytics engine 418 may apply the rules to the event data to determine a health of one or more articles of electrical equipment 20, such as cable accessories 34. For example, analytics engine 418 may determine the health of cable accessory 34A by predicting whether cable accessory 34A will fail within a predetermined amount of time or predicting a remaining lifespan of cable accessory 34A.

Gateway 28 may output data to EEMS 6. In some examples, gateway 28 sends all or a portion of the event data from monitoring devices 33 to EEMS 6. As another example, gateway 28 may send notifications (e.g., generated by monitoring devices 33 and/or gateway 28) to EEMS 6. For instance, gateway 28 may output a notification indicating the remaining lifespan of a particular article of electrical equipment (e.g., cable accessory 34A) is less than a threshold amount of time or indicating the particular article of electrical equipment is predicted to fail.

Figure 5:
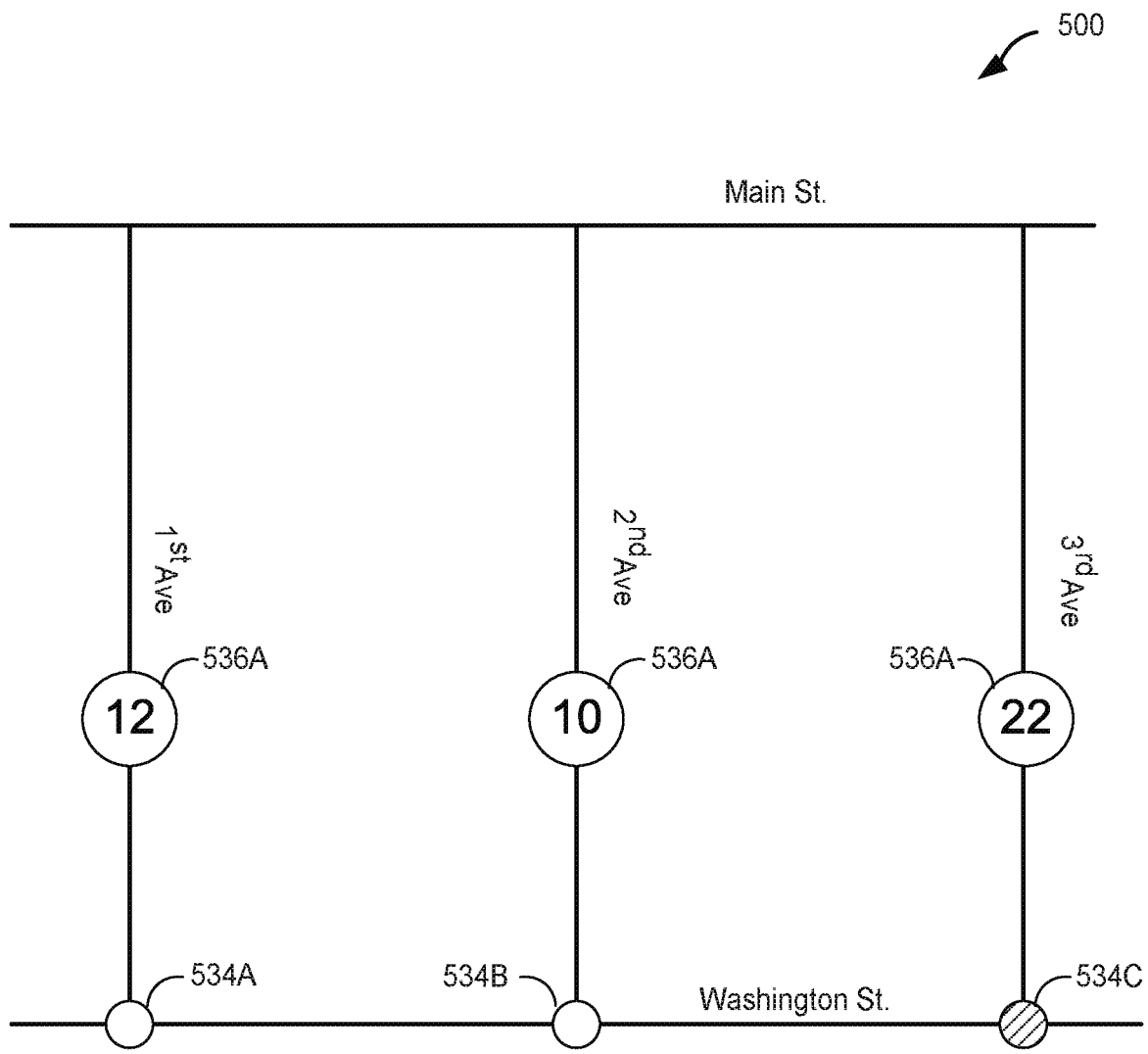
FIG. 5 is an example graphical user interface of the electrical equipment management system, in accordance with techniques of this disclosure.

FIG. 5 is an example graphical user interface on computing devices 16 of the electrical equipment management system 2 in FIG. 1, in accordance with techniques of this disclosure. FIG. 5 is described with reference to electrical equipment management system 6 as described in FIGS. 1 and 2.

EEMS 6 may output a graphical user interface 500 representing an environment, such as environment 8B, that includes a plurality of articles of electrical equipment. In the example of FIG. 5, the articles of electrical equipment illustrated by graphical user interface 500 are described as cable accessories, however graphical user interface 500 may represent different types of electrical equipment. In the example of FIG. 5, graphical user interface 500 include a graphical element (e.g., an icon, symbol, text, or other graphical element) for each respective cable accessory of a plurality of cable accessories within the environment. For example, graphical user interface 500 includes graphical icons 534A-534C, which each represent a respective cable accessory of cable accessories 34 of FIG. 1.

Graphical user interface 500 may output data indicating the health of respective cable accessories. For example, graphical user interface 500 may include a legend 502 with different graphical elements representing different levels of health. In the example of FIG. 5, graphical elements 534A and 534B indicate that the health of the cable accessories represented by the respective graphical elements 534A, 534B is "normal." A normal health may indicate that the respective cable accessories are not predicted to fail within a threshold amount of time or are operating within typical operating parameters (e.g., within an expected temperature range, are experiencing a typical quantity of partial discharge events, etc.). As shown in the example of FIG. 5, graphical element 534C indicates the health of the cable accessory (e.g., cable accessory 34C of FIG. 1) corresponding to graphical element 534C is not normal. In some examples, graphical element 534C may indicate cable accessory 34C is predicted to fail within a threshold amount of time.

In some examples, graphical user interface 500 may include additional data, such as a map indicating the location of one or more cable accessories. For example, graphical user interface 500 may include graphical elements 536A-536C indicating a number of customers (e.g., homes) served by the cable accessory.

Graphical user interface 500 may enabling users 18 of computing devices 16 to select a graphical element to receive additional information for the graphical element. For example, one or more computing devices 18 may output graphical user interface 500 and may receive a user input selecting graphical element 534C. Responsive to receiving data indicating the user selected graphical element 534C, EEMS 6 may output to computing devices 18 additional information for the corresponding cable accessory, such as data indicating the date of installation, location, type of cable accessory, quantity of customers served by the cable accessory, as a few examples. Further, EEMS 6 enable user 16 of computing device 18 to schedule maintenance or replacement of cable accessory 34C, order parts, re-route electrical power or otherwise adjust an operation of the grid, among others.

Figure 6:
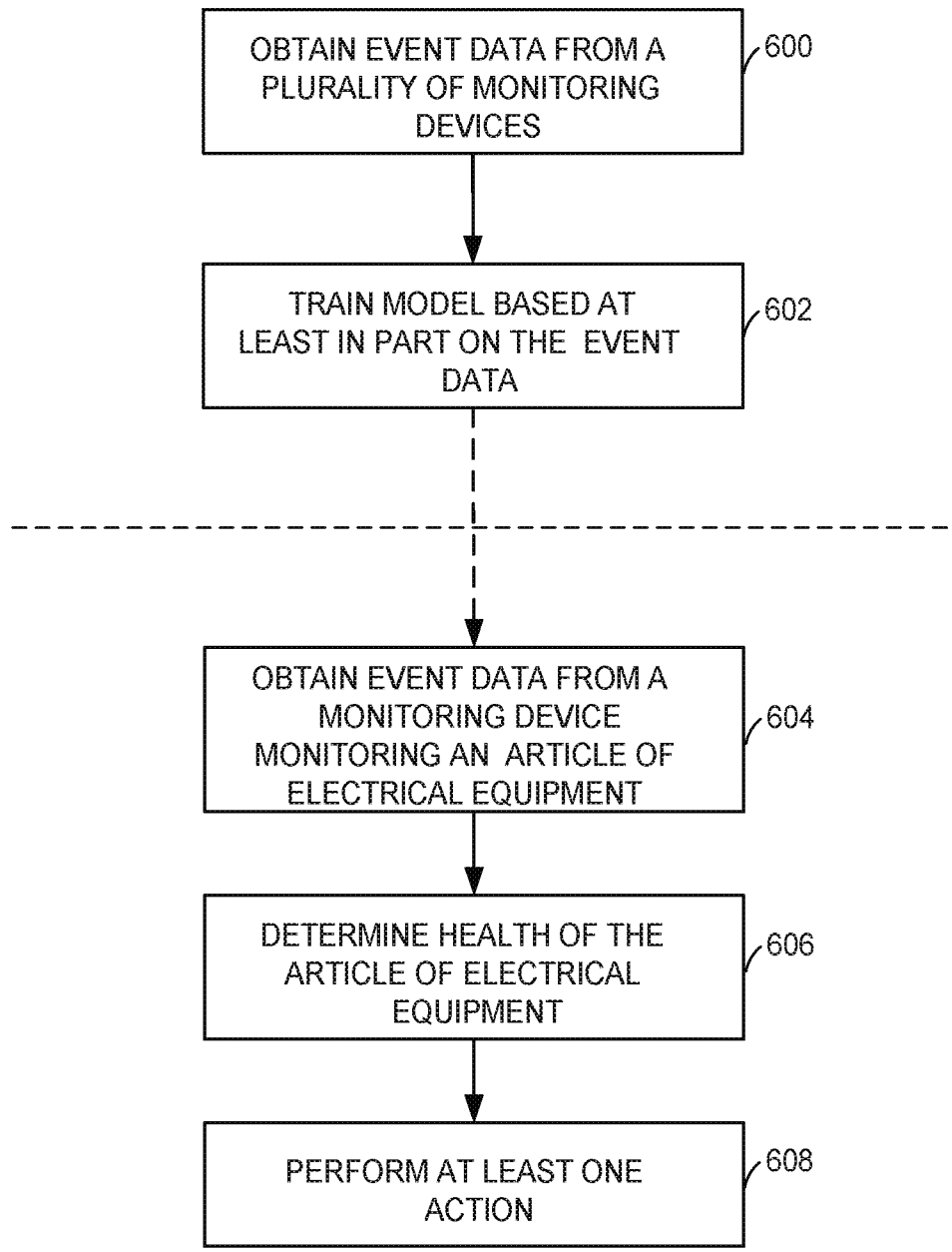
FIG. 6 is a flow chart illustrating example operations performed by one or more computing devices that are configured to monitor electrical utility equipment, in accordance with various techniques of this disclosure.

FIG. 6 is a flow chart illustrating example operations performed by one or more computing devices that are configured to monitor electrical utility equipment, in accordance with various techniques of this disclosure. FIG. 6 is described with reference to the system described in FIGS. 1 and 2.

One or more computing devices, such as computing devices of EEMS 6 and/or processors of gateways 28, hubs 26 or monitoring devices 33, may obtain a first set of event data, referred to as training event data, from a plurality of cable accessories 34 (600). For example, the training event data may be obtained for training one or more learning models prior to deploying models for use within EEMS 6 and/or other devices, such as gateways 28, hubs 26 or monitoring devices 33. The training data may, for example, comprise known (i.e., previously identified, also referred to as "labelled") failure events and associated sensed data. As another example, monitoring device 33A monitoring cable accessory 34A may receive event data from sensors of respective monitoring devices 33 monitoring cable accessories 34 within environment 8B for real-time training and improvement of the models. In some instances, the sensors of the respective monitoring devices 33 include temperature sensors, voltage sensors, partial discharge sensors, among others. According to some examples, each of monitoring devices 33 may output the training event data to gateway 28, EEMS 6, or both. The training event data may include data indicative of the sensor data (e.g., all or a subset of the sensor data, analysis results based on the sensor data, a summary of sensor data, etc.), equipment data, manufacturing data, installation data, consumer data, power distribution data, or a combination therein.

Responsive to receiving the training event data, one or more computing devices may train a model based at least in part on the event data from cable accessories 34 (602). For example, monitoring devices 33, gateway 28, and/or EEMS 6 may utilize machine learning techniques to train a model that receives training event data as input and outputs a predicted health of one or more articles of electrical equipment 20, such as electrical cables 32, cable accessories 34, or power delivery nodes 22. The one or more computing devices may train the model or models using supervised, unsupervised, or semi-supervised learning. According to some examples, the one or more computing devices may train one or more models based on known failure events. For example, EEMS 6 may apply a plurality of training event data corresponding to known failure events to generate one or more models used to predict a future failure event of a particular cable accessory when EEMS 6 subsequently receives event data for the particular cable accessory. In some examples, EEMS 6 may output one or more models to one or more cable accessories 34 or gateways 28. As another example, monitoring devices 33 and/or gateways 28 may train the models, and may output the models to other monitoring devices, gateways 28, or EEMS 6.

After training the one or more models, in some examples, one or more computing devices may receive a second set of event data, referred to as operational event data, from a particular monitoring devices, such as monitoring device 33A monitoring cable accessory 34A (604). For example, monitoring device 33A may receive operational event data, including sensor data from sensors of monitoring device 33A. As another example, monitoring device 33A may output the operational event data to another monitoring device, gateway 28 and/or EEMS 6.

One or more computing devices determine a health of cable accessory 34A based at least in part on the operational event data (606). In some examples, monitoring device 33A, 33B, or 33C, gateway 28, EEMS 6, or a combination therein may apply one or more models to the operational event data from monitoring device 33A to determine a health of cable accessory 34A. For example, monitoring device 33A may determine the health of cable accessory 34A locally or EEMS 6 may determine the health status of cable accessory 34.

Responsive to determining the health of cable accessory 34A, one or more computing devices perform at least one action (608). In some examples, monitoring device 33A performs an action by outputting a notification to EEMS 6 indicating the health of cable accessory 34A. For example, the notification may include data indicating that cable accessory 34A is predicted to fail within a predetermined amount of time. Similarly, gateway 28 and/or EEMS 6 may output a notification indicating the health of cable accessory 34A. As another example, EEMS 6 may perform an action by outputting, to one of computing devices 18, data corresponding to a graphical user interface that indicates a health of cable accessory 34A, such that one of computing devices 18 may display the graphical user interface. As yet another example, EEMS 6 schedule maintenance or replacement of cable accessory 34A.

Figure 7A:
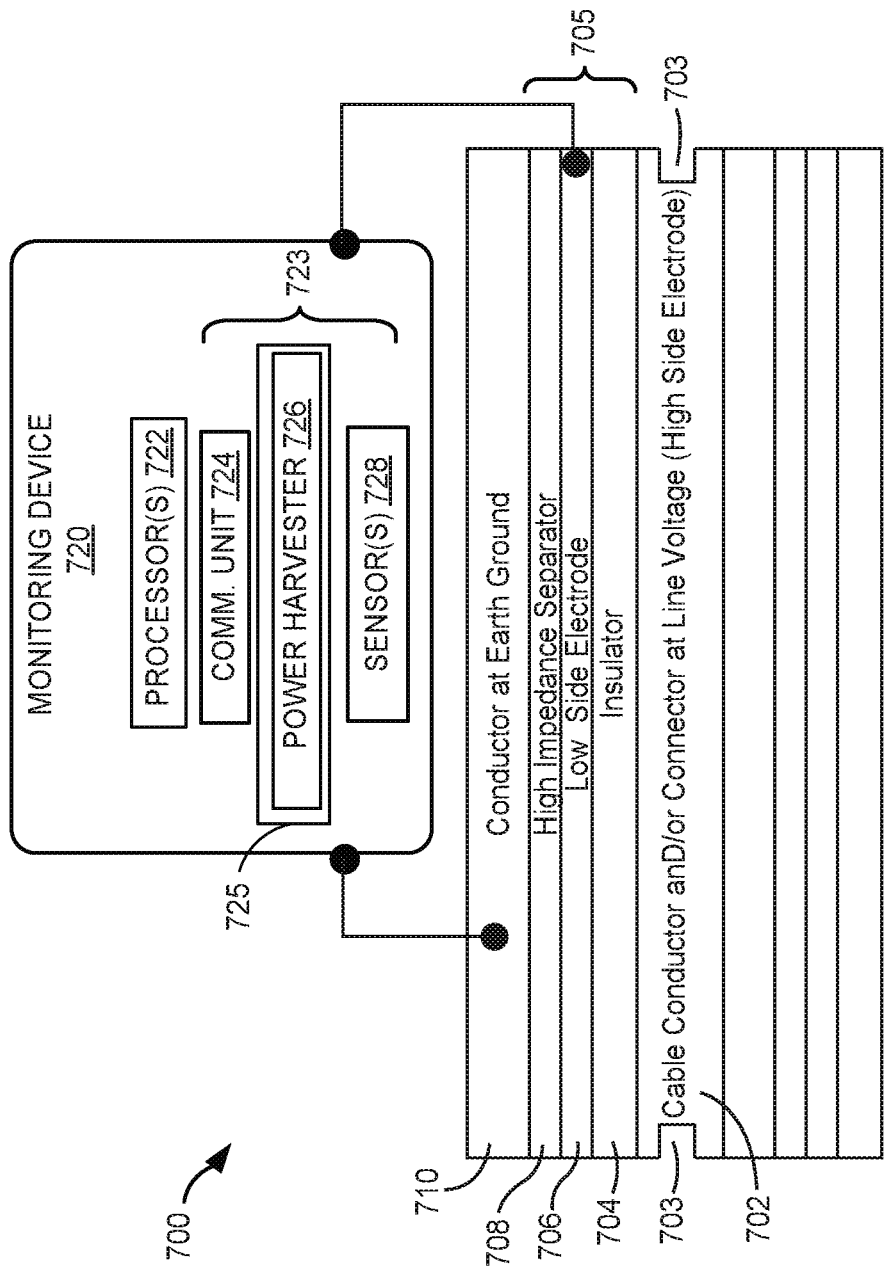
Figure 7B:
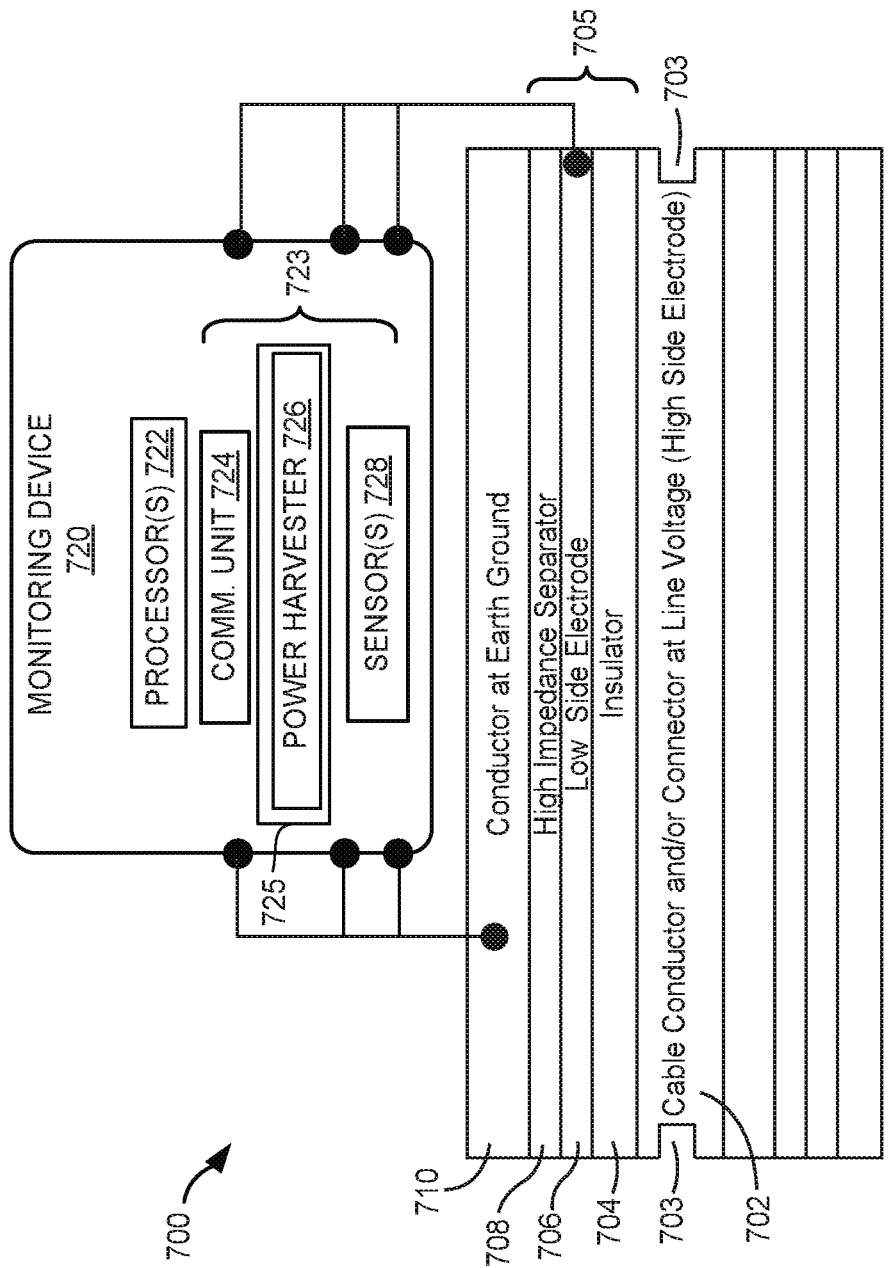

FIGS. 7A-7B are conceptual diagrams illustrating an example cable accessory, in accordance with one or more aspects of this disclosure. FIGS. 7A-7B illustrate a plane view through a center of cable accessory 700 that includes a monitoring device 720. The monitoring device may be integrated into the cable accessory or can be part of a separate monitoring device that can be used with a conventional cable accessory.

Cable accessory 700 may be an example of cable accessories 34 of FIG. 1. In the example of FIGS. 7A-7B, cable accessory 700 includes a monitoring device 720 and a plurality of generally concentric layers, such as connector 702, insulator 704, low side electrode 706, separator 708, ground conductor 710. In some examples, insulator 704, low side electrode 706, and separator 708, may collectively be referred to as a splice body 705, and may generally be coaxial with one another. It should be understood that the layers of cable accessory 700 are not necessarily drawn to scale. Cable accessory 700 may include fewer layers or additional layers not shown here.

Connector 702, which may be a high side electrode in certain configurations, may include a cylindrical body having a surface at a first end of the cylindrical body and a surface at a second end of the cylindrical body, the second end opposite the first end. The cylindrical body may include an outer surface connecting the first end and the second end of the cylindrical body. Each end of the cylindrical body may be configured to receive a respective electrical cable (e.g., electrical cable 32 of FIG. 1). For example, the first end and the second end of connector 702 may each include an aperture 703 configured to receive an electrical cable (e.g., central conductor 352 of electrical cables 350 of FIG. 3, or central conductor 352 and conductor screen 354 of electrical cables 350 of FIG. 3). Apertures 703 may extend the entire length of connector 702, such that connector 702 includes a single aperture 703 or hollow region traversing from the surface at the first end of connector 702 to the surface of the second end of connector 702. As such, an installer coupling two electrical cables together may insert a central conductor of a first electrical cable into an aperture 703 at a first end of connector 702 and a central conductor of a second electrical cable into an aperture 703 at a second end of connector 702 to electrically couple the electrical cables.

In an alternative embodiment, the high side electrode can be the central conductor of one of the first and second electrical cables connected by connector 702.

While the monitoring device is described herein as a cable splice, one of ordinary skill in the art would recognize that the concepts of this monitoring device can be extended to other common cable accessories such as cable terminations, separable connectors, or other cable connection systems.

In this example, connector 702 includes a conductive material, such steel, copper, or aluminum. A diameter or thickness of the connector 702 may be based on the current that cable accessory 700 is designed to transmit or conduct and/or the gauge of electrical cables 350 that cable accessory 700 is configured to couple or connect. Connector 702 may couple two or more electrical cables 350 to conduct electrical power between a power utility and one or more consumers. In such examples, connector 702 may conduct electrical power at a line voltage, which may be called a main voltage. In other words, the voltage transmitted by connector 702 may equal to the voltage transmitted by the power utility or a fraction of the voltage transmitted by the power utility (e.g., as stepped up or down by one or more power delivery nodes located between the power utility and cable accessory 700).

Insulator 704 may include a cylindrical tube made of an insulating material, such as an elastomeric rubber (e.g., ethylene propylene diene monomer (EPDM)). In some examples, a diameter or thickness of the insulator 704 is based on the voltage that cable accessory 700 and/or electrical cables 350 are designed to transmit or conduct.

Low side electrode 706 includes, in some examples, a semi-conductive material, such as a carbon filled polymer that matches the polymer used in the main cable insulation (e.g., a crosslinked polyethylene or ethylene propylene rubber (EPR) material). In some example, low side electrode 706 may be a conductive film deposited on an outer surface of insulator 704. Low side electrode 706 may electrically float relative to connector 702 or ground conductor 710. In other words, in some examples, low side electrode 706 may be electrically isolated from connector 702 and ground conductor 710. Stated another way, low side electrode 706 may be at a different potential than either connector 702 and ground conductor 710. For example, when connector 702 conducts AC current, an oscillating AC voltage in connector 702 may generate a magnetic field, which may in turn induce an AC current and voltage in low side electrode 706.

Figure 7D:
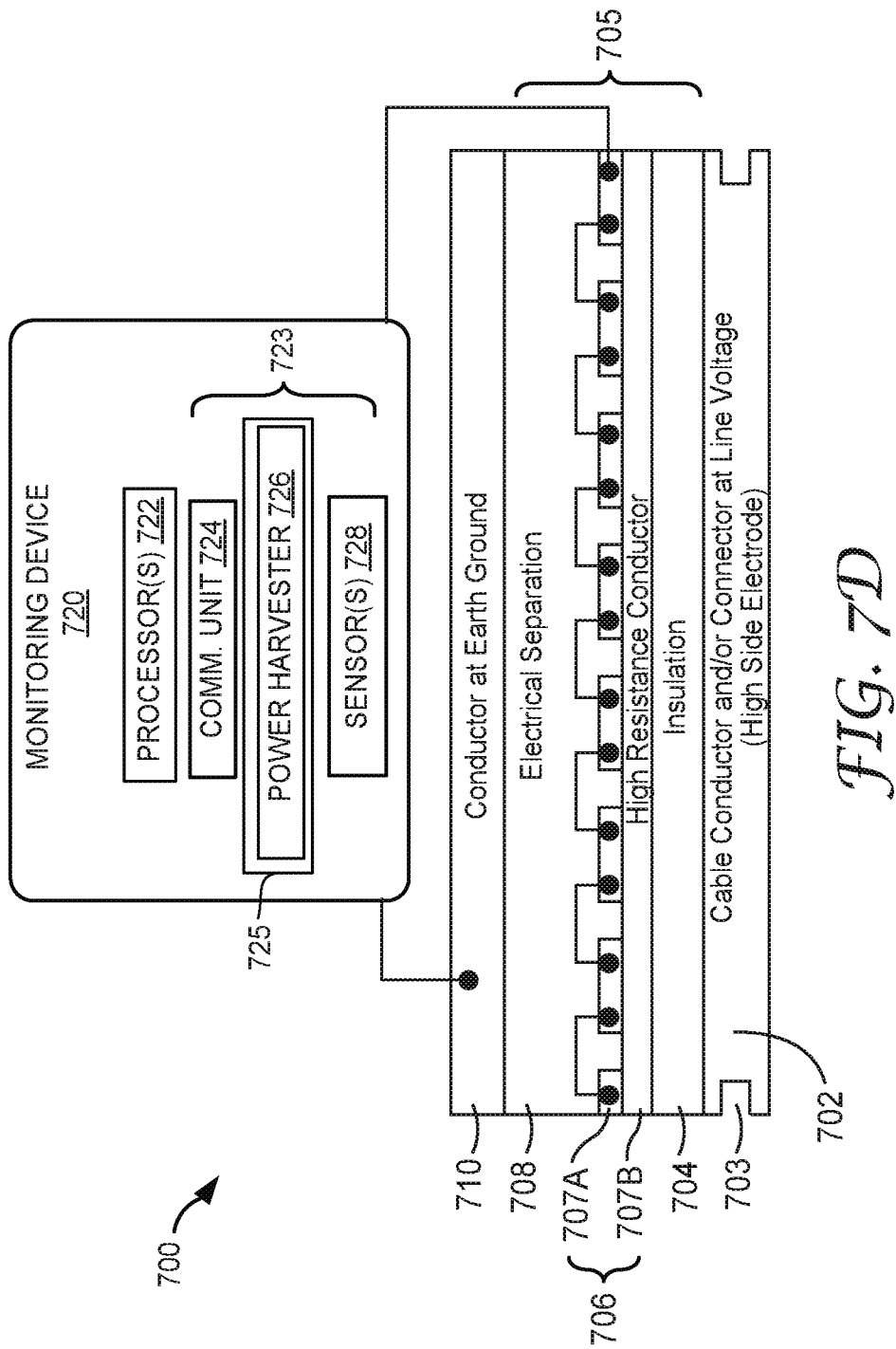

As illustrated in FIGS. 7C and 7D, in some examples, low side electrode 706 may include a plurality of sublayers or regions, such as low resistance region 707A and a comparatively high resistance region 707B. In some examples, low resistance region 707A is disposed between high resistance region 707B and separator 708. Low resistance region 707A may include a material with relatively low resistance compared to high resistance region 707B. In the example of FIG. 7C, low resistance region 707A is a continuous layer, such as a metallic foil. In the example of FIG. 7D, low resistance region 707A is not a continuous layer. For example, as illustrated in FIG. 7D, low resistance region 707A may be a metallic mesh. In examples where low side electrode 706 includes low resistance regions 707A and high resistance regions 707B, monitoring device 720 may be electrically connected to low resistance region 707A of low side electrode 706.

Ground conductor 710, which may also be referred to as conductor at earth ground 710. Ground conductor 710 may include a conductive material, such as copper or aluminum. In some examples, ground conductor 710 may include a wire mesh disposed on the exterior of cable accessory 700. During installation of cable accessory 700 (e.g., while coupling two electrical cables together), ground conductor 710 may be electrically coupled to shield 360 of FIG. 3 of the electrical cables being connected by the cable accessory.

In accordance with techniques of this disclosure, cable accessory 700 includes a separator 708, also referred to as high impedance separator 708, disposed between low side electrode 706 and ground conductor 710. Separator 708 may include an insulating material or relatively high resistance material that is not a perfect insulator. Separator 708 may electrically isolate low side electrode 706 and ground conductor 710. As described in more detail below, electrically separating low side electrode 706 and ground conductor 710 with separator 708 may enable monitoring device 720 to determine a health of cable accessory 700 (e.g., via sensors detecting partial discharge events or monitoring temperatures, voltages, and/or currents in low side electrode 706), harvest power from electrical cables 350, communicate with other computing devices (e.g., EEMS 6) via power line communication, or a combination therein.

Cable accessory 700 includes monitoring device 720. Monitoring device 720 is electrically coupled to low side electrode 706 and ground conductor 710. In some examples, monitoring device 720 is physically disposed between low side electrode 706 and ground conductor 710. However, in some examples, monitoring device 702 may be located in other locations, for example, on an exterior of cable accessory 700.

In an alternative embodiment, the monitoring device may be a separate device that can be disposed over, adjacent or near to cabler accessory 700. In yet another aspect, the monitoring device can be disposed at a mid-span location between cable connection points such that the monitoring device is connected to the low side electrode (e.g., semiconductive layer) and the ground conductor at the midspan location.

Monitoring device 720 may include one or more processors 722, and at least one other device or circuit 723. Devices 723 may include one or more communications units 724, power source 725, one or more sensors 728, or a combination therein. Power supply 725 may include a battery or power harvesting device 726 (also referred to as power harvesting circuit 726).

As illustrated in FIG. 7A, control circuit 720 may include a single electrical connection to each of low side electrode 706 and ground conductor 710. In some examples, such as the example of FIG. 7B, monitoring device 720 may include multiple electrical connections to each of low side electrode 706 and ground conductor 710, such as separate electrical connections to communications units 724, power harvester 726, and sensors 728. Sensors 728 may include temperature sensors (e.g., internal and/or external to the cable accessory), partial discharge sensors, voltage and/or current sensors, among others. The sensors may be attached on, inside, or near the cable accessory 700.

In some examples, multiple devices 723 may utilize low side electrode 706. For example, devices 723 may utilize low side electrode 726 by dividing the time each device 723 is coupled to low side electrode 706, by sampling at different frequencies simultaneously, or a combination therein. Table 1 illustrates example frequencies that may be utilized for various operations or functions of devices 723.

TABLE 1

| Function | Frequency Range |
| --- | --- |
| Power Harvesting | 50/60 Hz |
| Voltage Phase and Magnitude Measurement | 50/60 Hz |
| Power Line Communication | 10-500 kHz |
| Partial Discharge Detection | 1 kHz to 1 GHz |

In some examples, one or more of devices 723 may be continuously coupled to low side electrode 706. In other words, in some examples, at least one of devices 723 utilizes low side electrode 706 such that low side electrode 706 may have a 100% duty cycle. However, in some examples, a lower duty cycle can also be employed (e.g., in time sharing, at any given time, it may be that none of devices 723 are operating or utilizing low side electrode 706).

In operation, monitoring device 720 may include the functionality of monitoring devices 33 of FIG. 1 and 300 of FIG. 3. Monitoring device 720 may determine the health of cable accessory 700. In some examples, monitoring device 720 determines the health of cable accessory 700 based on event data, such as the sensor data generated by sensors 728, device data, manufacturing data, installation data, or a combination therein. Monitoring device 720 may determine the health of cable accessory 700 by applying one or more models to the event data, for example, to predict whether the cable accessory 700 will fail within a predetermined amount of time. Responsive to determining the health of cable accessory 700, monitoring device 720 may output data indicative of the health of cable accessory 700, such as all or a portion of the sensor data, a summary of the sensor data, analysis results based on the sensor data, or a combination therein. In some examples, monitoring device 720 outputs the data to EEMS 6 of FIGS. 1-2 using wired communication techniques (e.g., power line communication) and/or wireless communication techniques (e.g., LTE, Bluetooth®, WiFi®). According to some examples, monitoring device 720 may output event data without determining a health of cable accessory 700. For instance, monitoring device 720 may output event data to gateway 28 and/or EEMS 6 and EEMS 6 and/or gateway 28 may determine the health of cable accessory 700 based on the event data.

By utilizing a low side electrode 706, cable accessory 700 may include a monitoring device 720 that includes a plurality of devices (e.g., sensors 728 and communications unit 724) that share the low side electrode 706, which may reduce the complexity and cost of cable accessory 700. In this way, monitoring device 720 may be relatively easy to install and may provide a relatively efficient, low cost, and simple means for monitoring cable accessory 700 and communicating with EEMS 6.

Figure 8A:
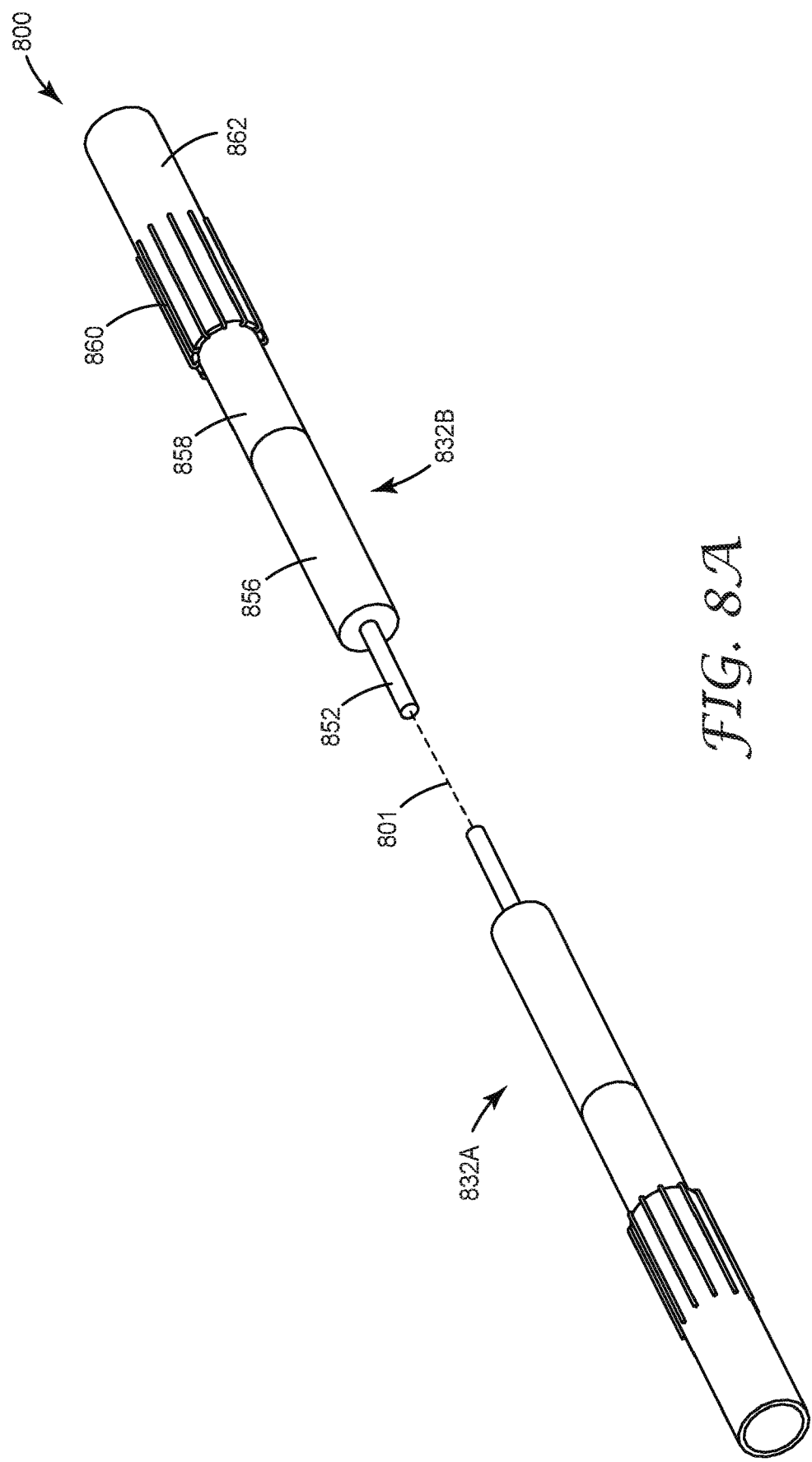

In some examples, an electrical cable or a cable accessory may include a support structure configured to support and/or protect components of a cable condition monitoring device, such as cable accessory 34. FIGS. 8A-8G illustrate the assembly of an example electrical cable monitoring system 800 including a support structure 802. In some examples, support structure 802, as shown in FIG. 8D, includes at least one elongate body 804A and 804B (collectively, body 804), a plurality of first electrodes 806A-806H (collectively, first electrode 806), second electrode 808, a plurality of third electrodes 813A-813D (collectively, third electrode 813), and a monitoring device 810. Support structure 802 is configured to support, house, and protect, monitoring device 810, cable accessory 820, and/or electrical cables 832A and 832B (collectively, electrical cables 832), and/or enable functionality of a monitoring device 810, when support structure 802 in a closed configuration. Monitoring device 810, cable accessory 820, and electrical cables 832 may be the same as or substantially similar to monitoring device 720 and cable accessory 700 described in reference to FIGS. 7A-7D, and electrical cables 350 described in reference to FIG. 3, as described above.

Body 804 may include any suitable material or combinations of material. In some examples, body 804 may include one or more polymers, including, for example, thermoset plastics or thermoplastics (e.g. particulate loaded nylon, acrylonitrile butadiene styrene, polyethylene or polypropylene), or other materials configured to support, house, and protect monitoring device 810, cable accessory 820, and/or electrical cables 832. By forming body 804 from a polymer, body 804 may be molded, e.g., thermoformed, or manufactured by material addition processes, e.g., 3-D printing. In some examples, body 804 may include a unitary structure configured to slip-over cable accessory 820. In some examples, body 804 may include a plurality of segments, such as horizontal segments 804A and 804B joined by hinges 805A and 805B (collectively hinger 805) in a clamshell configuration as shown in FIG. 8D or other horizontal and/or vertical segmented configurations. In some examples, hinges 805 may include one or more living hinges. In some examples, a plurality of segments may include mechanical fasteners or clasps to connect the segments. For example, as shown in FIG. 8E, body 804 defines mechanical connections 807A and 807B configured to secure first horizontal segment 804A to second horizontal segment 804B when body 804 is in a closed configuration. In some examples, a plurality of segments, e.g., vertical segments, may be defined by a joint (e.g., a hinge or a ball and socket joint) or include an elastomer to enable support structure to articulate in one or more directions. By forming body 804 with one or more polymers, different portions of body 804 may include selected material properties, such as strength, elasticity, durability, or the like, suited to a particular portion of body 804.

Body 804 is configured to extend along axis 801 defined by electrical cables 832. Body 804 is configured to surround at least a portion of electrical cables 832 and cable accessory 820. In some examples, body 804 may surround an entire circumference of electrical cables 832 and/or cable accessory 820. In other examples, body 804 may surround less than an entire circumference of electrical cables 832 and/or cable accessory 820. Electrical cables 832 may be the same as or substantially similar to electrical cables 350A and 350B describe in reference to FIG. 3. For example, as in FIG. 8A, electrical cables 832 may include a plurality of concentric layers, such as cable central conductor 852, cable insulation 856, cable insulation screen 858, cable shield 860 (also referred to as sheath 860), and cable jacket 862. Cable accessory 820 may be the same as or substantially similar to cable accessory 720 discussed above in reference to FIGS. 7A-7D. For example, cable accessory 820 includes a monitoring device 810 and a plurality of generally concentric layers, such as a connector 825 (shown in FIG. 8B), an insulator (not shown), and low side electrode 826 (shown in FIG. 8C). Body 804 may be configured to protect one or more components of cable accessory 820.

In some examples, body 804 may engage at least one layer of electrical cables 832 when support structure 802 is in a closed configuration. For example, as shown in FIG. 8D, body 804 includes an interior surface 812. Interior surface 812 may physically couple to one or more layers of electrical cables 832. In some examples, interior surface 812 may include one or more structures, such as protrusions or clamps, configured to substantially reduce motion of electrical cables 832 relative to each other or to body 804. In some examples, interior surface 812 may include a material layer, such as an elastomer, configured to create a friction fit, e.g., interference fit, between interior surface 812 and one or more layers of electrical cables 832 when support structure 802 is in a closed configuration. In this way, support structure 802 may support electrical cables 832. By supporting electrical cables 832, support structure may reduce wear, such as wear on a connector of a cable splice, cause by the relative motion of electrical cables 832.

In the example shown in FIG. 8D, interior surface 812 includes a plurality of ribs 822 extending therefrom. Plurality of ribs 822 may enhance the structural strength of body 804. For example, body 804 including plurality of ribs 822 may be more resistant to deflection or breakage in response to pressure on an exterior surface 824 of body 804 compared to a body 804 without plurality of ribs 822. Plurality of ribs 822 may include any suitable material, arrangement of ribs, or sizes of ribs to provide a desired mechanical strength to body 804. In some examples, at least some ribs of the plurality of ribs may contact a portion of electrical cables 832 and/or cable accessory 820 (e.g., the splice body) when support structure 802 is in a closed configuration.

In some examples, interior surface 812, e.g., plurality of ribs 822, may define attachment structures to which components of cable accessory 820 may be attached or embedded. For example, plurality of ribs 822 define a cavity in which monitoring device 810 is housed. In some examples, monitoring device 810 may be fixed to interior surface 812, e.g., to one or more ribs of plurality of ribs 822, by an adhesive or mechanical fastener.

As another example, first electrodes 806 and/or third electrodes 813 may be attached to interior surface 812, such as one or more ribs of plurality of ribs 822. First electrodes 806 and third electrodes 813 may be fixed to interior surface 812 by any suitable means, such as an adhesive or a mechanical fastener. In some examples, first electrodes 806 and third electrodes 813 may include protrusions or teeth configured to mechanically fasten to interior surface 812. In some examples, as shown in FIG. 8E, second electrode 806 may be attached to exterior surface 824 or may be embedded in body 804. For example, as shown in FIG. 8F, a conductive ground layer 830, such as a conductive mesh, may be installed over support structure 802 and electrically coupled to shielding layers 860 of electrical cables 832, such that second electrode 808 is electrically coupled to shielding layer 860. In this way, first electrodes 806, second electrode 808, and third electrodes 813 may be attached to body 804 to substantially align with a portion of electrical cables 832 and/or cable accessory 820 when support structure 802 is in a closed configuration.

In some examples, interior surface 812 may include one or more alignment features configured to position first electrodes 806 and third electrodes 813 on interior surface 812 such that first electrodes 806 and third electrodes 813 properly engage, e.g., electrically couple to, a desired portion of cable accessory 820 and/or electrical cables 832. The one or more alignment features may reduce installation error due to misalignment of first electrodes 806 or second electrodes 808. In some examples, one or more respective sets of alignment features may be configured to align first electrodes 806 and third electrodes 813 for one or more respective different sizes and/or shapes of electrical cables 832. Additionally, or alternatively, the one or more alignment guides may reduce installation time by reducing manual alignment or coupling of electrodes to electrical cables 832 and/or other components of cable accessory 820.

First electrodes 806, second electrode 808, and third electrodes 813 may include any suitable conductive material and any suitable shape and/or size. In some examples, each first electrodes 806 (and/or each of third electrodes 813) may be electrically coupled to one another and/or to monitoring device 810 by one or more conductive structures disposed within body 804, embedded in body 804, or extending through and positioned along an exterior of body 804. For example, first electrodes 806A-806D may be electrically coupled to a conductor embedded in body 804. By electrically coupling each of first electrodes 806A-806D, contact from any one of first electrodes 806A-806D may be sufficient for proper electrical contact with low side electrode 826. Additionally, the conductor may be electrically coupled to monitoring device 810. In this way, each of first electrodes 806A-806D may be electrically coupled to each other and to monitoring device 810. Similar coupling may be used for first electrode 806E-806H, third electrode 813A and 813B, and third electrodes 813C and 813D.

In some examples, monitoring device 810 may be housed in a water-resistant portion of body 804. For example, monitoring device 810 may be potted in a resin within body 804. Potting monitoring device 810 in a resin may make monitoring device substantially water proof. The resin may include any suitable resin, such as epoxy, acrylic, polyester, polyurethane, silicone, or other thermosetting plastic. By potting monitoring device 810 in a resin, cable accessory 820 may be more resistant to moisture than a cable accessory without monitoring device 810 potted in a resin.

In some examples, an environmental barrier (not shown) may be disposed on interior surface 812 at or near terminal ends 814 and 816 of body 804 and/or one or more edges of body 804, such as edges 818. The environmental barrier may include a gasket, gel seal, mastic wrap, etc. In some examples, a potting material or encapsulant used in conventional electrical accessories may be used to fill the support structure to further enhance the environmental barrier properties of monitoring system 800. In some examples, the environmental barrier may include any suitable barrier to reduce intrusion of moisture or debris, such as a silicon or rubber gasket or skirt. In some examples, the environmental barrier may include thermal insulation to reduce thermal cycling of the components of cable accessory 820, or materials having a high thermal conductivity to reduce accumulation of heat in support structure 802. Support structure 802 including an environmental barrier may reduce water intrusion, debris intrusion, thermal cycling, and/or heat accumulation and thereby increase the longevity of the cable accessory compared to a cable accessory without support structure 802.

In some examples, support structure 802 is configured to support electrical contacts (e.g., first electrodes 806, second electrode 808, and/or third electrodes 813) configured to couple to low side electrode 826, shielding layer 860, or semi-conductive layer 858 of electrical cables 832 or cable accessory 820. As discussed above, first electrodes 806 and/or third electrodes 813 may be attached to interior surface of one or both of horizontal segments of body 804. In some examples, support structure 802 may include one or more spring members configured to urge first electrodes 806 and/or third electrodes 813 toward low side electrode 826 and shielding layer 860, respectively. In some examples, the spring member may include, for example, a metal spring (e.g., a compression spring or a torsion spring) or an elastomer positioned between body 804 and a respective electrode of first electrodes 806 and/or third electrodes 813. In some examples, the respective electrode may be shaped to form the spring member. For example, a portion of the respective electrode may form a compression spring. In an open configuration of support structure 802, e.g., as shown in FIG. 8D, the spring member may be in an uncompressed state (e.g., relative to a compressed state). As support structure is moved toward a closed configuration, e.g., as shown in FIG. 8E, the respective electrode may physically contact with a portion of electrical cables 832 or cable accessory 820 and begin to compress the spring member. When support structure is in a closed configuration, the spring member may be in the compressed state (e.g., relative to the uncompressed state) such that the spring member urges the respective electrode toward the respective portion of electrical cables 832 or cable accessory 820. By urging the respective electrode toward the respective portion of electrical cables 832 or cable accessory 820, the spring member may enhance contact of the respective electrode with the respective portion of electrical cables 832 or cable accessory 820. In this way, first electrodes 806 and third electrodes 813 may maintain electrical contact with low side electrode 826 and/or semi-conductive layer 858 of electrical cables 832 or cable accessory 820, for example, when electrical cables 832 is moved (e.g., an above ground electrical cable moved by wind), if the respective electrode becomes bent (e.g., during installation or reinstallation), or if the relative physical orientation of the respective electrode or the respective portion of electrical cables 832 or cable accessory 820 is otherwise changed (e.g., twisting of electrical cables 832 or wearing of support structure 802, over time). In some examples, by urging the respective electrode toward the respective portion of electrical cables 832 or cable accessory 820, the spring member may enable first electrodes 806 and second electrodes 808 to achieve proper electrical contact when support structure is installed on electrical cables 832 having different sizes and/or shapes.

In some examples, support structure 802 is configured to provide a controlled capacitance between the low side electrode and the shielding layer. For example, body 804 may electrically separate, e.g., insulate, first electrodes 806 from second electrode 808. By electrically separating first electrodes 806 from second electrode 808, first electrodes 806 and second electrode 808 (and/or one or more conductive structures electrically coupled to respective first electrodes 806 and second electrode 808) may be arranged in support structure 802, such as within body 804 or on one or more surfaces of body 804, to define a capacitor. A particular arrangement of first electrodes 806, second electrode 808, and/or one or more conductive structures electrically coupled to respective first electrodes 806 and second electrode 808 may be controlled to result in a capacitance between first electrodes 806 and second electrode 808 in response to a current in electrical cables 832. Monitoring device 810 may be configured to detect the capacitance. Monitoring device 810 may use the detected capacitance to determine a health of cable accessory 820, as described above in reference to cable accessory 34 of FIG. 1.

Figure 8B:
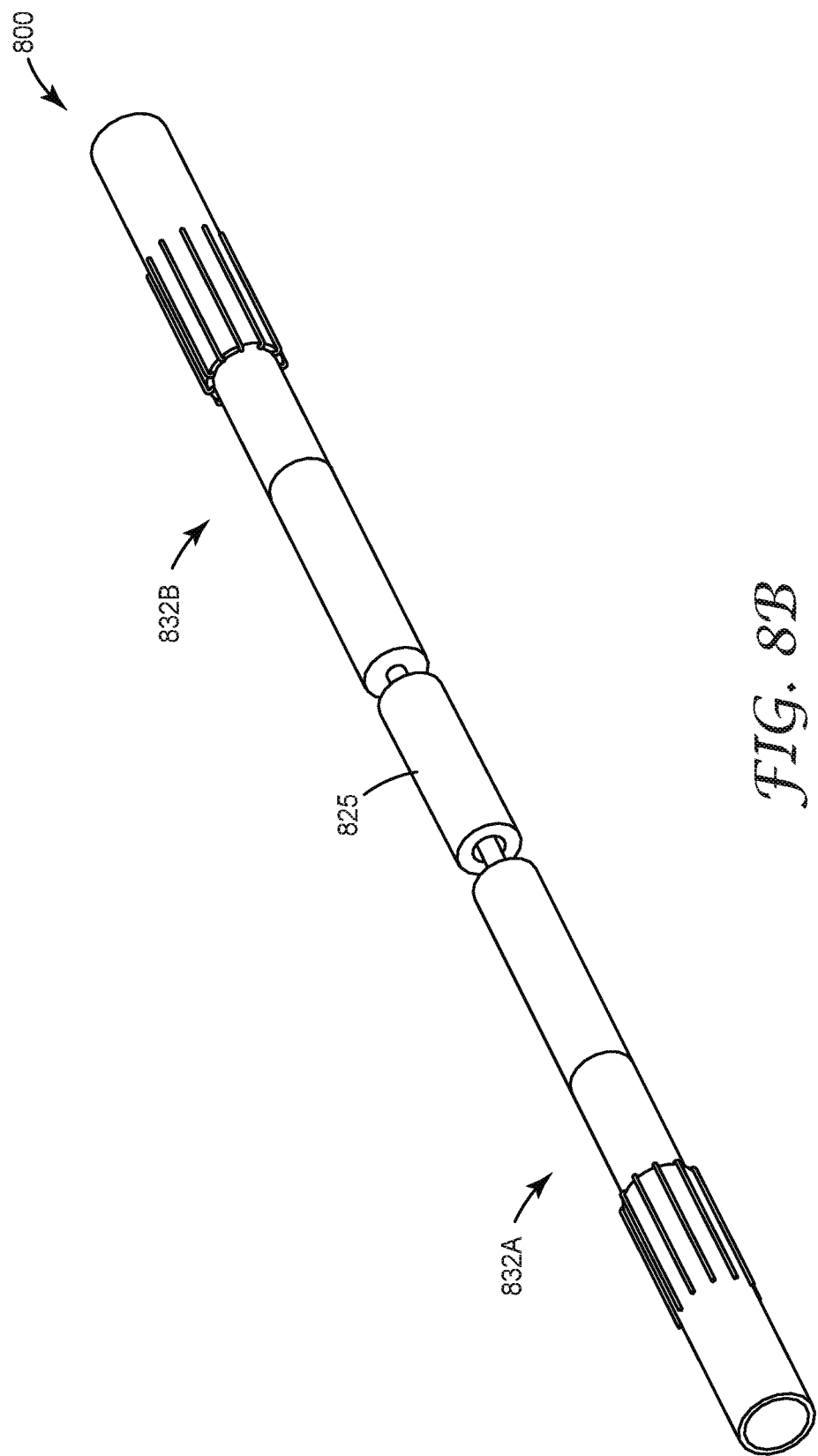
Figure 8G:
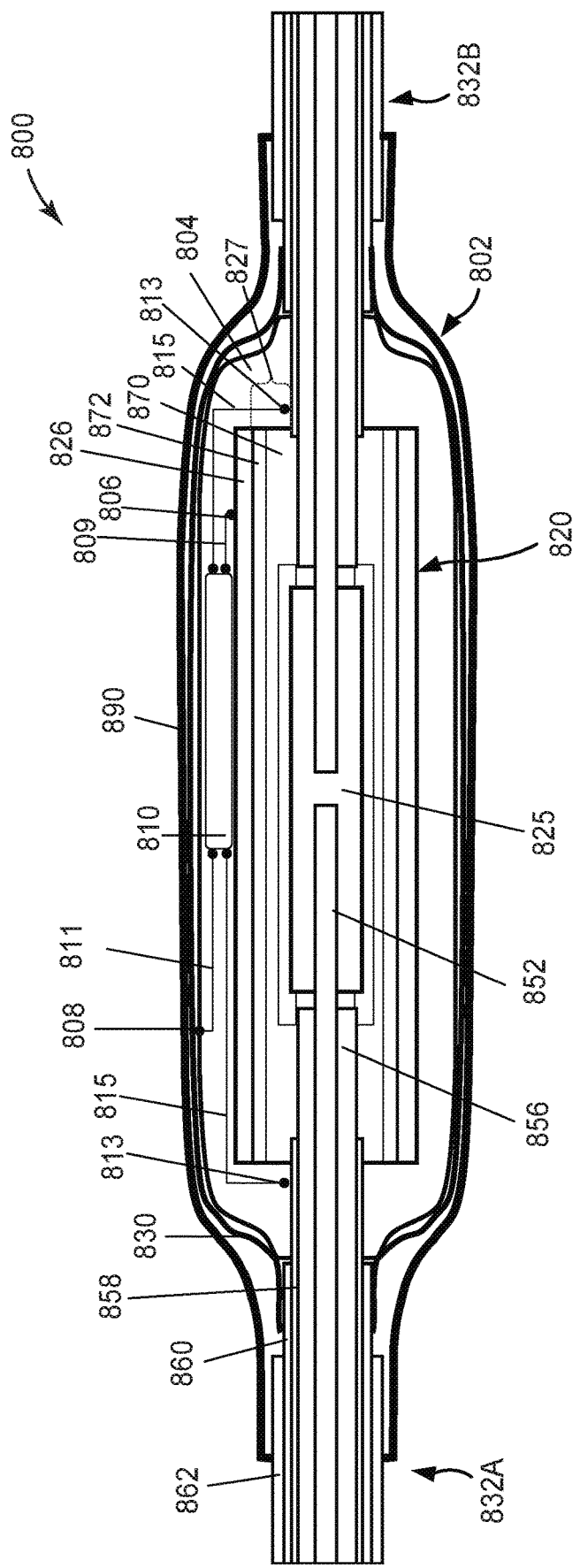

FIG. 8G illustrates a longitudinal cross-sectional view of electrical cable monitoring system 800. In some examples, as illustrated in FIG. 8G, cable accessory 820 includes a plurality of concentric layers, such as connector 825, splice electrode 829, insulator 827 that may include high-K insulator 870 and splice insulator 872, and low side electrode 826. In some examples, electrical cable monitoring system 800 may include a jacket 890. Jacket 890 may be a plastic or rubber polymer, such as ethylene propylene diene monomer rubber, ethylene propylene rubber, polyvinyl chloride or polyethylene.

Using support structure 802 enables a single component to be attached to an electrical cable, a cable splice, or a cable termination to monitor a condition of the electrical cable or a cable accessory proximate to the support structure or may be used to monitor the health of nearby electrical equipment. For example, during a cable accessory installation or removal, using support structure 802 simplifies installation or removal, reduce installation or removal errors, improves device function, and increase device longevity. Placing support structure 802 over cable accessory 820 creates electrical contacts via first electrodes 806 and second electrode 808 to enable monitoring device 810 to, for example, interact with electrical cable 832 (e.g., communication, sensing, power harvesting and other interactions), electrically couple to low side electrode 826, and results in a controllable capacitance between conductive ground layer 830 and low side electrode 826, creates a support for the remaining components like jacket 890 for enhanced environmental protection, and provides a durable and robust housing to mechanically protect cable accessory 820 and electrical cables 832 from external stresses when in use (e.g., buried in soil).

In operation, monitoring device 810 may include the functionality of monitoring devices 33 of FIG. 1 and 300 of FIG. 3. Monitoring device 810 may determine the health of cable accessory 820. In some examples, monitoring device 810 determines the health of cable accessory 820 based on event data, such as the sensor data generated by sensors, device data, manufacturing data, installation data, or a combination therein. Monitoring device 810 may determine the health of cable accessory 820 by applying one or more models to the event data, for example, to predict whether the cable accessory 820 will fail within a predetermined amount of time. Responsive to determining the health of cable accessory 820, monitoring device 810 may output data indicative of the health of cable accessory 820, such as all or a portion of the sensor data, a summary of the sensor data, analysis results based on the sensor data, or a combination therein. In some examples, monitoring device 810 outputs the data to EEMS 6 of FIGS. 1-2 using wired communication techniques (e.g., power line communication) and/or wireless communication techniques (e.g., LTE, Bluetooth®, WiFi®). According to some examples, monitoring device 810 may output event data without determining a health of cable accessory 820. For instance, monitoring device 810 may output event data to gateway 28 and/or EEMS 6 and EEMS 6 and/or gateway 28 may determine the health of cable accessory 820 based on the event data.

Figure 9A:
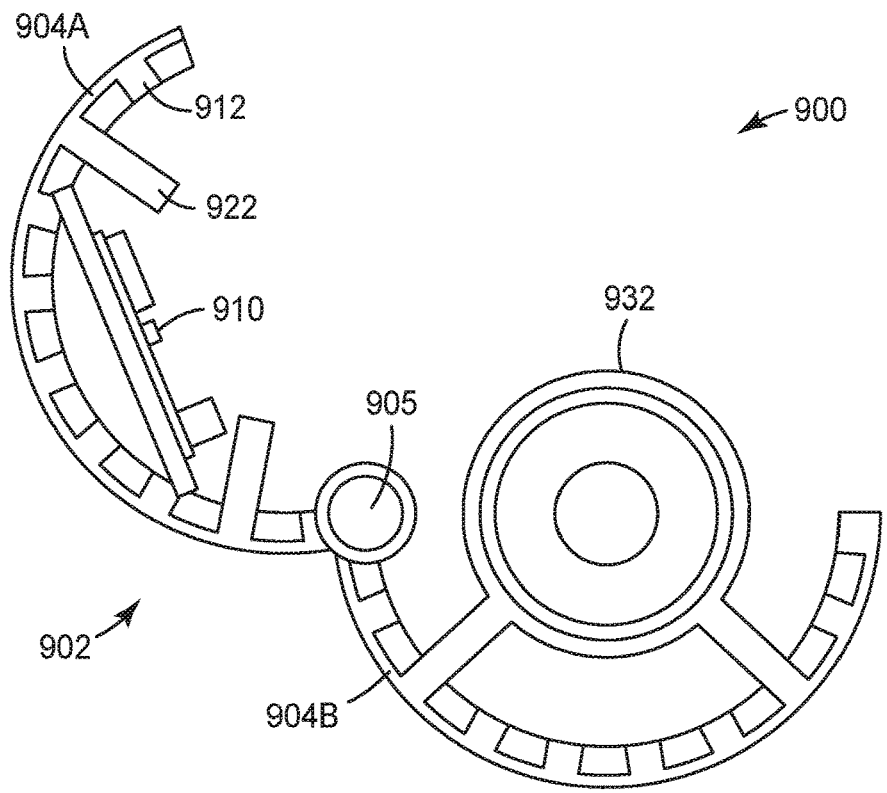
FIGS. 9A and 9B illustrate cross-sectional views of an example electrical cable monitoring system including a clamshell configuration of a support structure.
Figure 9B:
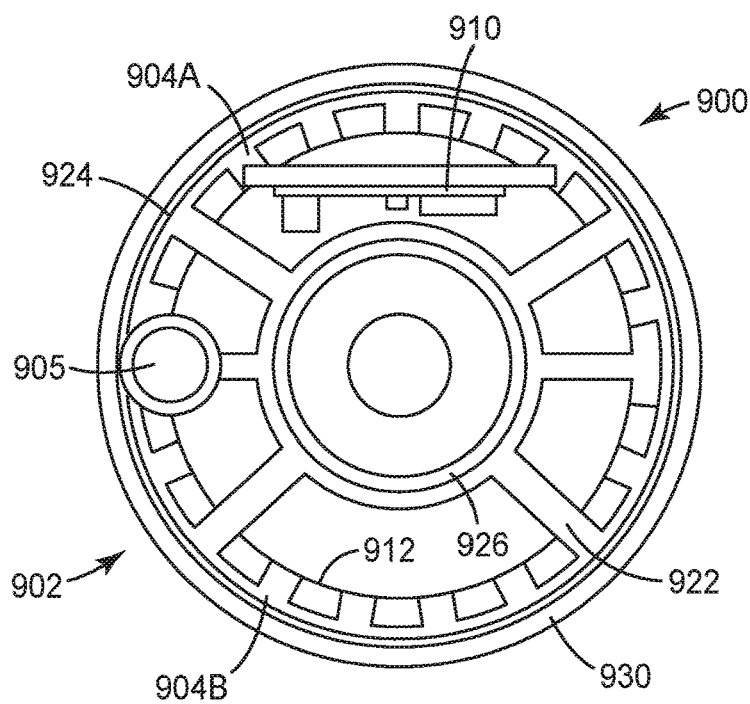

As discussed above, a body of a support structure may include one or more segments defining any suitable configuration to surround at least a portion of electrical cable. FIGS. 9A and 9B illustrate cross-sectional views of an example electrical cable monitoring system 900 including a clamshell configuration of support structure 902, e.g., as discussed above in reference to FIG. 8D. Electrical cable monitoring system 900 may be the same as or substantially similar to electrical cable monitoring system 800 discussed above in reference to FIGS. 8A-8G, except for the differences described herein. Clamshell configuration 900 may include two horizontal body segments 904A and 904B (collectively, body 904) joined by hinge 905. Hinge 905 may include any suitable hinge structure, such as butt hinge or a thin and/or flexible region of material. Body 904 defines an interior surface 912 having a plurality of ribs 922 configured to support, house, and protect monitoring device 910 and electrical cable 932. As illustrated in FIG. 9A, an open configuration of support structure 902 allows for body 904B to surround at least a portion of electrical cable 932. As illustrated in FIG. 9B, a closed configuration of support structure 902 fully surrounds the circumference of electrical cable 932. In this way, clamshell configuration 900 may enable support structure 902 to support, house, and/or protect a cable accessory and/or electrical cable 932.

In some examples, exterior surface 924 of body 904 in the closed configuration of support structure 902, may support a conductive ground layer 930 that is electrically coupled to a shielding layer of electrical cables 932. The configuration of support structure 902, including, for example, the materials and geometry of support structure 902, may create a capacitance between conductive ground layer 930 and low side electrode 926 in response to a current flow in electrical cables 932, which may be detected by monitoring device 910. In this way, clamshell configuration 900 may enable support structure 902 to support, house, and/or protect monitoring device 910, and enable monitoring device 910 to monitor a condition of the cable accessory and/or electrical cable 932.

Figure 10A:
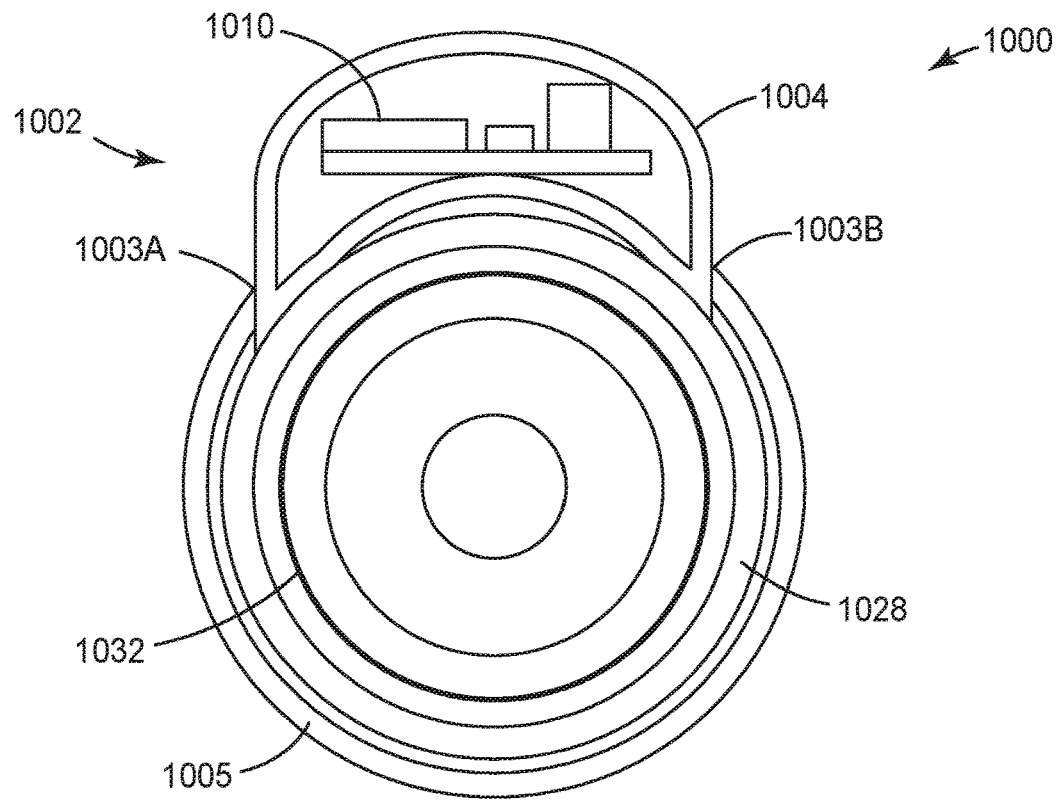
FIGS. 10A-10D illustrate cross-sectional views and side views of an example electrical cable monitoring system including a partial circumferential surround configuration of a support structure.
Figure 10B:
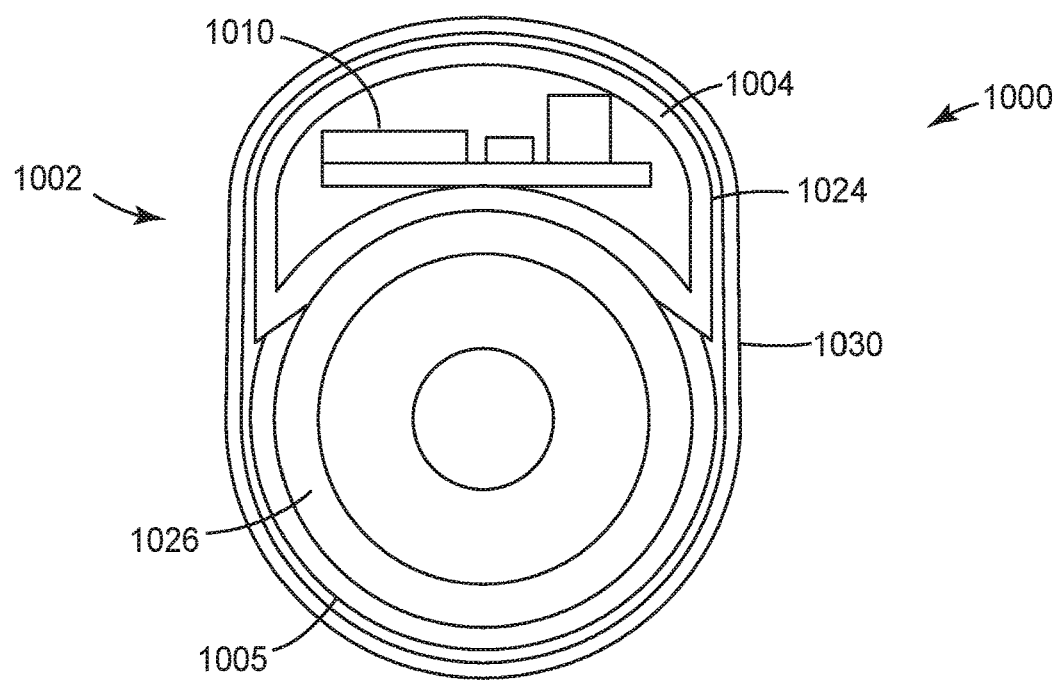
Figure 10C:
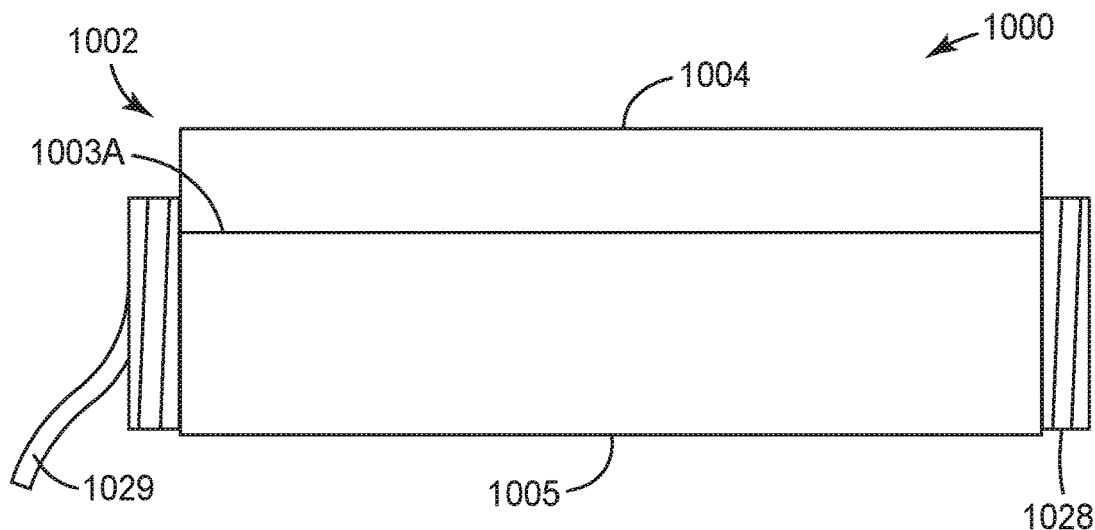

FIGS. 10A-10D illustrate an example electrical cable monitoring system 1000 including a partial circumferential surround configuration of support structure 1002. Electrical cable monitoring system 1000 may be the same as or substantially similar to electrical cable monitoring system 800 discussed above in reference to FIGS. 8A-8G, except for the differences described herein. Support structure 1002 may include body 1004 configured to surround a first portion of the circumference of electrical cable 1032 and connection band 1005 configured to surround a second portion of the circumference of the electrical cable 1032. In some examples, the first portion of the circumference of electrical cable 1032 and the second portion of the circumference of electrical cable 1032 may include the entire circumference of electrical cable 1032. In other examples, connection band 1005 may extend around the entire circumference of electrical cable 1032 and body 1004 may be disposed on (e.g., adhered, mechanically fastened, or integrally formed with) a portion of connection band 1005. In some examples, support structure 1002 may include one or more connections, e.g., mechanical connections 1003A and 1003B. Mechanical connections 1003A and 1003B may be configured to enable support structure 1002 to be installed on a cable accessory and/or electrical cable without a break in the cable, e.g., similar to installation of clamshell configuration 900 discussed above in reference to FIGS. 9A and 9B. As illustrated in FIG. 10A, an open configuration of support structure 1002 may include a removable core structure 1028. Removeable core structure 1028 may enable support structure 1002 to be installed by cold shrink technique. For example, removable core structure 1028 may include any suitable structure configured to hold connection band 1005 in an open configuration. Connection band 1005 may include a rigid material or an elastomeric material. The open configuration of connection band 1005 may include a deformed (e.g., stretched) configuration (e.g., relative to an undeformed configuration). Removable core structure 1028 may include a coil body having a rigidity sufficient to retain connection band 1005 in the deformed configuration. Removable core structure 1028 may be removed, for example, by pulling a tail-end 1029 to uncoil the coil body, as shown in FIG. 10C. As the coil body is uncoiled, the connection band 1005 may return to an undeformed configuration, e.g., a closed configuration. As illustrated in FIG. 10B, connection band 1005 may form a friction fit with electrical cable 1032 and urge body 1004, including monitoring device 1010, toward electrical cable 1032. In this way, partial circumferential surround configuration 1000 may enable support structure 1002 to support, house, and/or protect a cable accessory and/or electrical cable 1032.

In some examples, the closed configuration of support structure 1002, e.g., exterior surface 1024 of body 1004 and connection band 1005, may support a conductive ground layer 1030. The configuration of support structure 1002, including, for example, the materials and geometry of support structure 1002, may create a capacitance between conductive ground layer 1030 and low side electrode 1026 in response to a current flow in electrical cable 1032, which may be detected by monitoring device 1010. In this way, partial circumferential surround configuration 1000 may enable support structure 1002 to support, house, and/or protect monitoring device 1010 and enable monitoring device 1010 to monitor a condition of the cable accessory and/or electrical cable 1032.

Figure 10D:
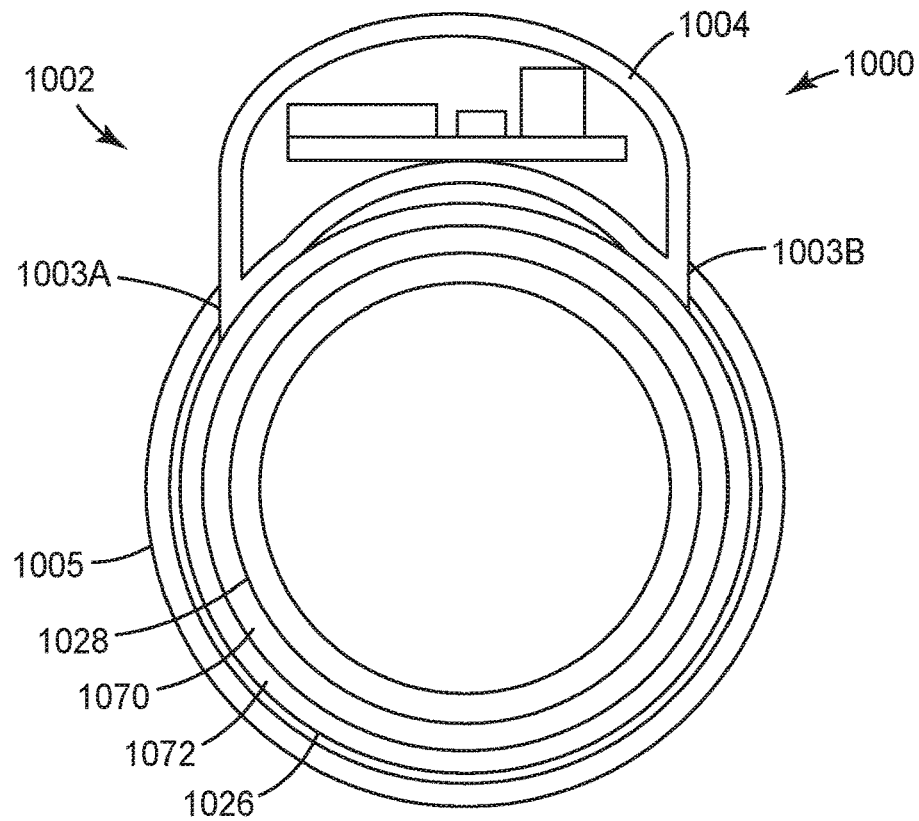

In some examples, as illustrated in FIG. 10D, support structure 1002 may include at least a portion of a cable accessory, such as high-K insulator 1070, splice insulator 1072, and low side electrode 1026. For example, removable core structure 1028 may be configured to hold high-K insulator 1070, splice insulator 1072, low side electrode 1026, and connection band 1005 in an open configuration. In this way, support structure 1002 including at least a portion of a cable accessory held in an open configuration by a removable support structure 1028 may be installed on electrical cable 1032 in a single step. Then, removable support structure 1028 may be removed to attach support structure 1002 to electrical cable 1032, such as over a splice joint. In this way, installation time and/or error may be reduced.

Figure 11A:
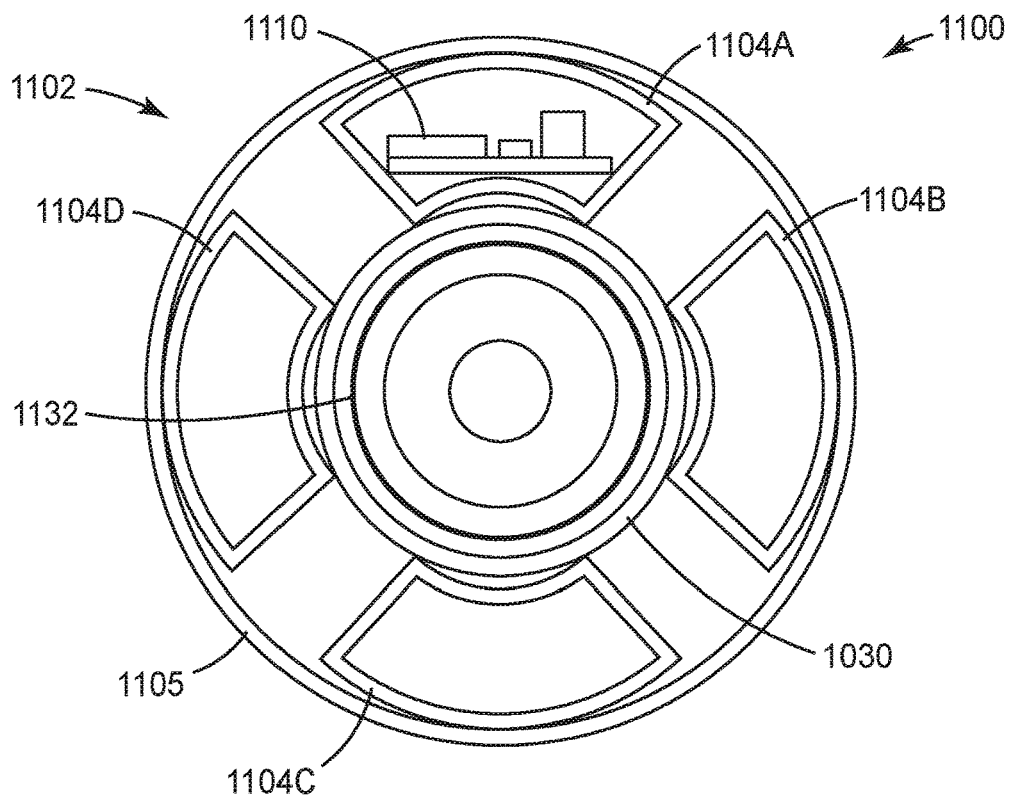
FIGS. 11A and 11B illustrate cross sectional view of an example electrical cable monitoring system including a multi-segmented configuration of a support structure.
Figure 11B:
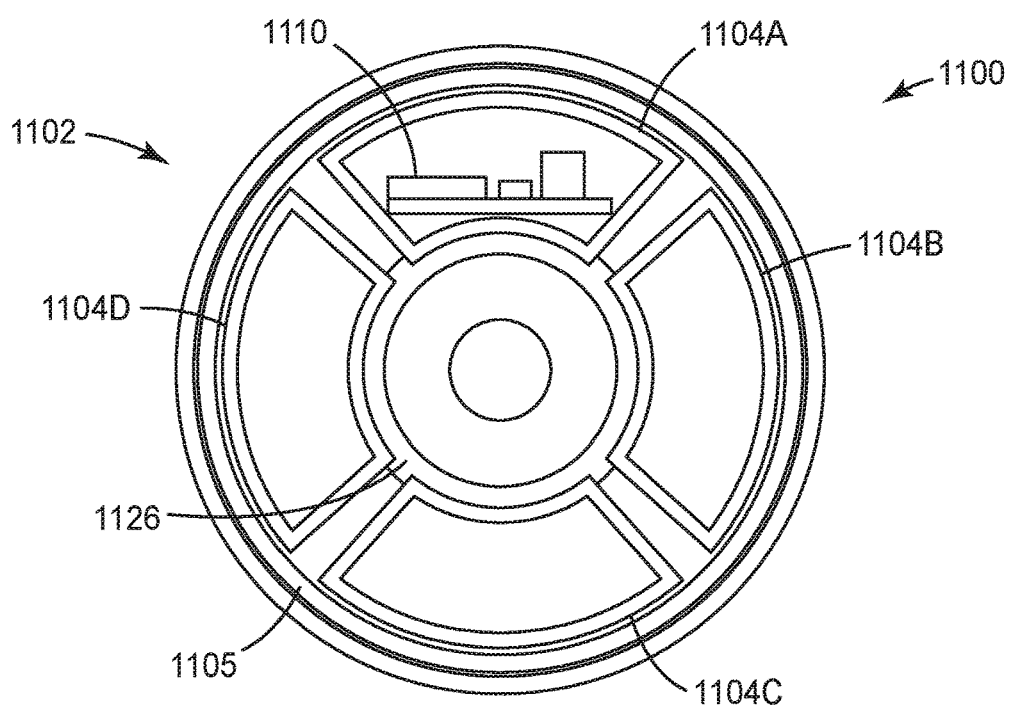

FIGS. 11A and 11B illustrate cross sectional view of an example electrical cable monitoring system 1100 including a multi-segmented configuration of support structure 1102. Electrical cable monitoring system 1100 may be the same as or substantially similar to support electrical cable monitoring system 800 discussed above in reference to FIGS. 8A-8G, except for the differences described herein. Support structure 1102 may include first, second, third, and fourth body segments 1104A-1104D, respectively, each respective body segment 1104A-1104D, configured to surround a respective portion of the circumference of electrical cable 1132. In some examples, support structure 1002 may include one or more connections, e.g., mechanical connections, configured to enable support structure 1102 to be installed on a cable accessory and/or electrical cable without a break in the cable. Support structure 1102 also include connection band 1105. Connection band 1105 may be the same as or substantially similar to connection band 1005 describe above in reference to FIGS. 10A-10D. As illustrated in FIG. 11A, an open configuration of support structure 1102 may include a removable core structure 1128. Removable core structure 1128 may be the same as or substantially similar to removable core structure 1028 discussed above in reference to FIGS. 10A-10D. As illustrated in FIG. 11B, body 1004 may form a friction fit with electrical cable 1132 and urge first body segment 1004A, including monitoring device 1110, toward electrical cable 1132. In this way, multi-segmented configuration 1100 may enable support structure 1102 to support, house, and/or protect a cable accessory and/or electrical cable 1132.

In some examples, an exterior surface of connection band 1105 in the closed configuration of support structure 1102 may support a conductive ground layer 1130. The configuration of support structure 1102, including, for example, the materials and geometry of support structure 1102, may create a controlled capacitance between conductive ground layer 1130 and low side electrode 1126 in response to a current flow in electrical cable 1132, which may be detected by monitoring device 1110. In this way, multi-segmented configuration 1100 may enable monitoring device 1110 to monitor a condition of the cable accessory and/or electrical cable 1132.

In other examples, a body of a support structure may define other configurations configured to be installed as a single component over a cable accessory or an electrical cable. For example, a body may define any number of segments, include a heat shrink material, include mechanical fasteners between segments, or the like, to facilitate attachment of the support body to the cable accessory or the electrical cable.

To enable a monitoring device to monitor a condition of a cable accessory and/or an electrical cable, a support structure may be configured to support, house, and/or protect one or more electrodes. FIGS. 12A-14 illustrate example support structures including electrodes configured to physically contact and electrically couple to a cable accessory and/or an electrical cable when the support structures are in a closed configuration. FIGS. 12A and 12B illustrate cross-sectional views of support structure 802 illustrated in FIGS. 8E and 8F. Support structure 802 includes first electrodes 806A, 806B, 806I, and 806J (collectively, first electrodes 806) configured physically contact and electrically couple to cable accessory 820 (e.g., connector 825 and/or low side electrode 826) when support structure 802 is in a closed configuration. In the example of FIGS. 12, first electrodes 806 are shaped as cantilevers. The cantilevered shape of first electrodes 806 enables closing forces 1202 and 1204 applied to exterior surface 824 of bodies 804A and 804B to result in contact between first electrodes 806 and low side electrode 826. For example, closing forces 1202 and 1204 may cause first electrodes 806 to deflect when first electrodes 806 contact low side electrode 826 such that first electrodes 806 are in a deformed state when support structure 802 is in a closed configuration. The deformed state may enable first electrodes 806 to maintain contact with low side electrode 826 over time.

In some examples, as illustrated in FIG. 12B, bodies 804A and 804B make contact at contact points 1206 and 1208 on support structure 802. By contacting at contact points 1206 and 1208, body 804 may not directly contact cable accessory 820. For example, only the electrodes (e.g., first electrodes 806) may contact cable accessory 820. In this way, support structure 802 supports an external force, such as compressive loading, on exterior 824, rather than transferring the external force to cable accessory 820. Preventing the transfer of force to cable accessory 820 may increase the useable life of cable accessory 820.

Figure 13:
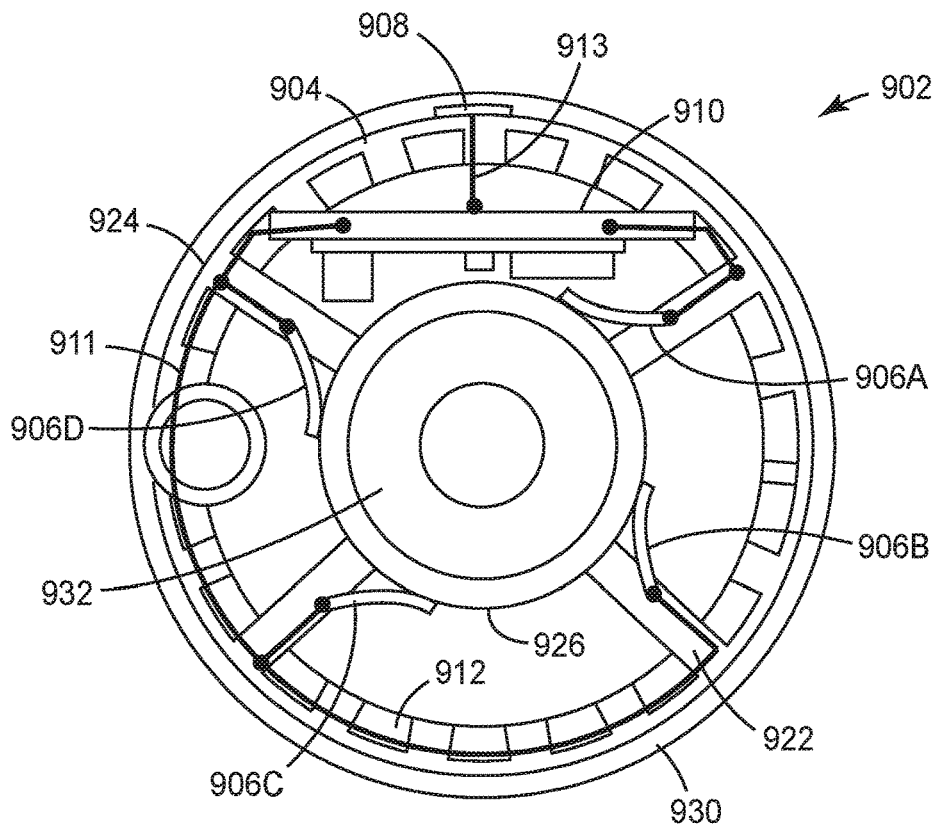
FIG. 13 illustrates a cross sectional view of the example support structure illustrated in FIG. 9B.

FIG. 13 illustrates a cross sectional view of support structure 902 illustrated in FIG. 9B. Support structure 902 includes first electrodes 906A, 906B, 906C, and 906D (collectively, first electrodes 906) configured physically contact and electrically couple to electrical cable 932 (e.g., low side electrode 926) when support structure 902 is in a closed configuration, and second electrode 908 configured to physically contact and electrically coupled to conductive ground layer 930 when conductive ground layer is disposed over exterior surface 924 of body 904. First electrodes 906 are shaped as springs attached to ribs 922 of interior surface 912 of body 904. The spring configuration of first electrodes 906 enables contact between first electrodes 906 and low side electrode 926. For example, the closed configuration of support structure 902 may cause first electrodes 906 to deflect when first electrodes 906 contact low side electrode 926 such that first electrodes 906 are in a deformed state when support structure 902 is in the closed configuration. The deformed state may enable first electrodes 906 to maintain contact with low side electrode 926 over time.

Similar to the above discussion in reference to FIGS. 8A-8B, first electrodes 906 may be electrically coupled to a conductor 911 and second electrode 908 may be electrical coupled to a conductor 913. Conductors 911 and 913 may be embedded in body 904 or disposed on interior surface 912 or exterior surface 924 of body 904. By electrically coupling each of first electrodes 906A-906D, conductor 911 may increase the contact surface area of first electrodes 906 with low side electrode 926. Additionally, conductors 911 and 913 are electrically coupled to monitoring device 910 to enable monitoring device 910 to monitor a condition of a cable accessory and/or electrical cable 932 by, for example, monitoring a capacitance between low side electrode 926 and conductive ground layer 930 (e.g., shielding layer of electrical cable 932).

Figure 14:
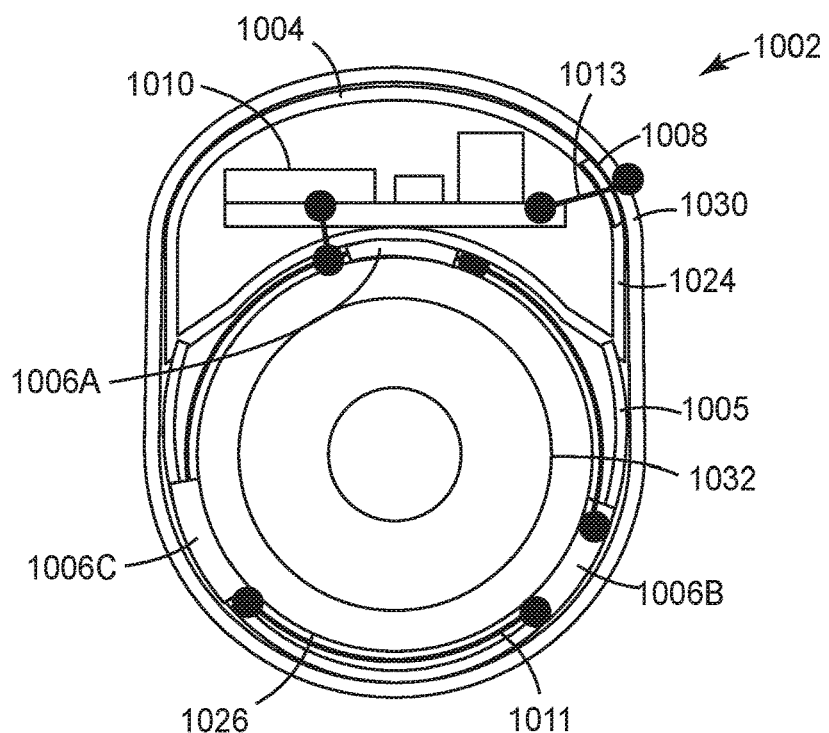
FIG. 14 illustrates a cross sectional view of the example support structure illustrated in FIG. 10B.

FIG. 14 illustrates a cross sectional view of support structure 1002 illustrated in FIG. 10B. Support structure 1002 includes first electrodes 1006A, 1006B, and 1006C (collectively, first electrodes 1006) configured physically contact and electrically couple to electrical cable 1032 (e.g., low side electrode 1026) when support structure 1002 is in a closed configuration, and second electrode 1008 configured to physically contact and electrically coupled to conductive ground layer 1030 when conductive ground layer is disposed over exterior surface 1024 of body 1004. Although shown as three discrete electrodes, in other examples, first electrodes 1006 may include a conductive sheath configured to contact all or nearly all of the circumference and/or all or nearly all of a length of low side electrode 1026. In the closed configuration of support structure 1002, connection band 1005 may urge first electrodes toward electrical cable 1032 (e.g., toward low side electrode 1026). In some examples, support structure 1102 may include a resilient material disposed between connection band and first electrodes 1006. The resilient material may be configured to uniformly or near uniformly transfer a compressive force from connection band 1005 to first electrodes 1006. For example, the resilient material may include an elastomeric material.

First electrodes 1006 may be electrically coupled to a conductor 1011 and second electrode 1008 may be electrical coupled to a conductor 1013. Conductors 1011 and 1013 may be embedded in body 1004 and/or connection band 1005, disposed on interior surface or exterior surface of body 1004, connection band 1005, or both body 1004 and connection band 1005. Conductors 1011 and 1013 are electrically coupled to monitoring device 1010 to enable monitoring device 1010 to monitor a condition of a cable accessory and/or electrical cable 1032 by, for example, monitoring a capacitance between low side electrode 1026 and conductive ground layer 1030 (e.g., shielding layer of electrical cable 1032).

In some examples, a low side electrode may have a relatively lower electrical resistance, such that discrete first electrodes (e.g., a describe in reference to FIGS. 8A-8G) may provide sufficient electrical contact. In other examples, a low side electrode may have a relatively higher electrical resistance, such that a uniform and/or low resistance electrode may be utilized to provide electrical contact. A uniform and the low resistance electrode may include a plurality of electrical contact points with low spacing or a metal mesh. For example, rather than electrodes including conductive pads, first electrodes may include a flexible conductive membrane attached to the support structure. FIGS. 15A-15D illustrate an example support structure 1502 including a flexible conductive membranes 1506A and 1506B (collectively, flexible conductive membranes 1506). Support structure 1502 may be the same as or substantially similar to support structure 802 described in reference to FIGS. 8A-8G, except for the differences described herein.

Flexible conductive membranes 1506 include a plurality of conductive elements 1515 and a flexible membrane 1517. Plurality of conductive elements 1515 may include any suitable conductive material, such as, for example, copper, aluminum, other metals, or conductive polymers. Plurality of conductive elements may include discrete conductive pads, conductive strips, or conductive sheets, any of which may be arranged in any uniform or non-uniform pattern. Flexible member 1517 may include any suitable flexible material configured to retain plurality of conductive elements 1515 and conform to a shape of cable accessory 1520 and/or electrical cable 1532. In some examples, plurality of conductive elements 1515 may be at least partially embedded in or extend through flexible member 1517. In some examples, flexible member may include silicon, rubber, or other dielectric polymers. In other examples, flexible conductive membrane 1506 may include a flexible conductive material, such as, for example, a flexible conductive metal, a conductive polymer, or polymers including conductive particles.

Flexible conductive member 1506 may be configured to at least partially conform to a shape of a cable accessory 1520 and/or electrical cable 1532 in response to a force applied by moving support structure 1502 from an open configuration to a closed configuration. For example, flexible conductive membrane 1506 may be mechanically coupled to body 1504 at two or more locations on body 1504. In some examples, flexible conductive membrane 1506 may be attached by an adhesive or mechanical fastener to an edge of body 1504. For example, flexible conductive membrane 1506A may be mechanically coupled to edges 1518A and 1518B, and flexible conductive membrane 1506B may be mechanically coupled to edges 1518C and 1518D.

Figure 15A:
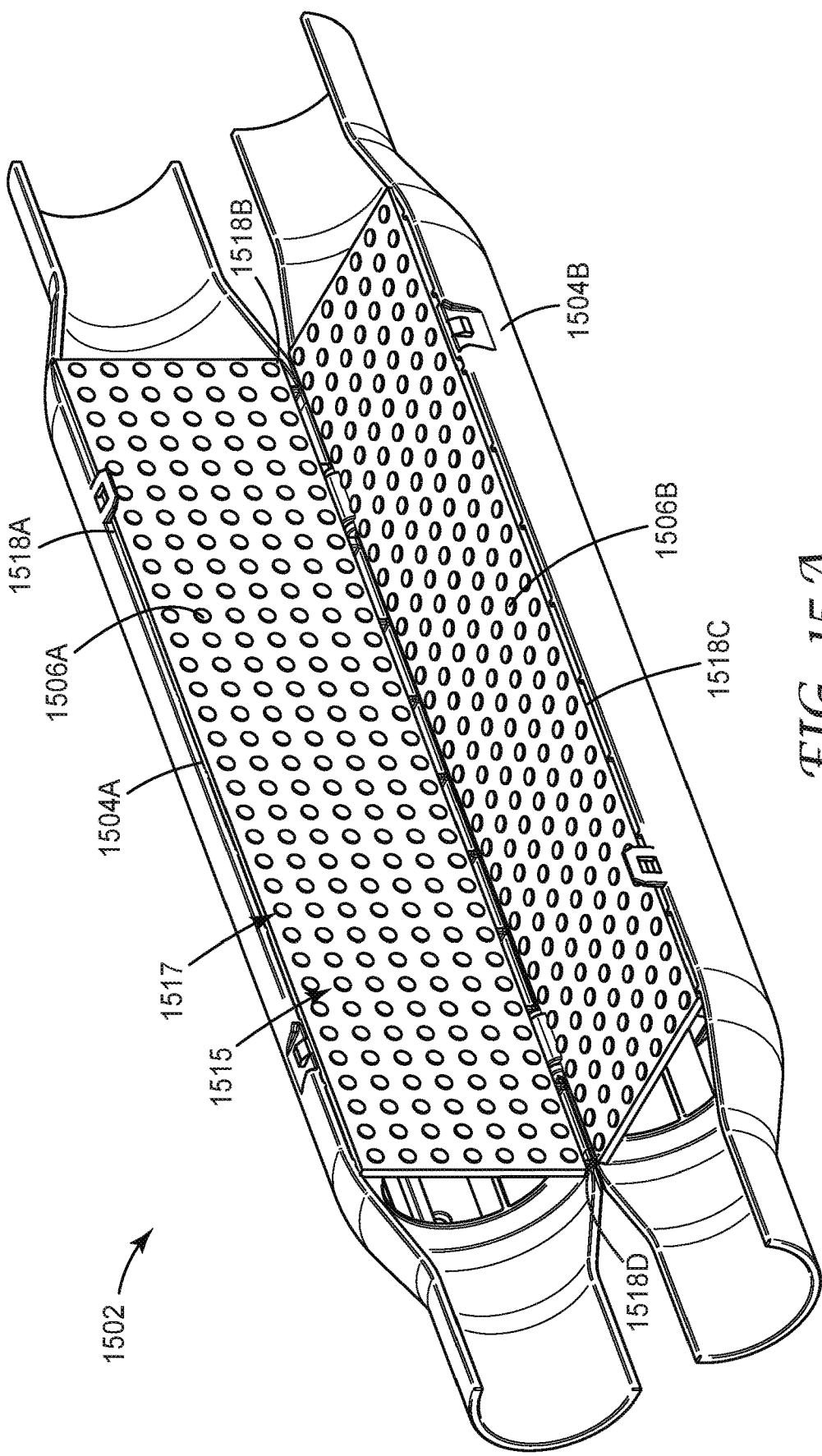
FIGS. 15A-15D illustrate an example support structure including flexible conductive membranes.
Figure 15B:
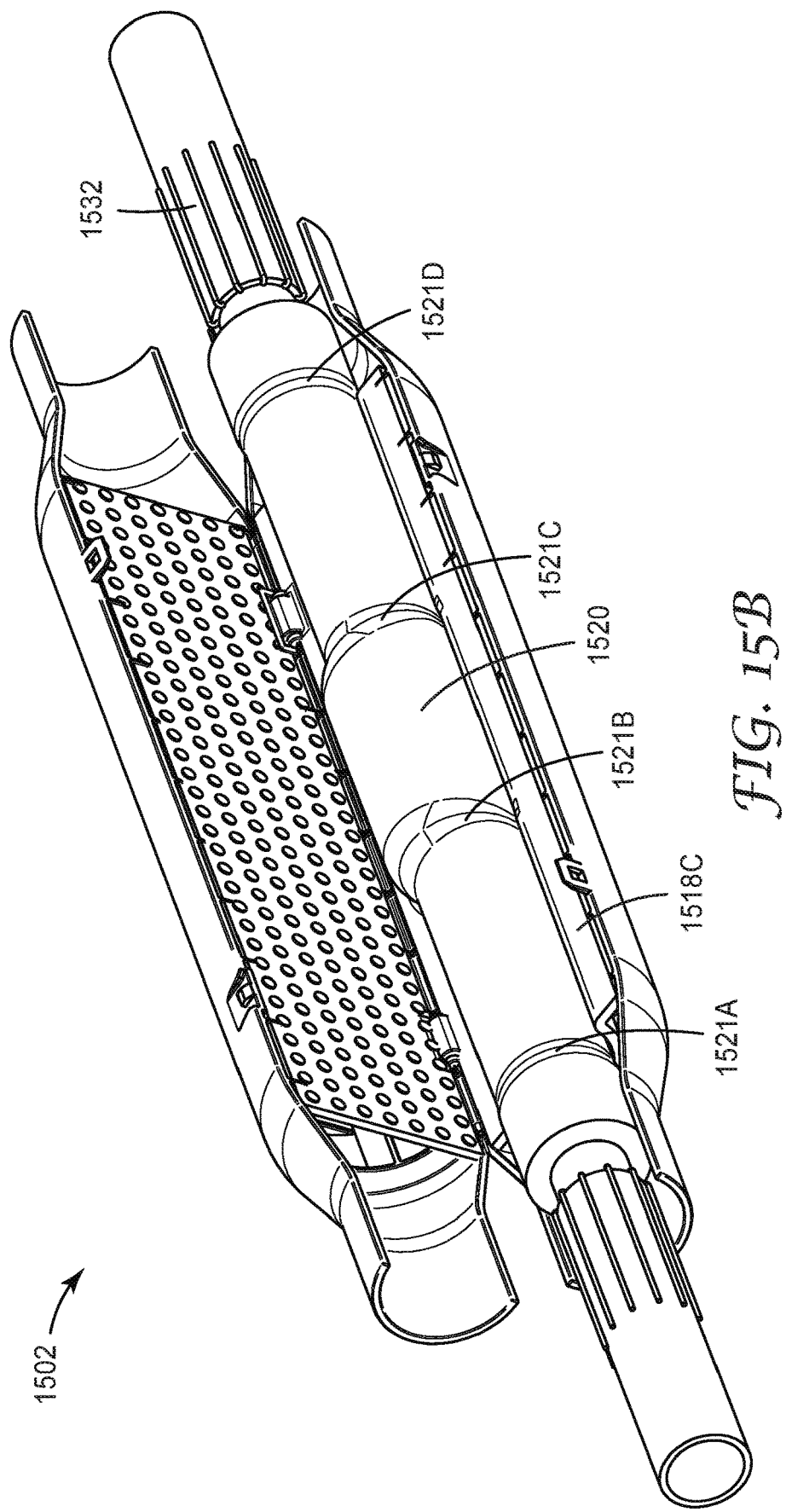
Figure 15C:
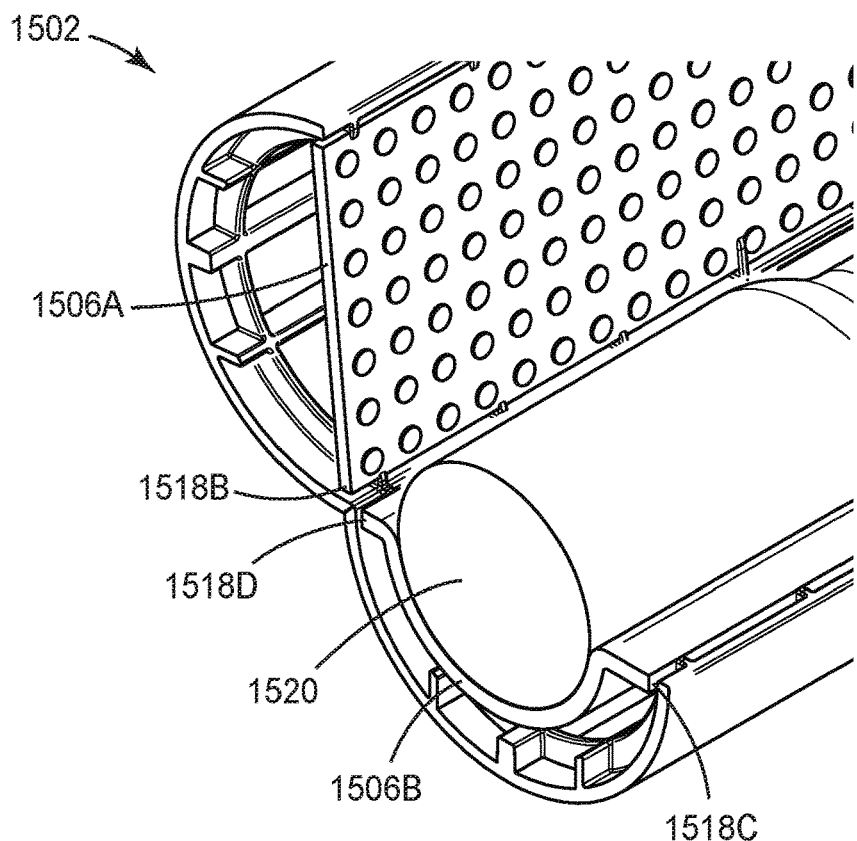
Figure 15D:
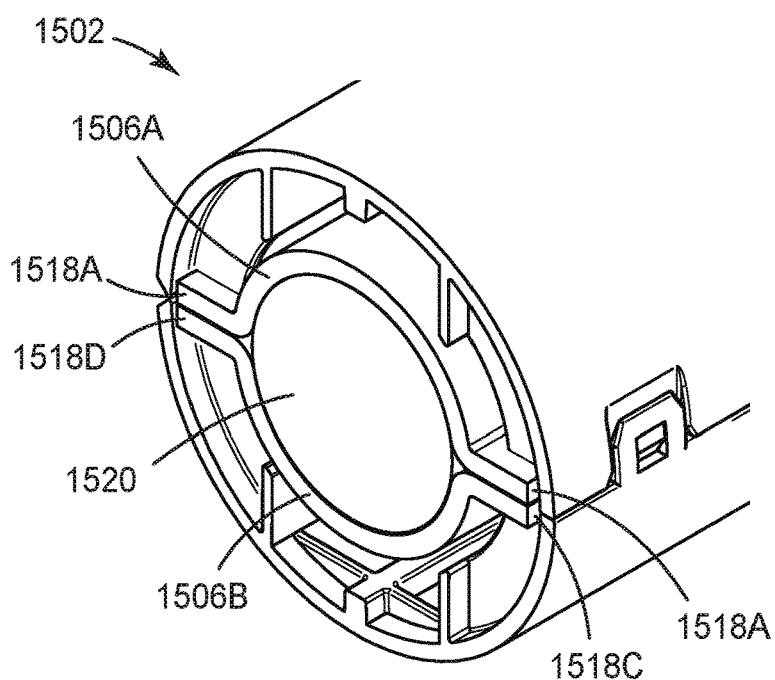

By attaching to edges 1518C and 1518D, flexible conductive element 1506B conforms to cable accessory 1520 when support structure is positioned on cable accessory 1520, as illustrated in FIG. 15B. For example, as illustrated in FIGS. 15B and 15C, flexible conductive membrane 1506B may deform to a shape corresponding to the shape of cable accessory 1520, such as surface contours 1521A-1521D. Similarly, in other examples, flexible conductive membrane 1506B may conform to a shape of electrical cable 1532, e.g., without cable accessory 1520. As illustrated in FIG. 15D, in the closed configuration of support structure 1502, flexible conductive membrane 1506A similar to flexible conductive membrane 1506B. By including a plurality of conductive elements 1515 on flexible membrane 1517, flexible conductive membranes 1506 may enhance electrical contact with cable accessory 1520 and/or electrical cable, which may reduce electrical resistance and/or improve the ability of a monitoring device to monitor a condition of cable accessory 1520 and/or electrical cable.

In other examples, flexible conductive membrane 1506 may include a conductive mesh that, when installed, is configured to at least partially conform to a shape of a cable accessory 1520 and/or electrical cable 1532. In some examples, flexible conductive membrane 1506 may conform to different shapes of a plurality of different cable accessories and/or different shapes of a plurality of different electrical cables. In this way, a single support structure, e.g., support structure 1502, may be used with different shapes of a variety of cable accessories and/or electrical cables.

The support structure, e.g., second electrodes, is electrically coupled to a conductive ground layer that is physically and electrically coupled to, or includes, the shielding layer (e.g., electrical ground) of an electrical cable. For example, as discussed above in reference to FIG. 8F, conductive ground layer 830 may include a wire mesh. In other examples, a bundle of ground wires may physically and electrically bridge a cable accessory or a portion of an electrical cable, and the bundle of ground wires connected to a monitoring device of a cable condition monitoring device. FIGS. 16A-16D illustrate an electrical cable monitoring system 1600 including a support structure 1602 and conductive ground layer 1630 that physically and electrically bridge a cable accessory 1620. Electrical cable monitoring system 1600 may be the same as or substantially similar to electrical cable monitoring system 800 discussed above in reference to FIGS. 8A-8G, except for the differences described herein. For example, electrical cable monitoring system 1600 may include support structure 1602 configured to surround cable accessory 1620 that includes a connector 1625 and low side electrode 1626 configured to join a first electrical cable 1632A and a second electrical cable 1632B (collectively, electrical cables 1632). Rather than a wire mesh, conductive ground layer 1630 includes a plurality of ground wires. The plurality of ground wires of conductive ground layer 1630 is physically and electrically coupled to a shielding layer of electrical cables 1632 by connectors 1631A and 1631B (collectively, connectors 1631). In some examples, connectors 1631 may include crimp connectors.

Figure 16A:
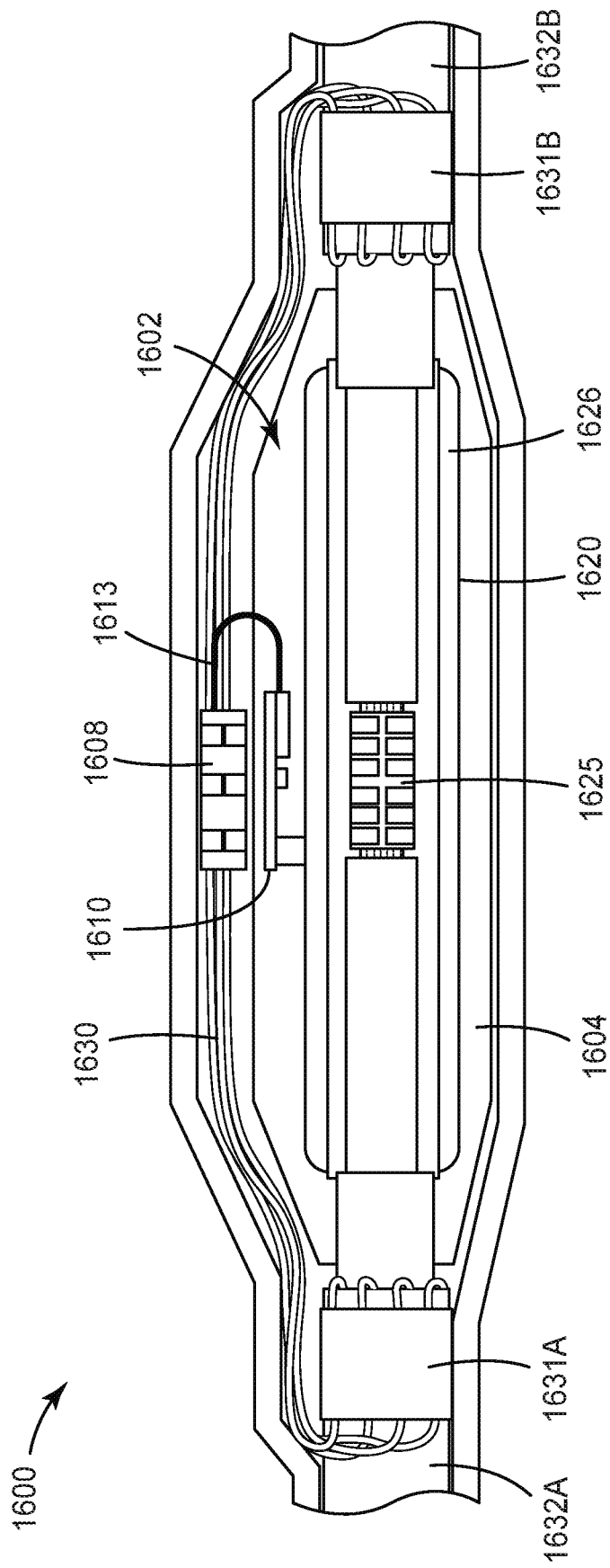
FIGS. 16A-16D illustrate an example electrical cable monitoring system including a support structure and a conductive ground layer that physically and electrically bridge a cable accessory.

In some examples, as illustrated in the longitudinal cross-sectional view of FIG. 16A, the plurality of ground wires of conductive ground layer 1630 may be bundled together. In some examples, the plurality of ground wires of conductive ground layer 1630 may be spaced around an entire circumference of support structure 1602, as illustrated in the axial cross-sectional view of FIG. 16B, or spaced around a portion of the circumference of support structure 1602, as illustrated in the axial cross-sectional view of FIG. 16C.

Figure 16B:
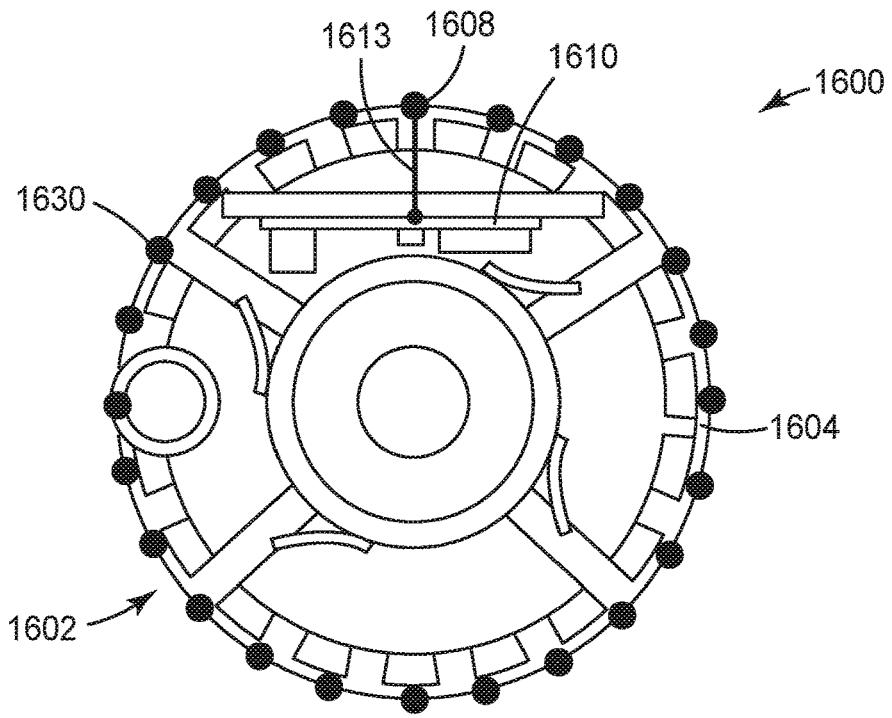
Figure 16C:
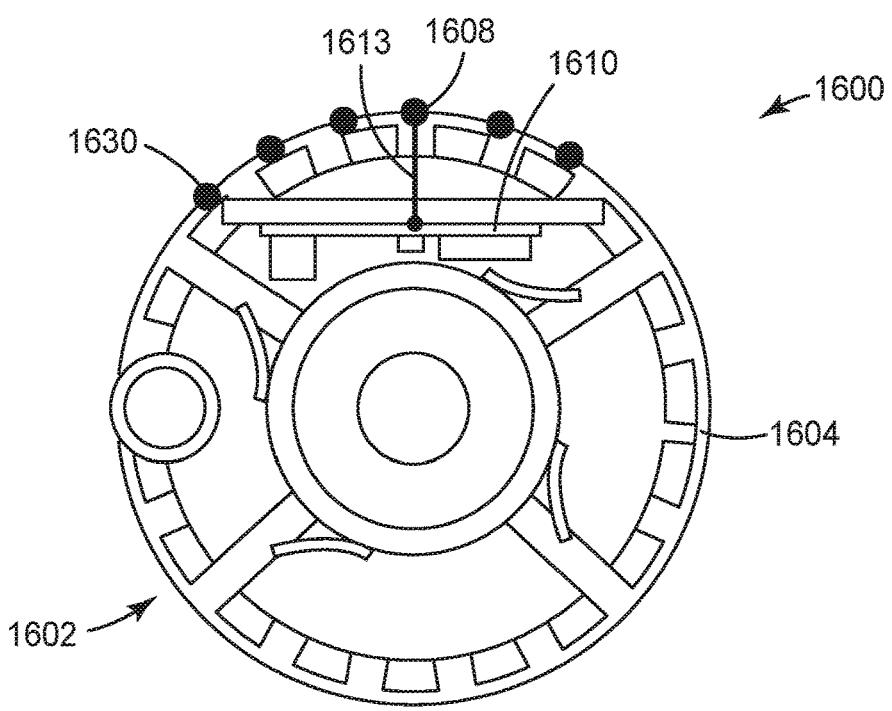
Figure 16D:
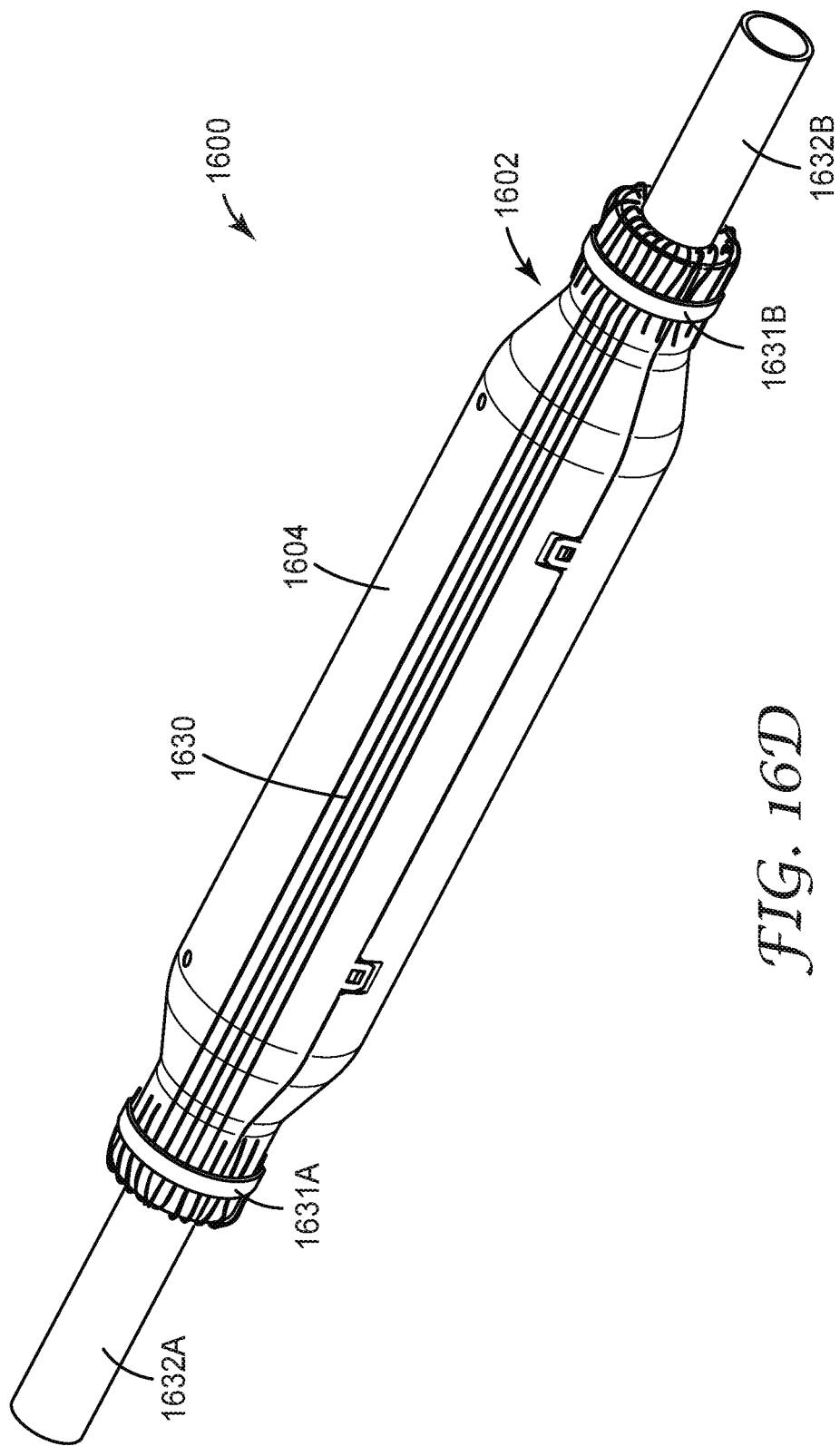

In some examples, as illustrated in FIGS. 16A-16C, the plurality of ground wires of conductive ground layer 1630 may be positioned on an exterior surface 1624 of body 1604 of support structure 1602. In some examples, as illustrated in FIG. 16D, the plurality of ground wires of conductive ground layer 1630 may be embedded in body 1604. In other examples, the plurality of ground wires of conductive ground layer 1630 may be positioned on an interior surface 1612 of body 1604. By selecting the size and the placement of conductive ground layer 1630, the capacitance between low side electrode 1626 and conductive ground layer 1630 may be controlled.

Conductive ground layer 1630 is electrically coupled to a monitoring device 1610 via a second electrode 1608 and a conductor 1613. In this way, conductive ground layer 1630 enables monitoring device 1610 to monitor the capacitance between conductive ground layer 1630 and low side electrode 1626. In some examples, the wire size and wire count of the plurality of ground wires of conductive ground layer 1630 may be selected to carry stray or sort-circuit current across cable accessory 1620 to protect monitoring device 1610.

Figure 17A:
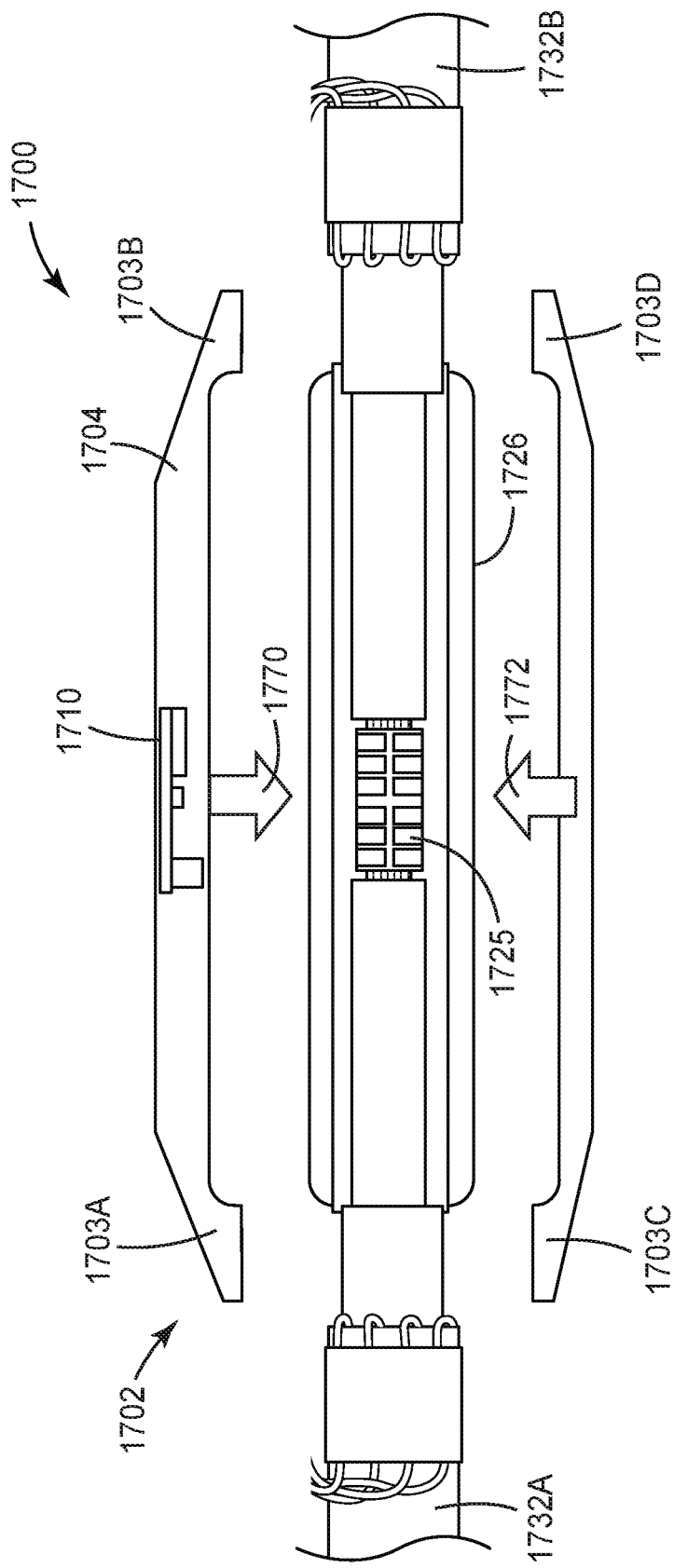
FIGS. 17A and 17B illustrate longitudinal cross-sectional views of an example electrical cable monitoring system including a support structure defining alignment features, in an open configuration and a closed configuration, respectively.
Figure 17B:
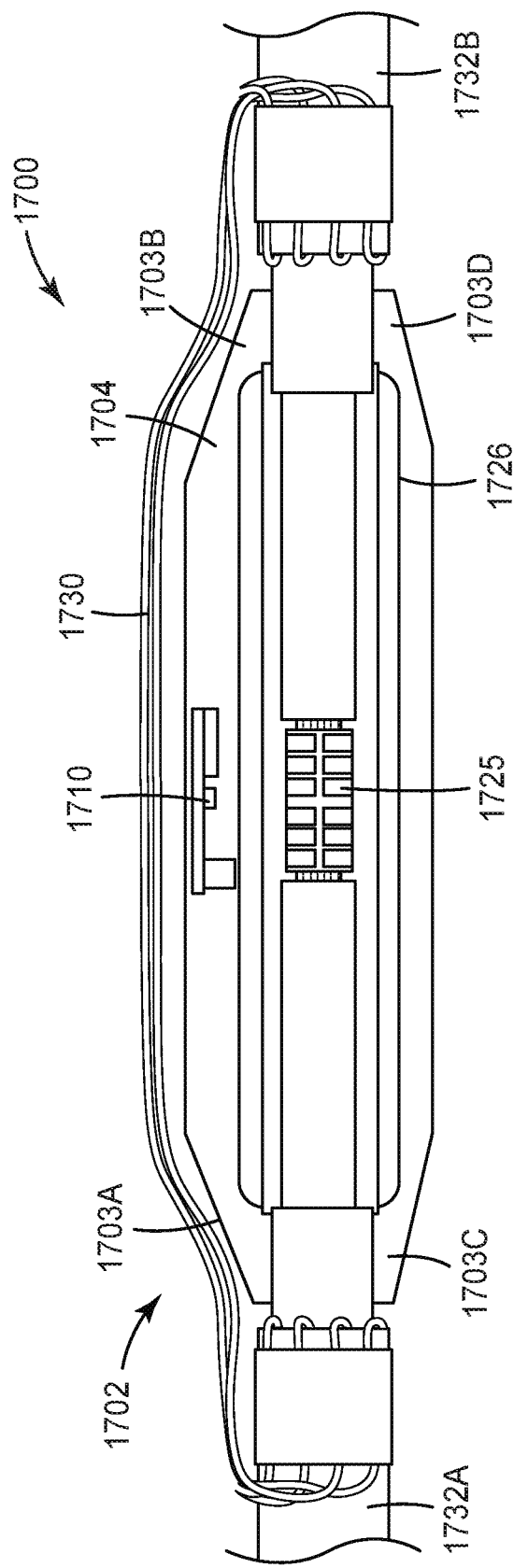

In some examples, a support structure may include alignment features that help an installer better align and install the support structure. FIGS. 17A and 17B illustrate lateral cross-sectional views of an electrical cable monitoring system 1700 including support structure 1702 defining alignment features 1703A-1703D (collectively, alignment features 1703), in an open configuration and a closed configuration, respectively. Electrical cable monitoring system 1700 may be the same as or substantially similar to electrical cable monitoring system 800 discussed above in reference to FIGS. 8A-8G, except for the differences describe herein. For example, electrical cable monitoring system 1700 includes support structure 1702 configured to surround at least a portion of cable accessory 1720 that joins first electrical cable 1732A and second electrical cable 1732B.

Alignment features 1703 are configured to correspond to the contour of the underlying electrical cables 1732 and cable accessory 1720. For example, when in a closed configuration, interior surface 1724 of support structure 1702 at alignment features 1703 may correspond to (e.g., the same as or substantially similar to) a diameter of electrical cables 1732, a diameter of cable accessory 1720, and, in some examples, a transition between the diameter of electrical cables 1732 and the diameter of cable accessory 1720. Alignment features 1703 may be positioned at any desired location along a length of support structure 1702 and correspond to any suitable structure of electrical cable monitoring system 1700, such as connector 1725 or a collar (not shown) on low side electrode 1726. As support structure is moved, as indicated by arrows 1770 and 1772, from an open configuration, as illustrated in FIG. 17A, to a closed configuration, as illustrated in FIG. 17B, alignment features 1703 adjust the longitudinal position of support structure 1702 relative to the length of cable accessory 1720 to properly position support structure 1702 on cable accessory 1720. For example, the proper position of support structure 1702 may include a position of first or second electrodes and/or monitoring device 1710.

Figure 18A:
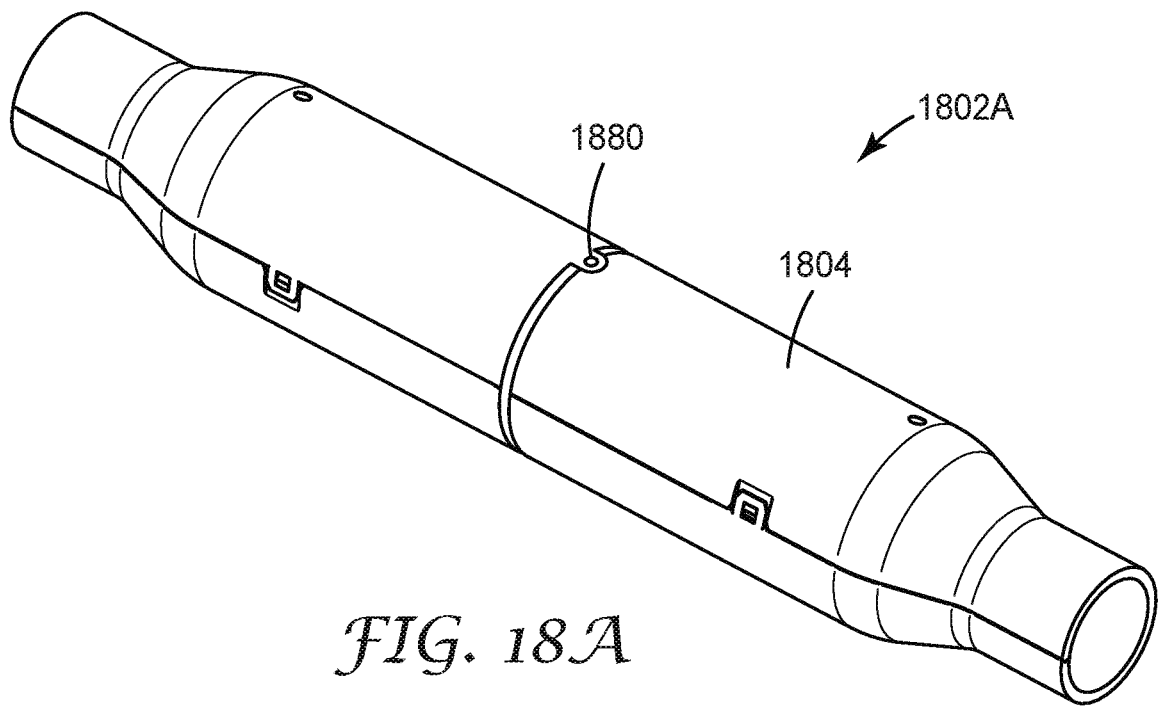
FIGS. 18A-18D illustrate four example support structures with articulating joints.
Figure 18B:
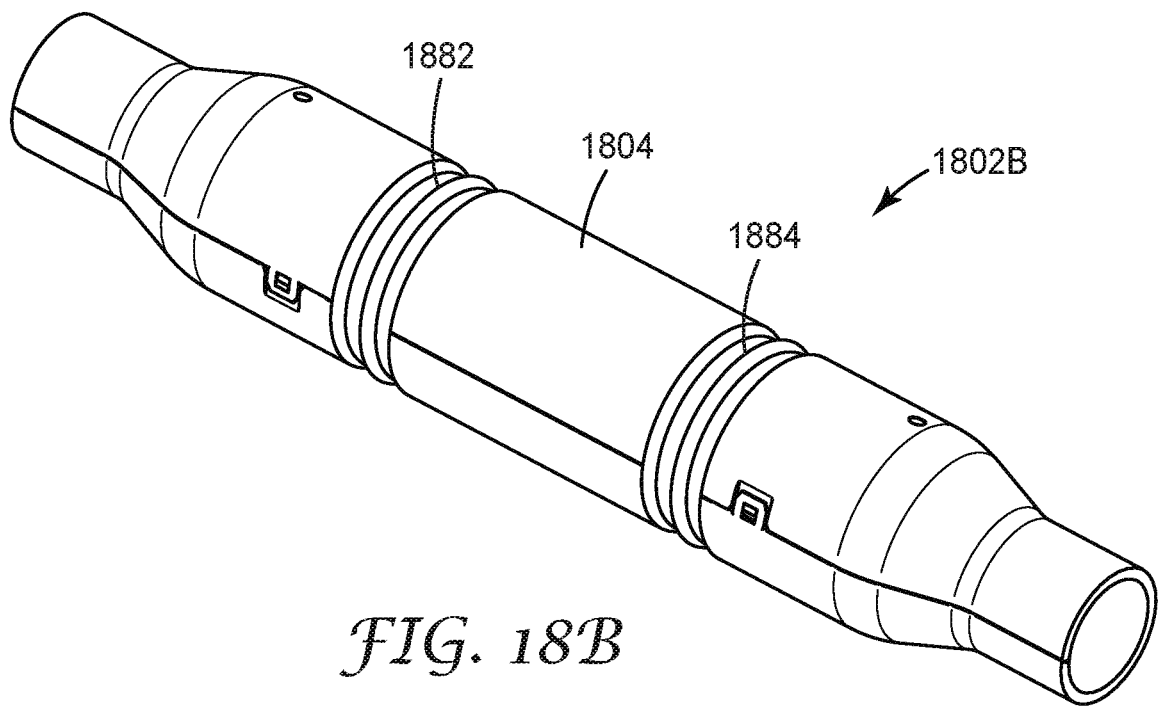
Figure 18C:
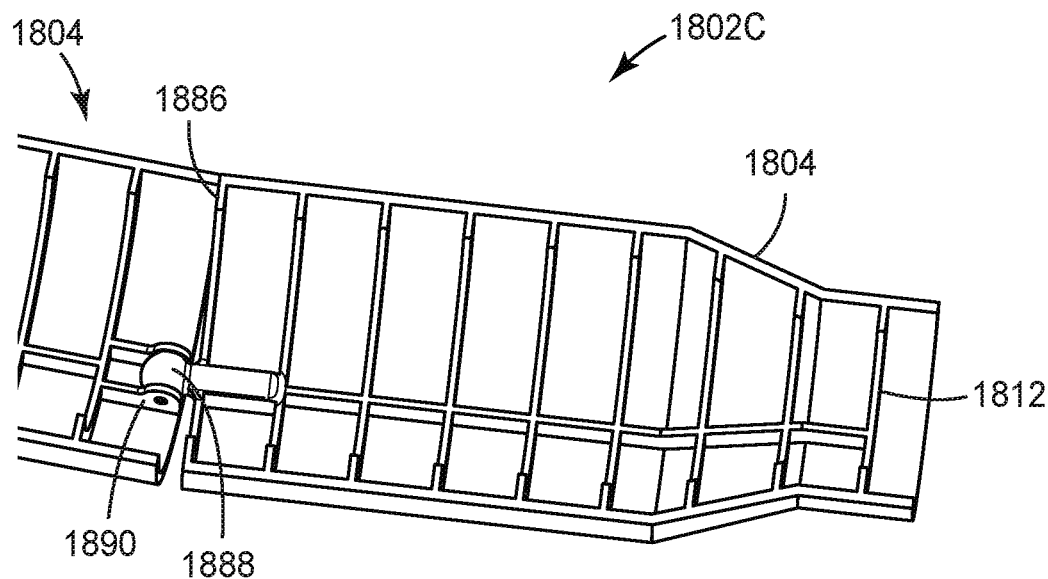
Figure 18D:
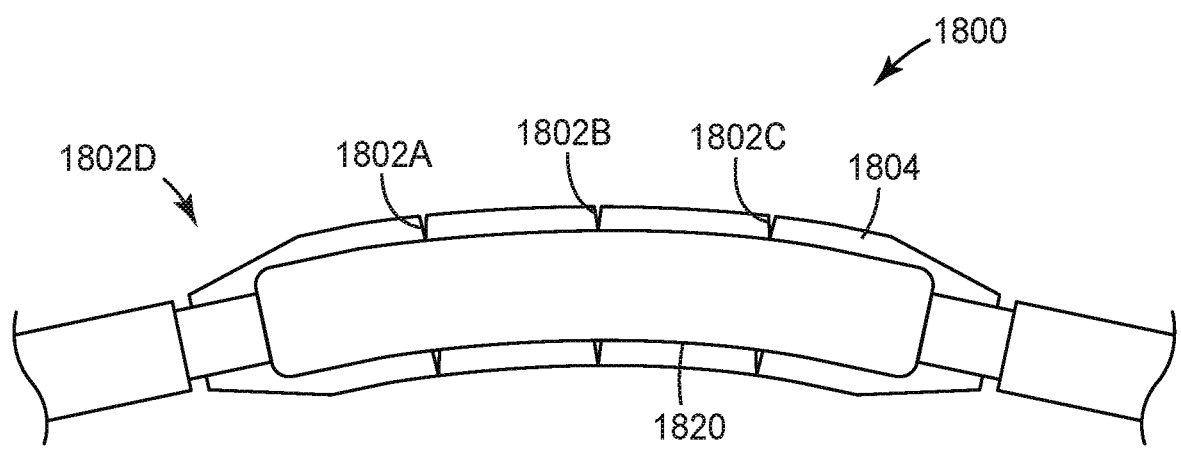

In some examples, a support structure may include one or more joints that enable the support structure to conform to a curvature in an electrical cable or a cable accessory. FIGS. 18A-18D illustrate four variations of support structures 1802A, 1802B, 1802C, and 1802D (collectively, support structures 1802) with joints. As illustrated in FIG. 18A, support structure 1802A includes a joint 1880 disposed on opposite sides of and positioned near a midline of support structure 1802A (e.g., relative to the longitudinal length of support structure 1802A). Joint 1880 may include any suitable type of articulating joint, such as, for example, a hinge defined by body 1804. As illustrated in FIG. 18B, support structure 1802B includes joints 1882 and 1884. Joints 1882 and 1884 include accordion joints having a region of relatively elastic material (e.g., compared to the material of body 1804). Joints 1882 and 1884 include two bellows, each bellows defined by an arcuate deflection of relatively elastic material to enable articulation in any direction. As illustrated in FIG. 18C, support structure 1802C includes a ball and socket joint 1886. Ball and socket joint 1886 includes a portion of interior surface 1812 defining a ball 1888 and a portion of interior surface 1824 of body 1804 defining a socket 1890 configured to receive and engage ball 1888. As illustrated in FIG. 18D, support structure 1802D includes a plurality of joints 1892A, 1892B, and 1892C that enable support structure 1802D to conform to a bend in cable accessory 1820.

Figure 19A:
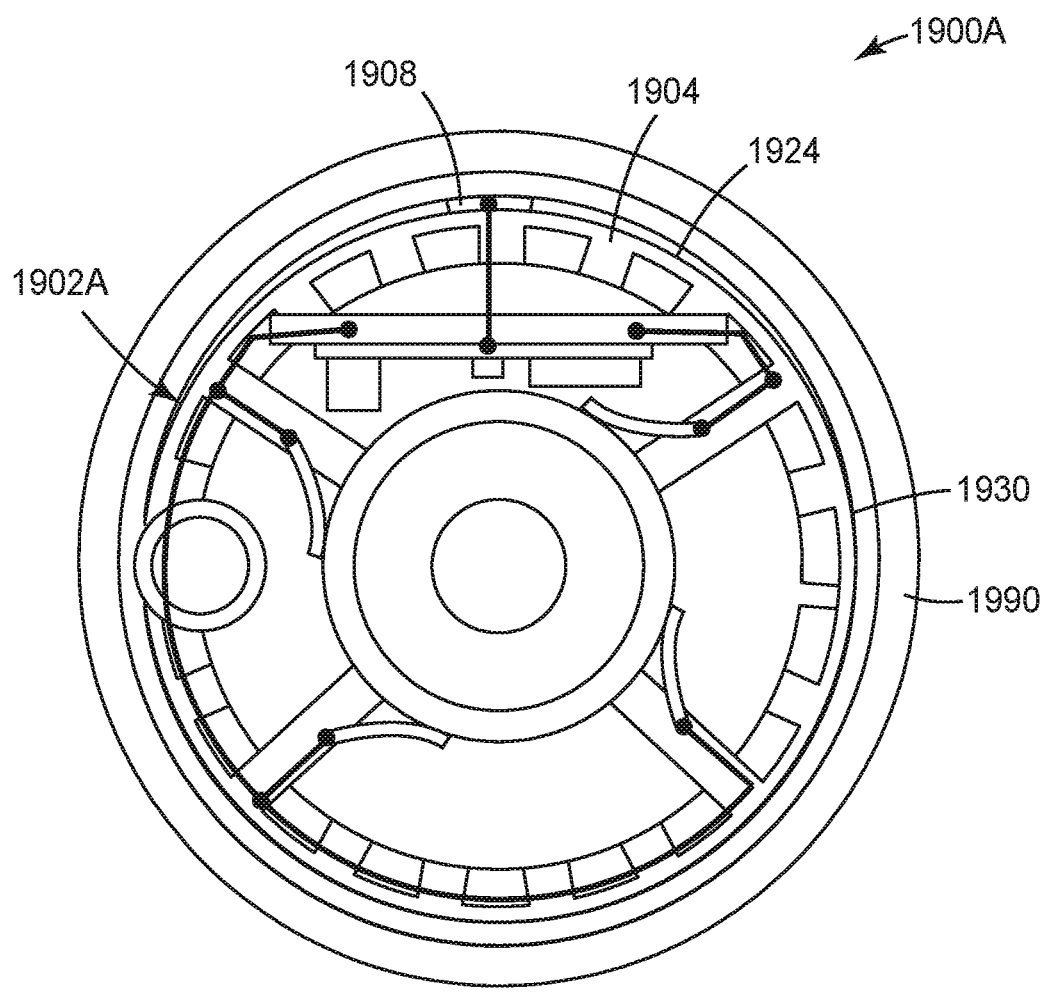
FIGS. 19A-19C illustrate electrical cable monitoring systems including a jacket.
Figure 19B:
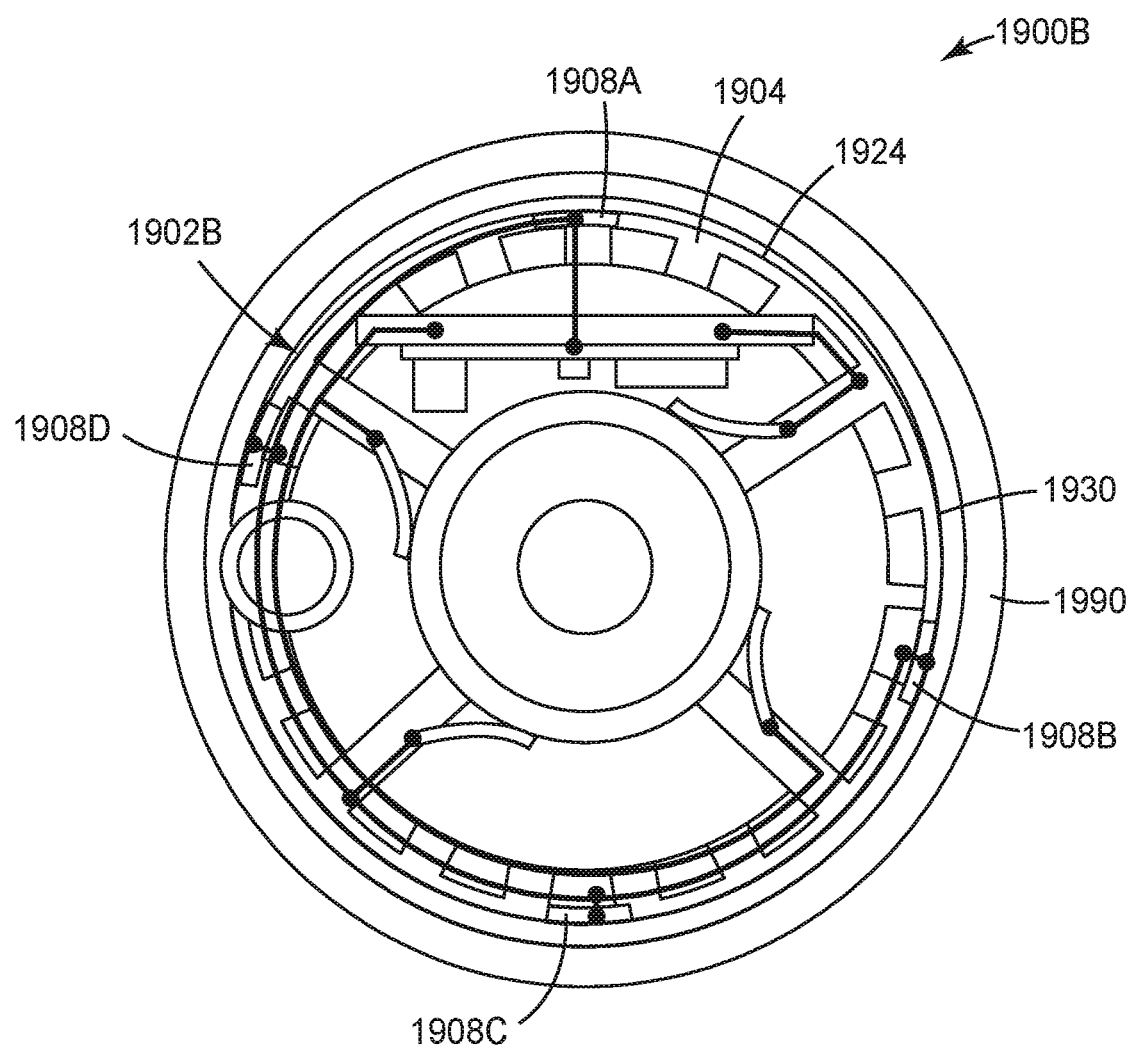
Figure 19C:
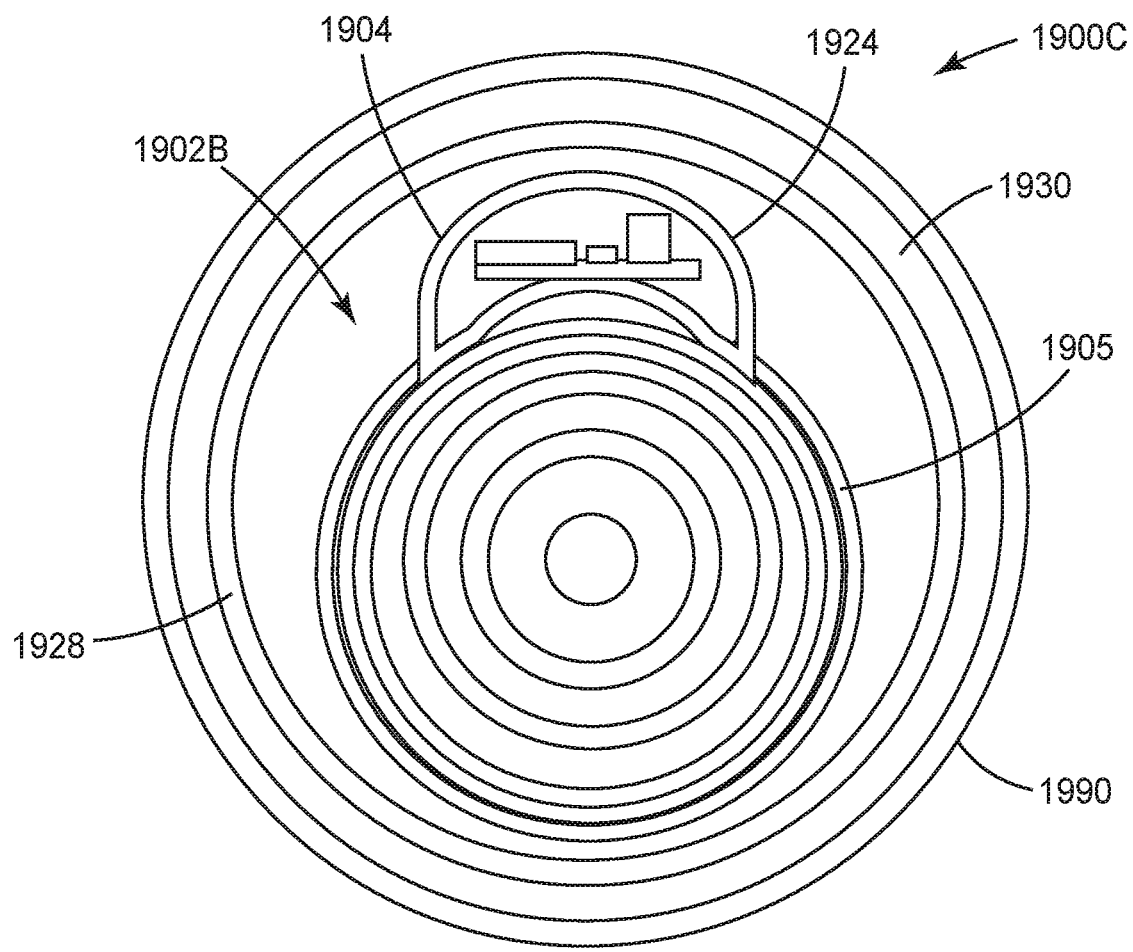

In some examples, an electrical cable monitoring system may include a jacket surrounding the support structure. FIGS. 19A-19C illustrate electrical cable monitoring systems 1900A, 1900B, and 1900C including a jacket 1990. Electrical cable monitoring systems 1900A-1900C may be the same as or substantially similar to electrical cable monitoring system 800 discussed above in reference to FIGS. 8D-8G, except for the differences described herein. As illustrated in FIG. 19A, support structure 1902A includes a second electrode 1908 disposed on an exterior surface 1924 of body 1904. Support structure 1902B, illustrated in FIG. 19B, is the substantially similar to support structure 1902A, except that support structure 1902B includes a plurality of second electrodes 1908A, 1908B, 1908C, and 1908D disposed on an exterior surface 1924 of body 1904. Jacket 1990 may be configured to provide compressive radial force on conductive ground layer 1930. The compressive radial force may maintain electrical contact between conductive ground layer 1930 and second electrode 1908. In some examples, jacket 1990 may be a plastic or rubber polymer, such as polyvinyl chloride (PVC) or polyethylene (PE). In some examples, jacket 1990 may enhance environmental protection, mechanical stress protection, or both of support structure 1902A and 1902B.

In some examples, jacket 1990 may be installed by cold shrink technique as discussed above in reference to FIGS. 10A-10D. For example, as illustrated in FIG. 19C, an open configuration of jacket 1990 may include a removable core structure 1928 between conductive ground layer 1930 and jacket 1990. Removable core structure 1928 and jacket 1990 may be positioned over 1930 disposed around support structure 1902. As discussed above, removable core structure 1928 may be removed to cold shrink jacket 1990 to support structure 1902 and thereby compress conductive ground layer 1930 around the exterior surface of support structure 1902.

In some examples, a support structure may be configured to house one or more sensors. FIG. 20 illustrates an example electrical cable monitoring system 2000 including a support structure 2002 configured to support, house, and protect a plurality of sensors 2011A, 2011B, 2011C, 2011D, 2011E, 2011F, and 2011G (collectively, sensors 2011). Electrical cable monitoring system 2000 may be the same as or substantially similar to electrical cable monitoring system 800 discussed above in reference to FIGS. 8A-8G, except for the differences described herein. In some examples, sensors 2011 may be referred to as environmental sensors. Each sensor of sensors 2011 may be attached to an interior surface 2024 of a body 2004 of support structure 2002. For example, each sensor of sensors 2011 may be adhered to or otherwise mechanically fastened to interior surface 2024. By attaching sensors 2011 to interior surface 2024, each sensor of sensors 2011 may be retained in the proper position and orientation when support structure 2002 is installed on a cable accessory 2020 and/or electrical cables 2032A and 2032B. In some examples, sensors 2011 may include one or more sensors of the group consisting of a temperature sensor, a magnetic field sensor, partial discharge sensor, a methane or other chemical/gas detection sensor, a humidity sensor, a partial discharge sensor, a smoke detection sensor, a strain sensor, or a vibration sensor. For example, sensors 2001A, 2011B 2011D, 2011F, and 2011G may include temperature sensors configured to detect a temperature of one or more of cable accessory 2020, electrical cable 2032A, electrical cable 2032B, support structure 2002, or an ambient temperature external to support structure 2002. Sensor 2011E may include a magnetic field sensor, such as one or more Rogowski coils or Hall effect sensors. Magnetic field sensor 2011E may be configured to determine a current one or more of cable accessory 2020, electrical cable 2032A, electrical cable 2032B. Sensor 2011C may include a humidity sensor configured to detect a relative humidity or moisture content at or near one or more of cable accessory 2020, electrical cable 2032A, or electrical cable 2032B, within support structure 2002, or an ambient relative humidity or moisture content external to support structure 2002. Each sensor of sensors 2011 may be communicatively coupled to monitoring device 2010. By including sensors 2011, monitoring device 2010 (or an associated condition monitoring system) may more accurately determine a health of cable accessory 2020 and/or electrical cables 2032A and 2032B.

In some examples, a support structure may be configured to have a low profile. FIGS. 21A-21H illustrate an example electrical cable monitoring system 2100 including a support structure 2102 having a low profile. Electrical cable monitoring system 2100 may be the same as or substantially similar to electrical cable monitoring system 800 discussed above in reference to FIGS. 8A-8G, except for the differences described herein. FIG. 21 is a perspective view of support structure 2102. Support structure 2102 includes first body segment 2104A and second body segment 2104B. First body segment 2104A is configured to house a monitoring device 2110 and other sensors or electronics. Second body segment 2104B is configured to surround at least a portion of electrical cables 2132A and 2132B (collectively electrical cables 2132) and/or cable accessory 2120. Second body segment 2104B includes a plurality of interlacing fingers 2105A-2105H (collectively, fingers 2105) that enable second body segment 2104B to conform to different circumferences of electrical cables 2132 and/or cable accessory 2120.

Figure 21A:
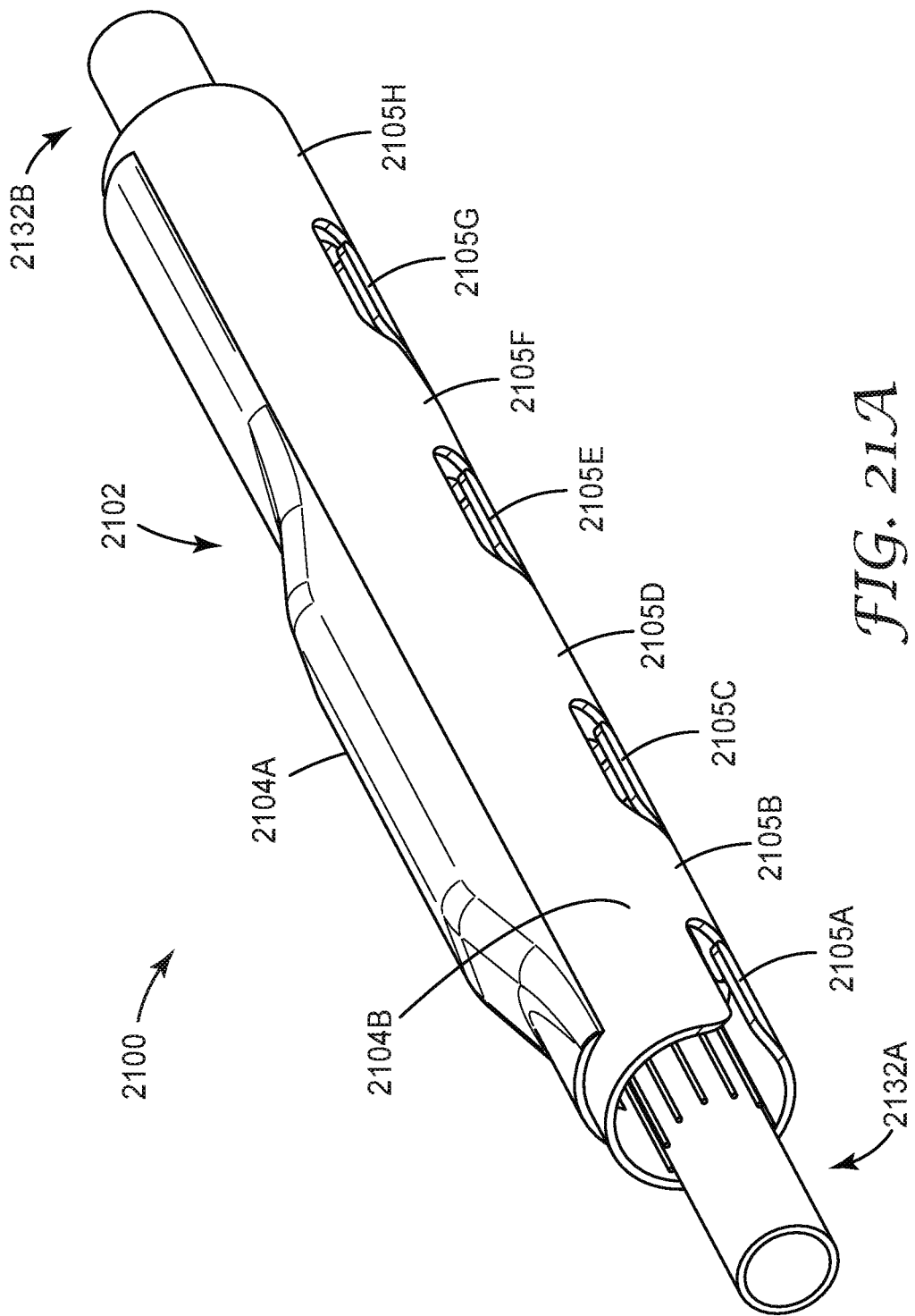
Figure 21B:
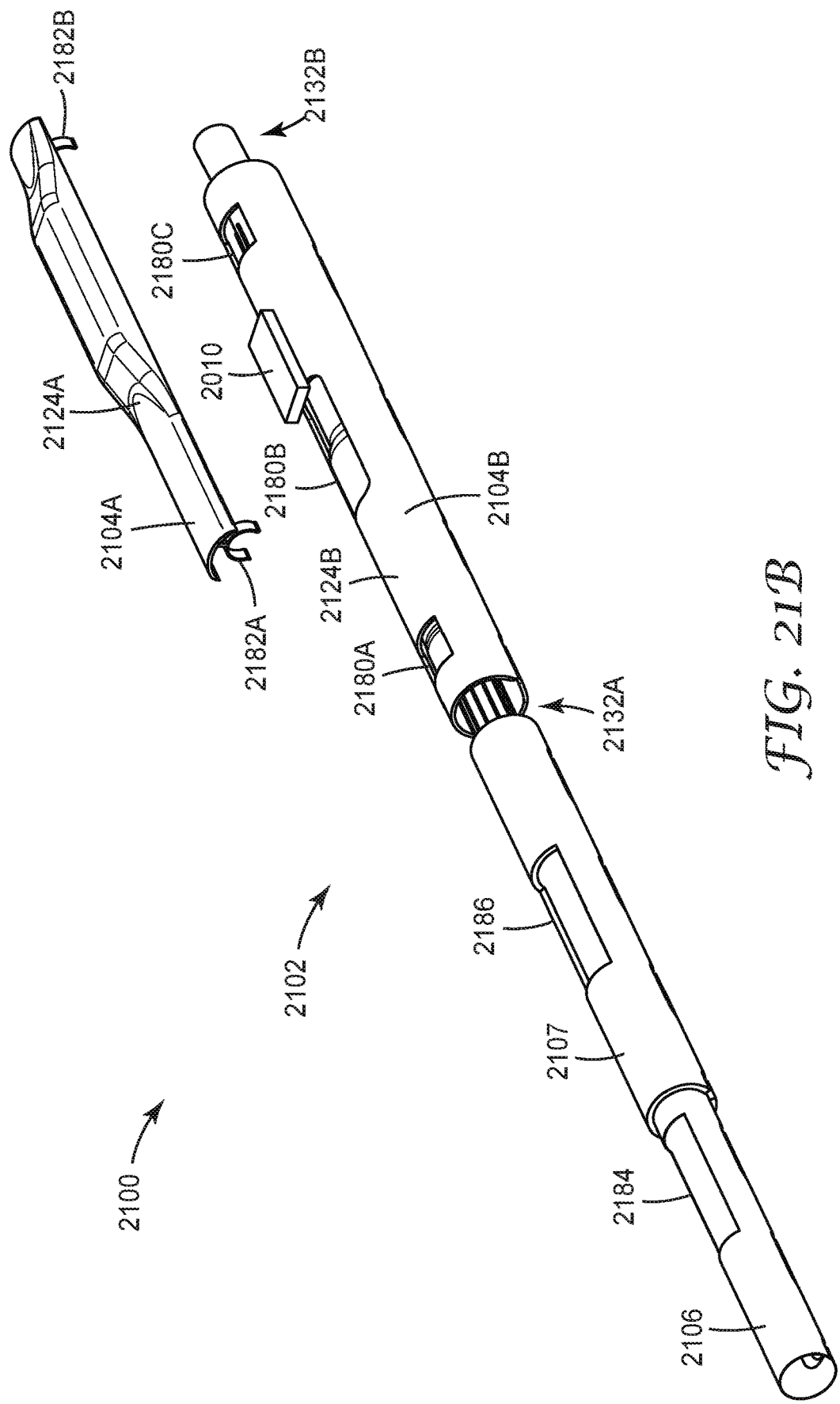

FIG. 21B illustrates an exploded view of electrical cable monitoring system 2100. In some examples, support structure may include a plurality of concentric layers including first electrode 2106, resilient layer 2107, and second body segment 2104B. First electrode 2106 is configured to electrically couple to low side electrode 2126 of cable accessory 2120 as shown in FIG. 21H. Resilient layer 2107 is configured to transfer (e.g., uniformly, or substantially uniformly) a compressive force from second body segment 2104B to first electrode 2106. For example, in use, resilient layer 2107 maintains the electrical contact between low side electrode 2126 and first electrode 2106 when a compressive force from, for example, a jacket 2190 (FIG. 21E), is applied to exterior surface 2124B of second body segment 2104B. In some examples, second body segment 2104B may define a plurality of apertures 2180A, 2180B, and 2180C to receive other components, such as, for example, legs 2182A and 2182B of first body segment 2104A and monitoring device 2110. Similarly, other components may define other apertures. For example, first electrode may define aperture 2184, and resilient layer may define aperture 2186. In some examples, apertures 2184 and 2186 may align with aperture 2180B to receive at least a portion of monitoring device 2110. In some examples, apertures 2184 and 2186 may be configured to receive an asymmetric bulge of a splice joint, such as, for example, a bugle of a shear bolt of a splice connector.

FIG. 21C-21F are longitudinal cross-sectional views of electrical cable monitoring system 2011 illustrating that conductive ground layer 2130 may be positioned on exterior surface 2124A of first body segment 2104A and exterior surface 2124B of second body segment 2104B. In other examples, conductive ground layer 2130 may be positioned on exterior surface 2124B of second body segment 2104B, as illustrated in FIG. 21I. Jacket 2190 may be fitted to support structure 2102 by cold shrink technique as discussed above. In this way, jacket 2190 may apply a compressive force to conductive ground layer 2130 to urge conductive ground layer toward exteriors surfaces 2124A and 2124B. Fingers 2105 allow a circumference of second body segment 2124B to decrease in response to the compressive force, such that second body member may transfer the compressive force to resilient layer 2107.

As illustrated in FIG. 21H, first electrode 2106 may include a longitudinal slit 2113 to enable the circumference of first electrode 2106 to decrease in response to the transfer of compressive force from resilient member 2107 to first electrode 2106. In other words, a size of slit 2113 may decrease as compressive forces from resilient member 2107 cause first electrode 2106 to tighten and clamp down on low side electrode 2126. In some examples, slit 2113 may facilitate installation of first electrode 2106 over cable accessory 2120 or an uncut section of electrical cable 2132. In this way, support structure 2102 may be configured to enhance physical and electrical contact between first electrode 2106 and low side electrode 2126.

Figure 21G:
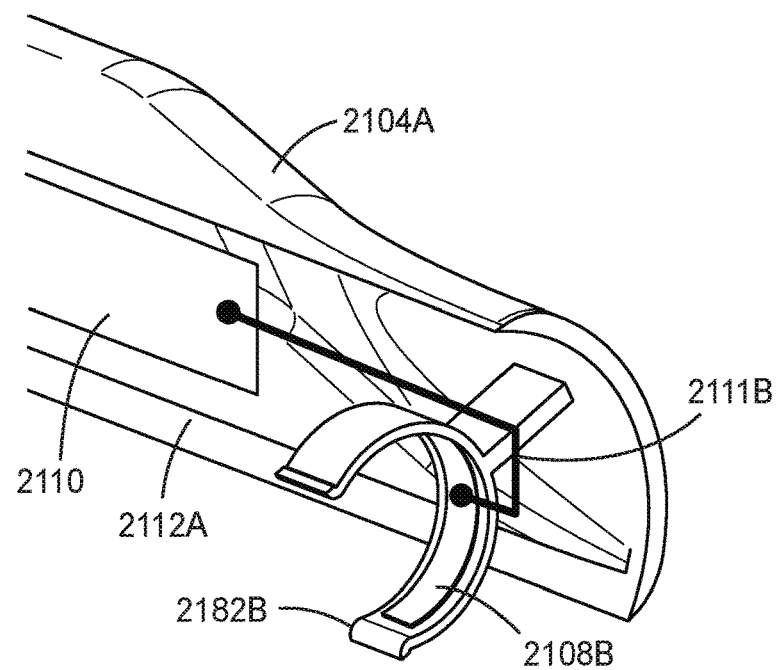
Figure 21H:
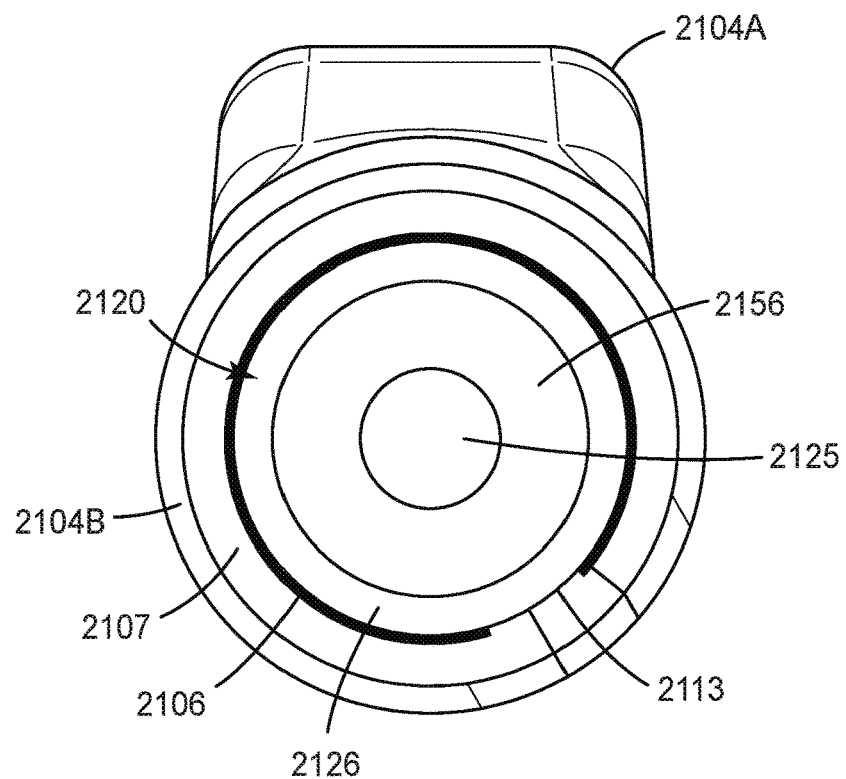
Figure 21I:
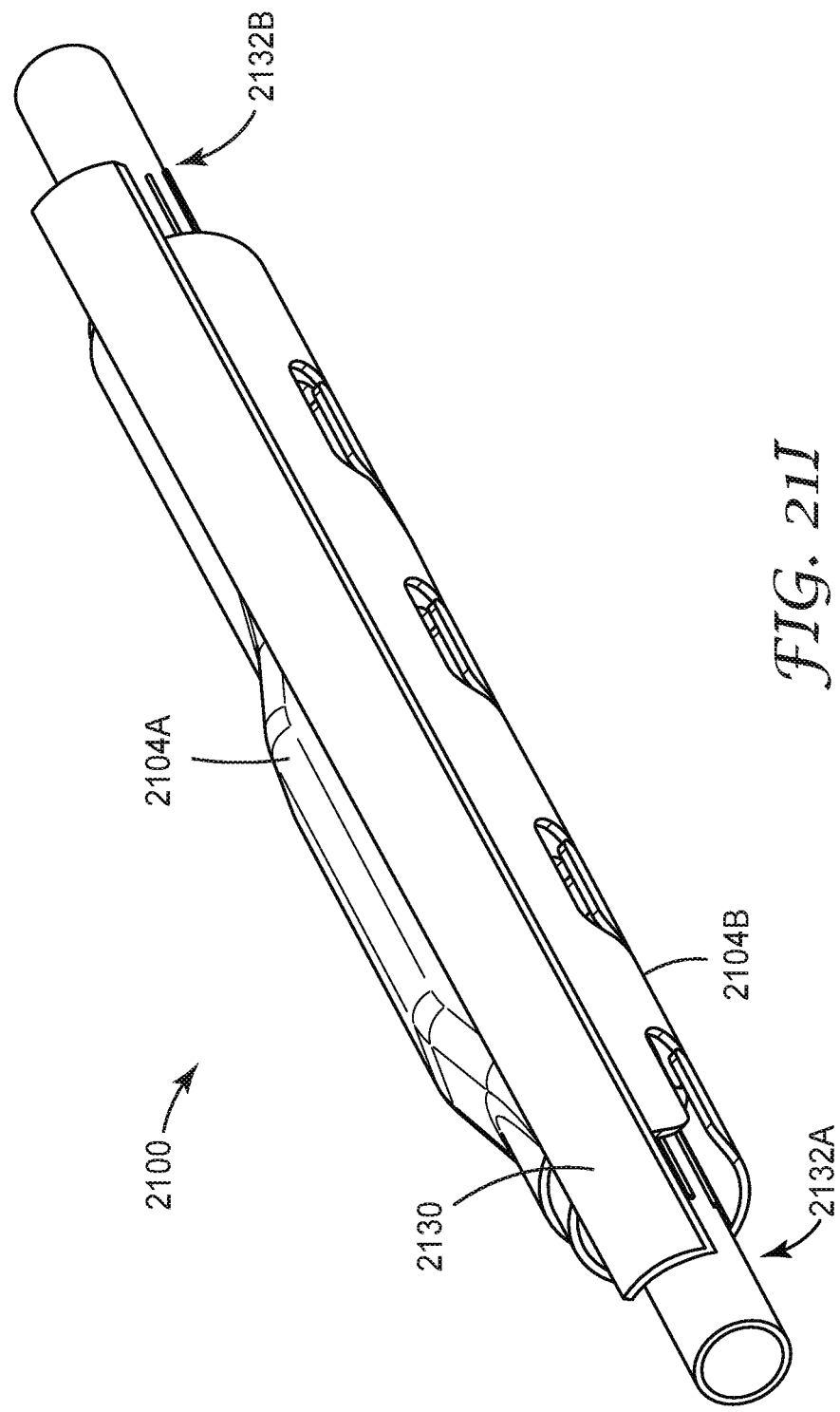

As illustrated in FIGS. 21F and 21G, second electrodes 2108A and 2108B may be positioned on legs 2182A and 2182B. As discussed above, legs 2182A and 2182B may extend through aperture 2180A and 2180C to electrically couple with shielding layer 2160A or 2160B of a respective electrical cable 2134A or 2134B. Second electrodes 2108A and 2108B may be electrically coupled to monitoring device 2110 via conductors 2111A and 2111B. First electrode 2106 may be electrically coupled to monitoring device 2110 via conductor 2109. Monitoring device may be attached to interior surface 2112A of first body segment 2104A. Conductors 2109, 2111A, and 2111B may be attached to interior surface 2112A or embedded in first body segment 2104A.

Figure 22:
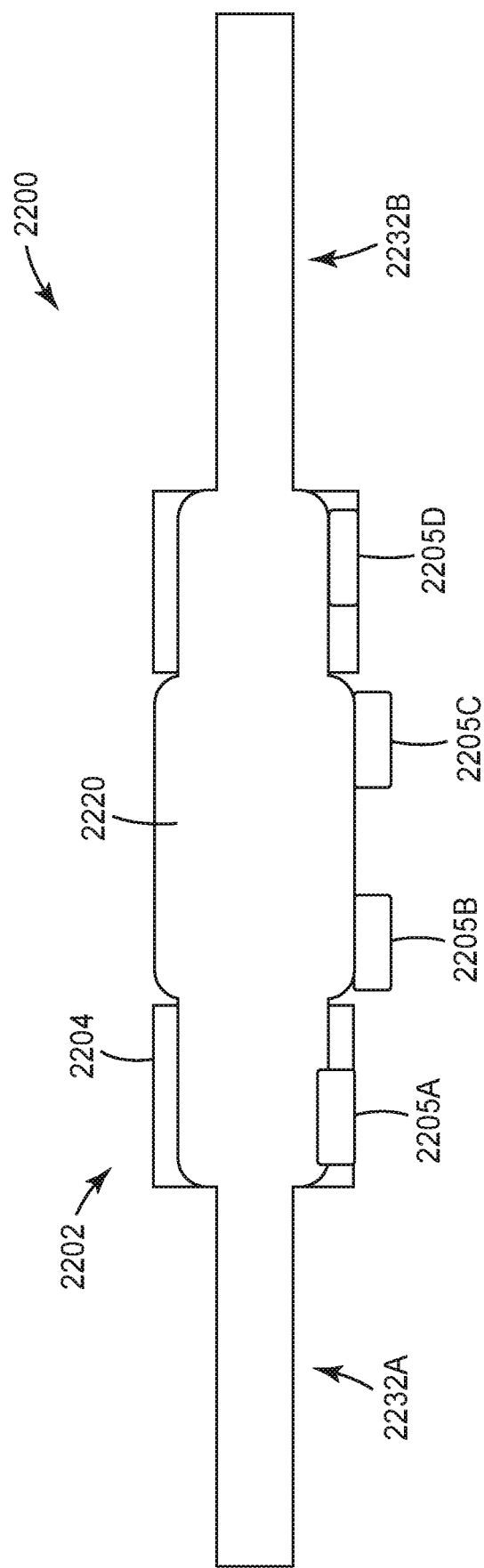
FIG. 22 illustrates an example electrical cable monitoring system 2200 including a low-profile support structure configured to adjustably compress an electrical cable and a cable accessory having different diameters.

In some examples, a support structure may be configured to adjustably compress an electrical cable and a cable accessory having different diameters. FIG. 22 illustrates an example electrical cable monitoring system 2200 including a low-profile support structure 2202 configured to adjustably compress electrical cables 2232 (e.g. electrical cables 2232A, 2232B) and a cable accessory 2220 having variable surface contours characterized by the cable accessory 2220 having different diameters along its longitudinal length. For example, fingers 2205A-2205D may be configured to conform to different diameters along the length of a splice joint including electrical cables 2232 and a cable accessory 2220. Fingers 2205A and 2205D may adjust to correspond to a smaller diameter where the cable accessory is disposed over electrical cables 2242. Fingers 2205B and 2205C may adjust to correspond to a larger diameter of cable accessory 2220 over the splice region of the cable accessory. In some examples, a resilient member may enable support structure to maintain continuous contact over a transition from electrical cables 2232 to a cable accessory 2220, which may enable a water proof seal of the splice joint and provide uniform compressive force over the splice joint, such as when a jacket is used to supply compressive for to support structure 2202.

Figure 23:
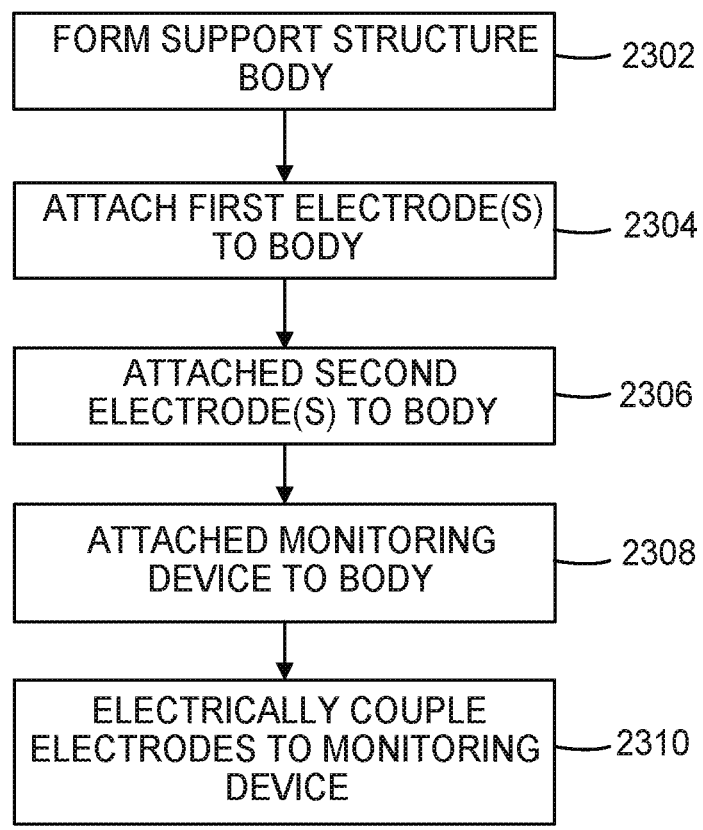
FIG. 23 is a flow diagram illustrating an example technique for manufacturing a support structure.

The above described electrical cable monitoring system and support structures may be manufactured using any suitable manufactured technique. FIG. 23 is a flow diagram illustrating an example technique for manufacturing a support structure. Although the technique illustrated in FIG. 23 is described in reference to support structure 800, the technique may be used to manufacture other support structures (e.g., any one or more of support structures 902, 1002, 1102, 1202, 1302, 1402, 1502, 1602, 1702, 1802, 1902, 2002, 2102, or 2202), and any of the above described support structures may be manufacturing using similar or different techniques.

In some examples, although not shown in FIG. 23, the technique for manufacturing support structure 802 may include determining a circumference and/or diameter of electrical cable 832, cable accessory 820, or both. The technique illustrated in FIG. 23 may include forming body 804 to substantially conform to the diameter of electrical cable 832, cable accessory 820, or both (2302). For example, the diameter of interior surface 812 of body 804 along the longitudinal length of body 804 may be the same as or a predetermined amount of the diameter of electrical cable 832, cable accessory 820, or both. In some examples, forming body 804 may include thermoforming a polymer to define body 804. Thermoforming may include using a model representing a three-dimensional structure corresponding the electrical cables 832, cable accessory 820, or both. In some examples, forming body 804 may include three-dimensional printing a polymer to define body 804. In some examples, forming body 804 may include forming two or more segments of body 804. In some examples, forming body 804 may include forming one or more joints. The one or more joints may be integrally formed with body 804 or mechanically coupled to body 804. In examples in which one or more joints are mechanically coupled to body 804, forming body 803 may include attaching the one or more joints to body 804.

The technique illustrated in FIG. 23 includes attaching first electrode 806 to interior surface 182 of body 804 (2304). The technique illustrated in FIG. 23 includes attaching second electrode 808 to interior surface 812 or exterior surface 824 of body 804 (2306). In some examples, attaching first electrode 806 and/or second electrode 808 may include adhering or otherwise mechanically fastening first electrode 806 and/or second electrode 808 to body 804, such as to one or more ribs of ribs 822 or legs 21. In some examples, attaching first electrode 806 and/or second electrode 808 may include attaching a spring member to interior surface 812 and attaching a contact pad to the spring member.

The technique illustrated in FIG. 23 includes attaching monitoring device 2310 to interior surface 182 of body 804 (2308). In some examples, attaching monitoring device 810 may include adhering or otherwise mechanically fastening monitoring device 810 to interior surface 812, such as to one or more ribs of ribs 822. In some examples, attaching monitoring device 810 may include potting, e.g., completely encapsulating or coating all exposed surfaces of, monitoring device 810 in a resin. The technique illustrated in FIG. 23 includes electrically coupling first electrodes 806, second electrode 808, and third electrode 813 to monitoring device 810 via conductors 809, 811, and 815, respectively (2310).

Figure 24:
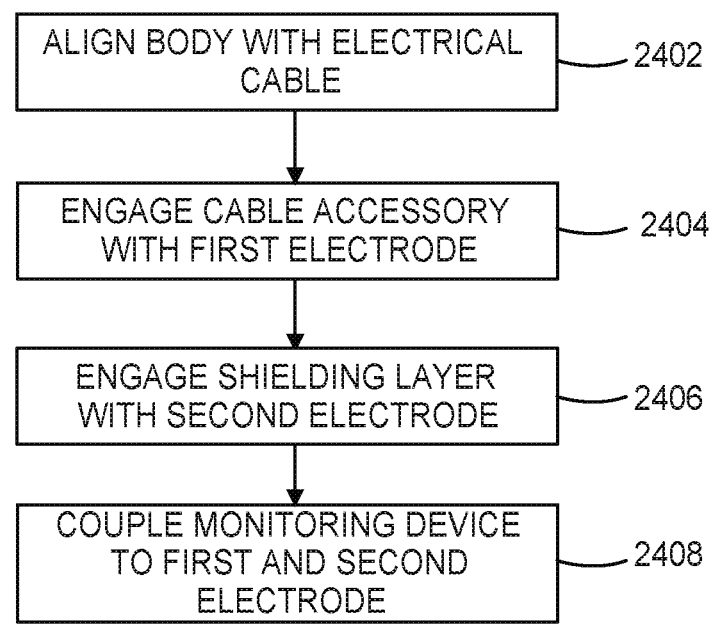
FIG. 24 is a flow diagram illustrating an example technique for installing an electrical cable monitoring system.

The above described electrical cable monitoring system and support structures may be installed on an electrical cable or a cable accessory using any suitable installation technique. FIG. 24 is a flow diagram illustrating an example technique for installing an electrical cable monitoring system. Although the technique illustrated in FIG. 24 is described in reference to electrical cable monitoring system 800, the technique may be used to install other electrical cable monitoring systems (e.g., any one or more of electrical cable monitoring systems 900, 1000, 1100, 1600, 1700, 1900, 2000, 2100, or 2200) or support structures (e.g., any one or more of support structures 902, 1002, 1102, 1202, 1302, 1402, 1502, 1602, 1702, 1802, 1902, 2002, 2102, or 2202), and any of the above described electrical cable monitoring systems or support structures may be manufacturing using similar or different techniques.

The technique illustrated in FIG. 24 for installing support structure 802 of electrical cable monitoring system 800 includes aligning interior surface 812 of elongate body 804 of support structure 802 concentric to electrical cable 832 defining axis 801 (2402).

The technique illustrated in FIG. 24 also includes engaging cable accessory 820 with first electrode 806 attached to interior surface 812 (2404). In some examples, engaging cable accessory 820 includes electrically coupling first electrode 806 to low side electrode 826. In some examples, first electrode 806 includes a contact pad and a spring member configured to urge the contact pad toward low side electrode 826 such that engaging cable accessory 826 includes engaging cable accessory 820 with the contact pad.

The technique illustrated in FIG. 24 also includes engaging shielding layer 860 with second electrode 808 attached to body 804 (2406). In some examples, engaging shielding layer 860 includes electrically coupling conductive ground layer 830 to shielding layer 860 and electrically coupling second electrode 808 to conductive ground layer 830. In some examples, second electrode 808 is disposed on exterior surface 824.

The technique illustrated in FIG. 24 also includes operatively coupling monitoring device 810 to first electrode 806 and second electrode 808 (2408). As discussed above, monitoring device 810 is configured to monitor a health of electrical cable 832 or cable accessory 820. In some examples, body 804 insulates low side electrode 826 from conductive ground layer 830 to result in a capacitance between low side electrode 826 and conductive ground layer 830 in response to a current flow in central conductor 852, and monitoring device 810 is configured to monitor the capacitance. In some examples, the technique may include potting monitoring device 810 in a resin within the body. In some examples, the technique may include positioning monitoring device 810 in a watertight compartment within the body. In some examples, body 802 incudes at least one reinforcing structure, such as ribs 822, and the technique includes positioning monitoring device 810 adjacent to the at least one reinforcing structure.

In some examples, the technique may include aligning a sensor with at least one of the cable accessory or the electrical cable. For example, engaging at least one of a temperature sensor, current sensor, voltage sensor, or partial discharge sensor with at least one of the cable accessory or the electrical cable. In some examples, the technique may include attaching an environmental sensor to the interior surface of the body. The environmental sensor may be configured to generate data indicative of at least one of humidity, temperature, strain on the connector or power cable, or vibration.

In some examples, the technique may include aligning at least one of a coil or a current transformer with at least one of the cable accessory or the electrical cable. The coil may be configured to sense a current in the electrical cable. For example, the coil may include one or more Rogowski coils or Hall effect sensors. In some examples, the coil is configured to exchange data via the electrical cable using power line communication (PLC) protocol.

In some examples, the technique may include aligning jacket 890 concentric to the body and cold shrinking jacket 890 to body 802.

In some examples, the technique may include engaging semi-conductive layer 858 of electrical cable 832 with third electrodes 813A, 813B, 813C, and 813D (collectively, third electrodes 813) attached to the body, where semi-conductive layer 858 is disposed between insulating layer 856 and shielding layer 860.

In some examples, although not illustrated in FIG. 24, the technique may include, before aligning body 804 with electrical cable 832, physically and electrically coupling the first central conductor to the second central conductor with the conductor connector. In some examples, although not illustrated in FIG. 24, the technique may include, before aligning the body with the electrical cable, physically coupling the first insulating layer to the second insulating layer with the low side electrode. In some examples, although not illustrated in FIG. 24, the technique may include, electrically coupling the first shielding layer to the second shielding layer with the conductive ground layer.

In examples in which body 804 includes a plurality of segments arranged axially or longitudinally relative to axis 801, such as a pair of half shell portions 804A and 804B joined by a hinges 805, aligning body 804 may include aligning a first half shell 804B of the pair of half shells with electrical cable 832, and engaging cable accessory 820 may include closing second half 804A of the pair of half shells.

In examples in which body 804 includes a connection band (e.g., connection band 1005), the technique may include cold shrinking the connection band at least one of urge first electrode 806 toward low side electrode 826, urge second electrode 808 toward conductive ground layer 830, or urge monitoring device 810 toward electrical cable 832.

In examples, in which body 804 includes a first body segment and a second body segment (e.g., 2104A and 2104B), and the second body segment comprises a plurality of interlacing fingers (e.g., 2105), the technique may include compressing second body segment 2104B to conform interlacing fingers 2105 to a circumference of electrical cable 832 or a circumference of cable accessory 820.

In the present detailed description of the preferred embodiments, reference is made to the accompanying drawings, which illustrate specific embodiments in which the invention may be practiced. The illustrated embodiments are not intended to be exhaustive of all embodiments according to the invention. It is to be understood that other embodiments may be utilized, and structural or logical changes may be made without departing from the scope of the present invention. The following detailed description, therefore, is not to be taken in a limiting sense, and the scope of the present invention is defined by the appended claims.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "proximate," "distal," "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below, or beneath other elements would then be above or on top of those other elements.

As used herein, when an element, component, or layer for example is described as forming a "coincident interface" with, or being "on," "connected to," "coupled with," "stacked on" or "in contact with" another element, component, or layer, it can be directly on, directly connected to, directly coupled with, directly stacked on, in direct contact with, or intervening elements, components or layers may be on, connected, coupled or in contact with the particular element, component, or layer, for example. When an element, component, or layer for example is referred to as being "directly on," "directly connected to," "directly coupled with," or "directly in contact with" another element, there are no intervening elements, components or layers for example. The techniques of this disclosure may be implemented in a wide variety of computer devices, such as servers, laptop computers, desktop computers, notebook computers, tablet computers, hand-held computers, smart phones, and the like. Any components, modules or units have been described to emphasize functional aspects and do not necessarily require realization by different hardware units. The techniques described herein may also be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset. Additionally, although a number of distinct modules have been described throughout this description, many of which perform unique functions, all the functions of all of the modules may be combined into a single module, or even split into further additional modules. The modules described herein are only exemplary and have been described as such for better ease of understanding.

If implemented in software, the techniques may be realized at least in part by a computer-readable medium comprising instructions that, when executed in a processor, performs one or more of the methods described above. The computer-readable medium may comprise a tangible computer-readable storage medium and may form part of a computer program product, which may include packaging materials. The computer-readable storage medium may comprise random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The computer-readable storage medium may also comprise a non-volatile storage device, such as a hard-disk, magnetic tape, a compact disk (CD), digital versatile disk (DVD), Blu-ray disk, holographic data storage media, or other non-volatile storage device.

The term "processor," as used herein may refer to any of the foregoing structure or any other structure suitable for implementation of the techniques described herein. In addition, in some aspects, the functionality described herein may be provided within dedicated software modules or hardware modules configured for performing the techniques of this disclosure. Even if implemented in software, the techniques may use hardware such as a processor to execute the software, and a memory to store the software. In any such cases, the computers described herein may define a specific machine that is capable of executing the specific functions described herein. Also, the techniques could be fully implemented in one or more circuits or logic elements, which could also be considered a processor.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor", as used may refer to any of the foregoing structure or any other structure suitable for implementation of the techniques described. In addition, in some aspects, the functionality described may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

It is to be recognized that depending on the example, certain acts or events of any of the methods described herein can be performed in a different sequence, may be added, merged, or left out altogether (e.g., not all described acts or events are necessary for the practice of the method). Moreover, in certain examples, acts or events may be performed concurrently, e.g., through multi-threaded processing, interrupt processing, or multiple processors, rather than sequentially.

In some examples, a computer-readable storage medium includes a non-transitory medium. The term "non-transitory" indicates, in some examples, that the storage medium is not embodied in a carrier wave or a propagated signal. In certain examples, a non-transitory storage medium stores data that can, over time, change (e.g., in RAM or cache).

Various examples have been described. These and other examples are within the scope of the following claims.

What is claimed is:

1. A support structure of an electrical cable monitoring system, the support structure comprising:
    an elongate body configured to extend along an axis defined by an electrical cable that includes a central conductor, an insulating layer concentric to the central conductor, and a shielding layer concentric to the insulating layer, wherein the body comprises an interior surface concentric to the axis and configured to engage a cable accessory disposed on the electrical cable;
a first electrode attached to the interior surface of the body and configured to operatively couple to the cable accessory;
a second electrode attached to the body and configured to operatively couple to the shielding layer; and
a monitoring device attached to the interior surface and operatively coupled to the first electrode and the second electrode, wherein the monitoring device is configured to monitor one or more conditions of the electrical cable or the cable accessory,
wherein the cable accessory comprises a low side electrode, wherein the first electrode is configured to electrically couple with the low side electrode, wherein the electrical cable monitoring system further comprises a conductive ground layer configured to electrically couple the shielding layer to the second electrode.

2. The support structure of claim 1, wherein the body insulates the low side electrode from the conductive ground layer to result in a capacitance between the low side electrode and the conductive ground layer in response to a current flow in the central conductor, and wherein the monitoring device is configured to monitor the capacitance to exchange data with another device.

3. The support structure of claim 1, wherein the body defines an exterior surface, and wherein the second electrode is disposed on the exterior surface.

4. The support structure of claim 1, wherein the first electrode comprises a contact pad and a spring member configured to urge the contact pad toward the low side electrode.

5. The support structure of claim 1, wherein the monitoring device comprises at least one of a temperature sensor, current sensor, voltage sensor, or partial discharge sensor.

6. The support structure of claim 1, wherein the monitoring device comprises at least one of a coil or a current transformer, wherein the coil or the current transformer is configured to sense a current in the electrical cable.

7. The support structure of claim 1, wherein the electrical cable monitoring system further comprises an environmental sensor attached to the interior surface of the body, wherein the environmental sensor is configured to generate data indicative of at least one of humidity, temperature, strain on a connector or power cable, or vibration.

8. The support structure of claim 1, wherein the body incudes at least one reinforcing structure to mechanically protect the monitoring device.

9. The support structure of claim 1, further comprising a third electrode attached to the body and configured to operatively couple to a semi-conductive layer of the electrical cable, wherein the semi-conductive layer is disposed between the insulating layer and the shielding layer.

10. The support structure of claim 1, wherein the body comprises a plurality of segments arranged axially or longitudinally relative to the axis.

11. The support structure of claim 1, further comprising a connection band attached to the body and configured to surround at least a portion of the electrical cable.

12. The support structure of claim 1, wherein the first electrode comprises a flexible conductive membrane.

13. The support structure of claim 1, wherein the body comprises a first body segment and a second body segment, and wherein the second body segment comprises a plurality of interlacing fingers, wherein the interlacing fingers are configured to conform to a circumference of the electrical cable or a circumference of the cable accessory.

14. A method of installing a support structure of an electrical cable monitoring system, the method comprising:
aligning an interior surface of an elongate body of the support structure concentric to an electrical cable defining an axis, wherein the electrical cable includes a central conductor, an insulating layer concentric to the central conductor, and a shielding layer concentric to the insulating layer;
engaging a cable accessory with a first electrode attached to the interior surface;
engaging the shielding layer with a second electrode attached to the body; and
operatively coupling a monitoring device to the first electrode and the second electrode, wherein the monitoring device is configured to monitor one or more conditions of the electrical cable or the cable accessory,
wherein the cable accessory comprises a low side electrode, wherein engaging the cable accessory comprises electrically coupling the first electrode to the low side electrode, and wherein engaging the shielding layer comprises electrically coupling a conductive ground layer to the shielding layer and electrically coupling the second electrode to the conductive ground layer.

15. The method of claim 14, wherein the body insulates the low side electrode from the conductive ground layer to result in a capacitance between the low side electrode and the conductive ground layer in response to a current flow in the central conductor, and wherein the monitoring device is configured to monitor the capacitance.

16. The method of claim 14, wherein the body defines an exterior surface, and wherein the second electrode is disposed on the exterior surface.

17. The method of claim 14, wherein the monitoring device comprises at least one of a temperature sensor, current sensor, voltage sensor, or partial discharge sensor, wherein the method further comprises engaging at least one of the temperature sensor, the current sensor, the voltage sensor, or the partial discharge sensor with at least one of the cable accessory or the electrical cable.

18. The method of claim 14, wherein the body comprises a pair of half shell portions joined by a hinge, wherein aligning the body comprises aligning a first half shell of the pair of half shells with the electrical cable, and wherein engaging the cable accessory comprises closing a second half of the pair of half shells.

19. The method of claim 14, wherein the support structure further comprises a connection band attached to the body and configured to surround at least a portion of the electrical cable, wherein the method further comprises cold shrinking the connection band at least one of urge the first electrode toward the low side electrode, urge the second electrode toward the conductive ground layer, or urge the monitoring device toward the electrical cable.

20. A system comprising:
an electrical cable that includes a central conductor, an insulating layer concentric to the central conductor, and a shielding layer concentric to the insulating layer;
a cable accessory disposed on the electrical cable;
a support structure of an electrical cable monitoring system, the support structure comprising:
an elongate body configured to extend along an axis defined by the electrical cable, wherein the body comprises an interior surface concentric to the axis and configured to engage the cable accessory;
a first electrode attached to the interior surface of the body and configured to operatively couple to the cable accessory; and a second electrode attached to the body and configured to operatively couple to the shielding layer; and a monitoring device attached to the interior surface and operatively coupled to the first electrode and the second electrode, wherein the monitoring device is configured to monitor one or more conditions of the electrical cable or the cable accessory, wherein the cable accessory comprises a low side electrode, wherein the first electrode is configured to electrically couple with the low side electrode, wherein the electrical cable monitoring system further comprises a conductive ground layer configured to electrically couple the shielding layer to the second electrode.

* * * * *